United States Patent
Li

(10) Patent No.: US 11,781,065 B2
(45) Date of Patent: *Oct. 10, 2023

(54) NARROW-BAND RED PHOTOLUMINESCENCE MATERIALS FOR SOLID-STATE LIGHT EMITTING DEVICES AND FILAMENTS

(71) Applicant: Intematix Corporation, Fremont, CA (US)

(72) Inventor: Yi-Qun Li, Danville, CA (US)

(73) Assignee: Intematix Corporation, Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/983,137

(22) Filed: Nov. 8, 2022

(65) Prior Publication Data

US 2023/0174862 A1    Jun. 8, 2023

Related U.S. Application Data

(63) Continuation of application No. 16/628,577, filed as application No. PCT/US2018/038928 on Jun. 22, 2018, now Pat. No. 11,492,550.

(Continued)

(51) Int. Cl.
*C09K 11/88* (2006.01)
*F21K 9/232* (2016.01)
(Continued)

(52) U.S. Cl.
CPC .......... *C09K 11/886* (2013.01); *C09K 11/617* (2013.01); *C09K 11/7774* (2013.01);
(Continued)

(58) Field of Classification Search
CPC ...... F21K 9/232; H01L 33/502; C09K 11/886
See application file for complete search history.

(56) References Cited

U.S. PATENT DOCUMENTS 11,492,550 B2 * 11/2022 Li ..................... F21K 9/232
2010/0283382 A1   11/2010 Kwak et al.
(Continued)

FOREIGN PATENT DOCUMENTS

| CN | 1881629 A | 12/2006 |
| CN | 101252159 A | 8/2008 |
| WO | 2014024138 A1 | 2/2014 |

OTHER PUBLICATIONS

"LED Filament", Wikipedia, Jun. 1, 0907, pp. 1-2, retrieved Aug. 30, 2018, en.wikipedia.org/w/index.php?title=LED_filament&oldid=784708666.

(Continued)

*Primary Examiner* — Karabi Guharay
(74) *Attorney, Agent, or Firm* — CrossPond Law

(57) ABSTRACT

Light emitting devices and LED-filaments comprise an excitation source (e.g. LED) and a photoluminescence material comprising a combination of a first narrow-band red photoluminescence material which generates light with a peak emission wavelength in a range 580 nm to 628 nm and a full width at half maximum emission intensity in a range 45 nm to 60 nm and a second narrow-band red photoluminescence material generates light with a peak emission wavelength in a range 628 nm to 640 nm and a full width at half maximum emission intensity in a range 5 nm to 20 nm.

(Continued)

At least one of the first and second narrow-band red photoluminescence materials can comprise a narrow-band red phosphor or a quantum dot (QD) material.

12 Claims, 32 Drawing Sheets

Related U.S. Application Data

(60) Provisional application No. 62/526,527, filed on Jun. 29, 2017.

(51) Int. Cl.
  *C09K 11/61* (2006.01)
  *C09K 11/77* (2006.01)
  *F21Y 115/10* (2016.01)
  *H01L 33/50* (2010.01)

(52) U.S. Cl.
  CPC ............ *F21K 9/232* (2016.08); *H01L 33/504* (2013.01); *F21Y 2115/10* (2016.08)

(56) References Cited

U.S. PATENT DOCUMENTS

| | | |
|---|---|---|
| 2015/0171284 A1 | 6/2015 | Bechtel et al. |
| 2017/0077360 A1* | 3/2017 | Yang .................... C09K 11/617 |
| 2017/0145310 A1* | 5/2017 | Li ........................ C09K 11/025 |

OTHER PUBLICATIONS

European Search Opinion, EP 18824662, dated Nov. 2020.
International Search Report, PCT/US2018/038928.
Luo, Dong et al.; "Realizing superior white LEDs with both high R9 and luminous efficacy by using dual red phosphors," RSC Adv. 2017, 7, 25964; May 16, 2017.
Office Action, CN201880053920, dated Feb. 2023.
Office Action, EP18824622, dated Sep. 2021.
Office Action, EP18824662, dated Jun. 2022.
Supplementary European Search Report, EP18824662, dated Nov. 2020.
Written Opinion, PCT/US2018/038928.

* cited by examiner

SECTION A - A

SECTION B-B

NARROW-BAND RED PHOTOLUMINESCENCE MATERIALS FOR SOLID-STATE LIGHT EMITTING DEVICES AND FILAMENTS

CROSS REFERENCE TO RELATED APPLICATIONS

This application is a continuation of U.S. Utility application Ser. No. 16/628,577, filed Jan. 3, 2020, now U.S. Pat. No. 11,492,550, issued Nov. 8, 2022, which is a national phase entry application of PCT/US2018/038928, filed on Jun. 22, 2018, which in turn claims the benefit of priority to U.S. Provisional Application No. 62/526,527, filed Jun. 29, 2017, each of which is hereby incorporated by reference in its entirety.

FIELD OF THE INVENTION

Embodiments of the present invention are directed to narrow-band red photoluminescence materials for solid-state light emitting devices and filaments. More particularly, although not exclusively, embodiments concern narrow-band red phosphors for LED-based general lighting including manganese-activated complex fluoride and Group IIA/IIB selenide sulfide-based phosphors.

BACKGROUND OF THE INVENTION

White light emitting LEDs ("white LEDs") include one or more photoluminescence materials (typically inorganic phosphor materials), which absorb a portion of the blue light emitted by the LED and re-emit light of a different color (wavelength). The portion of the blue light generated by the LED that is not absorbed by the phosphor material combined with the light emitted by the phosphor provides light which appears to the eye as being white in color. Due to their long operating life expectancy (>50,000 hours) and high luminous efficacy (100 lumens per watt and higher), white LEDs are rapidly replacing conventional fluorescent, compact fluorescent and incandescent lamps. LED lamps (bulbs) are typically constructed from a small number of high-intensity white LEDs.

Recently, LED-filament lamps have been developed that comprise LED-filaments that more closely resemble the appearance and emission characteristics of a filament of a traditional incandescent lamp. The LED-filaments, which are typically about an inch long, comprise COG (Chip-On-Glass) devices having a plurality of low-power LED chips mounted on a light-transmissive (transparent) glass substrate. The LED-filaments are encased in a phosphor-impregnated encapsulant, such as silicone.

LED-filament lamps and white LEDs can be configured to generate "warm white" light with a low Correlated Color Temperature (CCT<4500K), typically 2700 K to 3000 K, and with a General Color Rendering Index (CRI Ra≥85) and require a suitable red photoluminescence material. Successful phosphor materials include materials such as $Eu^{2+}$ or $Ce^{3+}$ doped (oxy)nitride compounds, for example $(Ba,Sr)_2Si_5N_8:Eu^{2+}$ (2:5:8) and $(Ca,Sr)AlSiN_3:Eu^{2+}$ (CASN). However, while commonly used, these phosphors have some drawbacks since their emission spectra are broad (full-width at half maximum FWHM is approximately 75-85 nm) and a large part of their emission spectrum is beyond 650 nm in wavelength—a part of the spectrum to which the human eye is insensitive—which significantly reduces the luminous efficacy of white LEDs and LED-filaments based on such phosphors. Moreover, a need exists for LED-filament lamps having a CRI Ra of at least 90. While the CRI Ra of LED-filaments can be increased by including a red emitting phosphor, it is found that the luminous efficacy decreases significantly. There is a need to provide white light emitting devices and LED-Filament lamps that have a CRI Ra of at least 80 and which have a smaller decrease in luminous efficacy compared with white light emitting devices and LED-filaments that utilize broad-band nitride phosphors.

SUMMARY OF THE INVENTION

Embodiments of the invention concern solid-state light emitting devices and LED-filaments comprising a combination of at least two narrow-band red emitting photoluminescence materials. In this patent specification, a narrow-band red photoluminescence material refers to a material which, in response to stimulation by excitation light, generates light having a peak emission wavelength in a range 580 nm to 640 nm; that is light in the orange to red region of the visible spectrum and which has a full width at half maximum (FWHM) emission intensity of between about 5 nm and about 60 nm. The narrow-band red photoluminescence materials can comprise a phosphor and/or a quantum dot (QD) material.

In some embodiments, the combination of narrow-band red photoluminescence materials comprises a mixture of at least two narrow-band red emitting photoluminescence materials, typically narrow-band red phosphors. For instance, in some embodiments the mixture of narrow-band red photoluminescence materials can be provided as a mixture in a single layer. In other embodiments, the narrow-band red photoluminescence materials can be provided in separate locations such as, for example, in separate respective regions (e.g. layers) of a single component or in separate components. In some embodiments, the narrow-band red photoluminescence materials can be provided in the form of an encapsulating layer on the one or more solid-state light excitation sources (e.g. LEDs). Alternatively, the light emitting device can comprise a remote phosphor configuration in which the narrow-band red photoluminescence materials are provided in a separate component(s) that is(are) located remotely (in spaced separation) to the excitation sources and may be separated by an air gap or other suitable light transmissive medium for example. In some embodiments, the combination of narrow-band red photoluminescence materials comprises a first narrow-band red photoluminescence material which generates light with a peak emission wavelength in a range 580 nm to 628 nm and has a FWHM emission intensity in a range 45 nm to 60 nm and a second narrow-band red photoluminescence material generates light with a peak emission wavelength in a range 628 nm to 640 nm and a FWHM emission intensity in a range 5 nm to 20 nm.

According to an embodiment, a light emitting device comprises an excitation source; and a photoluminescence material comprising a combination of a first narrow-band red photoluminescence material which generates light with a peak emission wavelength in a range 580 nm to 628 nm and a full width at half maximum emission intensity in a range 45 nm to 60 nm and a second narrow-band red photoluminescence material which generates light with a peak emission wavelength in a range 628 nm to 640 nm and a full width at half maximum emission intensity in a range 5 nm to 20 nm. A benefit of light emitting devices in accordance with the invention comprising a combination of a first shorter wavelength (580 nm to 628 nm) narrow-band red photoluminescence material and a second relatively longer wavelength (628 nm to 640 nm) much narrower FWHM (5 nm to 20 nm) narrow-band red photoluminescence material is that, compared with the known devices that utilize a single broad band red phosphor, they can increase luminous efficacy, general color rendering index (CRI Ra) and CRI R9. In some embodiments the excitation source generates excitation light with a dominant wavelength in a range 450 nm to 470 nm, that is light in the blue region of the visible spectrum. In other embodiments the excitation source generates excitation light with a dominant wavelength in a range 400 nm to 450 nm, that is light in the violet region of the visible spectrum. In yet further embodiments the excitation source generates excitation light with a dominant wavelength in a range 200 nm to 400 nm, that is light in the near to far ultraviolet region of the electromagnetic spectrum. In devices utilizing violet excitation light or ultraviolet excitation light the device can further comprise a photoluminescence material which generates light with a peak emission wavelength in a range 450 nm to 470 nm.

In some embodiments, the second narrow-band red photoluminescence material generates light with a peak emission wavelength in a range 630 nm to 632 nm and can for example comprise a manganese-activated fluoride phosphor. In some embodiments, the manganese-activated fluoride phosphor comprises a manganese-activated potassium hexafluorosilicate phosphor of general composition $K_2SiF_6$:$Mn^{4+}$ or a manganese-activated potassium hexafluorogermanate phosphor of general composition $K_2GeF_6$:$Mn^{4+}$. Alternatively, the manganese-activated fluoride phosphor can comprise a phosphor of general composition: $K_2TiF_6$:$Mn^{4+}$, $K_2SnF_6$:$Mn^{4+}$, $Na_2TiF_6$:$Mn^{4+}$, $Na_2ZrF_6$:$Mn^{4+}$, $Cs_2SiF_6$:$Mn^{4+}$, $Cs_2TiF_6$:$Mn^{4+}$, $Rb_2SiF_6$:$Mn^{4+}$, $Rb_2TiF_6$:$Mn^{4+}$, $K_3ZrF_7$:$Mn^{4+}$, $K_3NbF_7$:$Mn^{4+}$, $K_3TaF_7$:$Mn^{4+}$, $K_3GdF_6$:$Mn^{4+}$, $K_3LaF_6$:$Mn^{4+}$ or $K_3YF_6$:$Mn^{4+}$.

In embodiments, the first narrow-band red photoluminescence material generates light with a peak emission wavelength in a range of 624 nm to 628 nm and in some embodiments generates light with a peak emission wavelength of about 626 nm. The first narrow-band red photoluminescence material can comprise a narrow-band red phosphor or a QD material. In some embodiments, the first narrow-band red photoluminescence material comprises a Group IIA/IM selenide sulfide-based phosphor material. The Group IIA/BB selenide sulfide-based phosphor material can have a general composition $MSe_{1-x}S_x$:Eu, wherein M is at least one of Mg, Ca, Sr, Ba and Zn and 0<x<1.0. To improve reliability, the Group IIA/BB selenide sulfide-based phosphor can further comprise an impermeable coating on individual ones of said phosphor particles. Such a coating can comprise one or more coating materials: amorphous alumina, aluminum oxide, silicon oxide, titanium oxide, zinc oxide, magnesium oxide, zirconium oxide, boron oxide, chromium oxide, calcium fluoride, magnesium fluoride, zinc fluoride, aluminum fluoride and titanium fluoride.

In some embodiments, the light emitting device comprises a white light emitting device and the photoluminescence material further comprises a green photoluminescence material, typically a phosphor that generates light with a peak emission wavelength in a range of 520 nm to 570 nm or in a range of 520 nm to 540 nm. In some embodiments, the green photoluminescence material comprises a cerium-activated garnet phosphor of general composition $Y_3(Al,Ga)_5O_{12}$:Ce. In other embodiments, the green photoluminescence material comprises an aluminate phosphor of general composition $Lu_3Al_5O_{12}$:Ce.

In embodiments, the light emitting device is characterized by a general color rendering index (CRI Ra) of greater than or equal to 90. Preferably, the light emitting device is further characterized by a CRI R9 of greater than or equal to 50.

A benefit of light emitting devices in accordance with the invention is that their optical performance can be optimized through the selection of the relative proportion (wt. %) of the first narrow-band red photoluminescence material of the total narrow-band red photoluminescence content. For example, where it is required that the device has a CRI Ra≥85 then the proportion of the first-narrow-band red photoluminescence material of the total narrow-band red photoluminescence material content can be in a range ~2 wt. % to ~20 wt. %. For a device with a CRI Ra≥90, then the proportion of the first-narrow-band red photoluminescence material of the total narrow-band red photoluminescence content can be in a range ~3 wt. % to ~10 wt. %, and for a device having a CRI Ra≥95, then the proportion of the first-narrow-band red photoluminescence material of the total narrow-band red photoluminescence material content can be in a range ~4 wt. % to ~6 wt. %. Where it is required that the device has a CRI R9≥50 then the proportion of the first-narrow-band red photoluminescence material of the total narrow-band red photoluminescence material content can be in a range ~1 wt. % to ~7 wt. %. Accordingly, where it is required that the device has a CRI Ra≥90 and a CRI R9≥50 then the proportion of the first-narrow-band red photoluminescence material of the total narrow-band red photoluminescence material content can be in a range ~3 wt. % to ~7 wt. %.

In some embodiments, the first and second narrow-band red photoluminescence materials are a mixture.

According to some embodiments, a light emitting device comprises: an excitation source; and a photoluminescence material; said photoluminescence material comprising a combination of a green phosphor that generates light with a peak emission wavelength in a range of 520 nm to 570 nm; a manganese-activated potassium hexafluorosilicate phosphor of general composition $K_2SiF_6$:$Mn^{4+}$; and a Group IIA/IIB selenide sulfide-based phosphor material of composition $MSe_{1-x}S_x$:Eu, wherein M is at least one of Mg, Ca, Sr, Ba and Zn and 0<x<1.0 which generates light with a peak emission wavelength in a range 580 nm to 628 nm and a full width at half maximum emission intensity in a range 45 nm to 60 nm.

Embodiments of the present invention find utility in LED-filaments and LED-filament lamps. According to some embodiments, an LED-filament comprises: a light-transmissive substrate; at least one blue LED chip mounted on a face of said light-transmissive substrate; and a photoluminescence material at least partially covering said at least one blue LED chip, said photoluminescence material comprising a combination of a first narrow-band red photoluminescence material which generates light with a peak emission wavelength in a range 580 nm to 628 nm and a full width at half maximum emission intensity in a range 45 nm to 60 nm and a second narrow-band red photoluminescence material generates light with a peak emission wavelength in a range 628 nm to 640 nm and a full width at half maximum emission intensity in a range 5 nm to 20 nm.

It will be understood that the foregoing embodiments in relation to light emitting devices are equally applicable to embodiments comprising LED-filaments. Moreover, the features described in relation to devices can be used can be used interchangeably with those of LED-filaments.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Embodiments of the invention concern light emitting devices and LED-filaments comprising a combination (typically a mixture) of at least two narrow-band red emitting photoluminescence materials. As defined above, in this patent specification a narrow-band red photoluminescence materials refers to a material which generates light having a peak emission wavelength ($\lambda_{pe}$) in a range 580 nm to 640 nm, that is in the orange to red region of the visible spectrum and a full width at half maximum emission intensity of between about 5 nm and about 60 nm. For comparison, a CASN red nitride phosphor (Calcium Aluminum Silicon Nitride based phosphor—general composition $CaAlSiN_3$:$Eu^{2+}$) typically has a FWHM of ~80 nm. CASN red phosphors are commonly used in known LED applications.

In some embodiments, the narrow-band emitting phosphors comprise a combination (for instance, a mixture) of a Group IIA/IM selenide sulfide-based phosphor material such as for example $CaSe_{1-x}S_x$:Eu (CSS) having a FWHM~50 nm to ~60 nm and a manganese-activated fluoride phosphor such as for example $K_2SiF_6$:$Mn^{4+}$ (KSF) having a FWHM of ~5 nm to ~10 nm.

Narrow-Band Red Photoluminescence Materials

The narrow-band red photoluminescence materials can comprise a phosphor and/or a quantum dot (QD) material.

Narrow-Band Red Phosphors: Manganese-Activated Fluoride Phosphors

Figure 1:
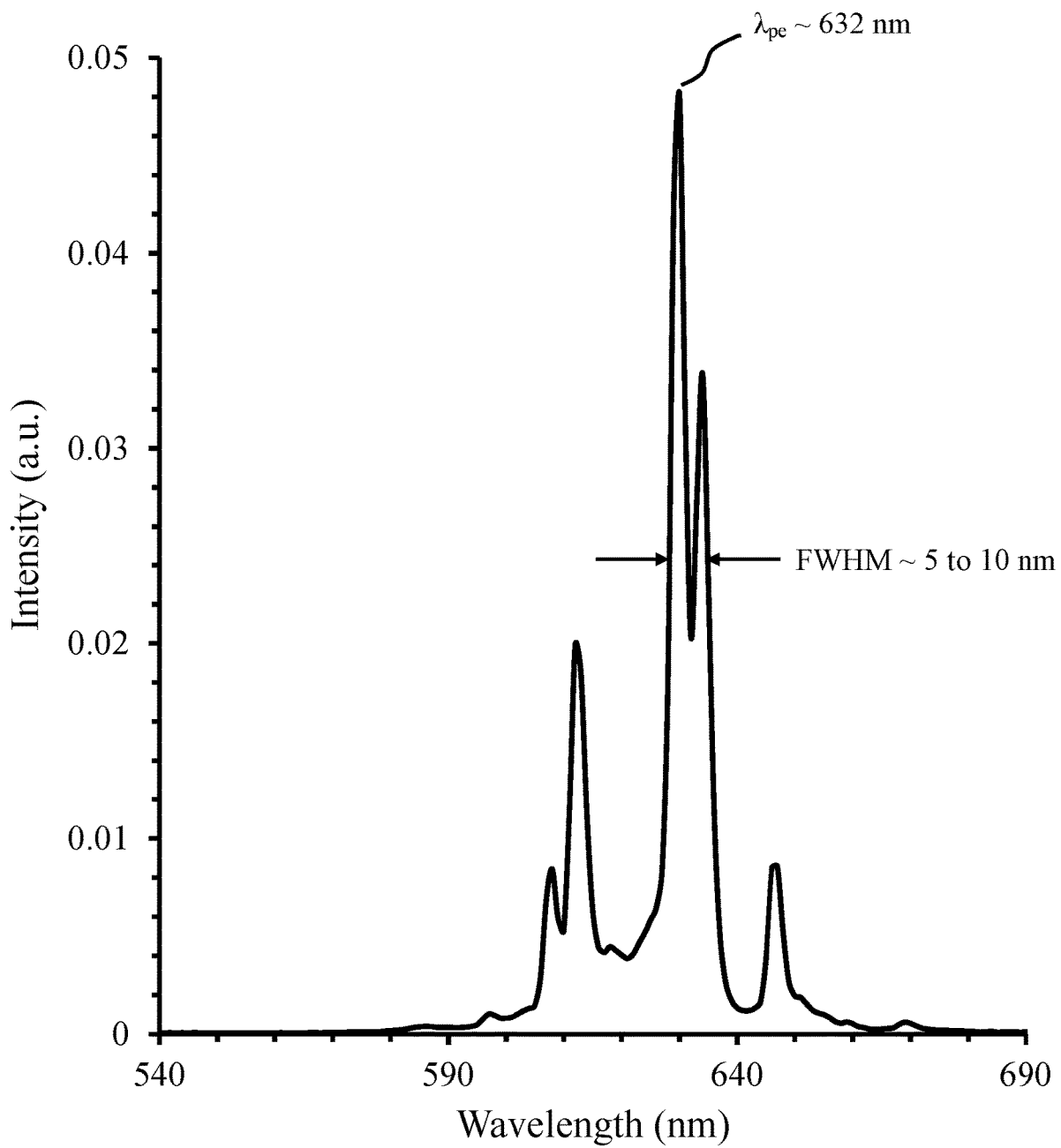
FIG. 1 shows an emission spectrum for KSF ($K_2SiF_6$:$Mn^{4+}$) narrow-band red phosphor.

Narrow-band red phosphors can include manganese-activated fluoride phosphors. An example of a manganese-activated fluoride phosphor is manganese-activated potassium hexafluorosilicate phosphor (KSF) of general composition $K_2SiF_6$:$Mn^{4+}$. An example of such a phosphor is NR6931 KSF phosphor from Intematix Corporation, Fremont California, USA which has a peak emission wavelength of about 632 nm. FIG. 1 shows the emission spectrum of NR6931 KSF phosphor. KSF phosphor is excitable by blue excitation light and generates red light with a peak emission wavelength ($\lambda_{pe}$) of between about 631 nm and about 632 nm with a FWHM of ~5 nm to ~10 nm (depending on the way it is measured: i.e. whether the width takes account of a single or double peaks—FIG. 1). Other manganese-activated phosphors can include: $K_2GeF_6$:$Mn^{4+}$, $K_2TiF_6$:$Mn^{4+}$, $K_2SnF_6$:$Mn^{4+}$, $Na_2TiF_6$:$Mn^{4+}$, $Na_2ZrF_6$:$Mn^{4+}$, $Cs_2SiF_6$:$Mn^{4+}$, $Cs_2TiF_6$:$Mn^{4+}$, $Rb_2SiF_6$:$Mn^{4+}$, $Rb_2TiF_6$:$Mn^{4+}$, $K_3ZrF_7$:$Mn^{4+}$, $K_3NbF_7$:$Mn^{4+}$, $K_3TaF_7$:$Mn^{4+}$, $K_3GdF_6$:$Mn^{4+}$, $K_3LaF_6$:$Mn^{4+}$ and $K_3YF_6$:$Mn^{4+}$.

Narrow-Band Red Phosphors: Group IIA/IM Selenide Sulfide-Based Phosphors

Figure 2:
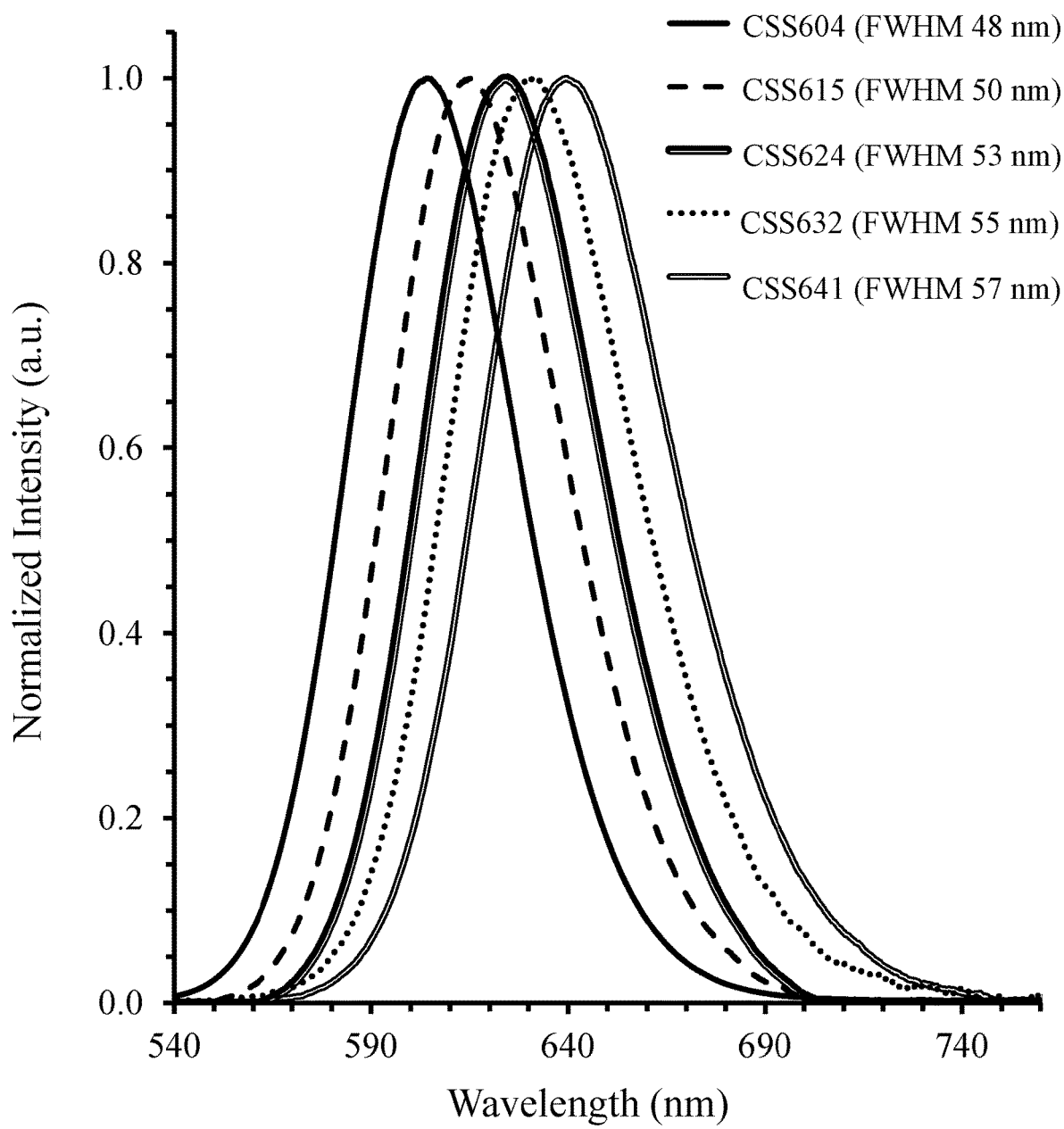
FIG. 2 shows normalized emission spectra for CSS ($CaSe_{1-x}S_x$:Eu) narrow-band red phosphors for differing ratios of S/Se.

Narrow-band red phosphors can also include Group IIA/IM selenide sulfide-based phosphors. A first example of a Group IIA/IM selenide sulfide-based phosphor material has a general composition $MSe_{1-x}S_x$:Eu, wherein M is at least one of Mg, Ca, Sr, Ba and Zn and 0<x<1.0. A particular example of this phosphor material is CSS phosphor ($CaSe_{1-x}S_x$:Eu). Details of CSS phosphors are provided in co-pending United States patent application Publication Number US2017/0145309 filed 30 Sep. 2016, which is hereby incorporated by reference in its entirety. The CSS narrow-band red phosphors described in United States patent publication US2017/0145309 can be used in the present invention. FIG. 2 shows normalized emission spectra of CSS phosphors (denoted CSS604, CSS615, CSS624, CSS632, CSS641) for differing ratios of S/Se (sulfur/selenium). In this patent specification, the notation CSS # represents the phosphor type (CSS) followed by the peak emission wavelength in nanometers (#). For example CSS615 denotes a CSS phosphor with a peak emission wavelength of 615 nm. The emission peak wavelength of the CSS phosphor can be tuned from 600 nm to 650 nm by altering the S/Se ratio in the composition and exhibits a narrow-band red emission spectrum with FWHM in the range ~48 nm to ~60 nm (longer peak emission wavelength typically has a larger FWHM value). Note that x varies over a range from about 0.05 to about 0.8 for the compositions shown in FIG. 2—the higher peak wavelengths corresponding to the larger values of x; that is, as the amount of S increases this shifts the emission peak to a higher wavelength.

CSS phosphor particles can be synthesized from purified $CaSeO_4$ and $CaSO_4$ in a mild $H_2$ (gas) environment (for example ~5% $H_2/N_2$).

Narrow-Band Red Phosphors: Coated CSS Phosphors

To improve reliability, the CSS phosphor particles can be coated with one or more oxides, for example: aluminum oxide ($Al_2O_3$), silicon oxide ($SiO_2$), titanium oxide ($TiO_2$), zinc oxide (ZnO), magnesium oxide (MgO), zirconium oxide ($ZrO_2$), boron oxide ($B_2O_3$) or chromium oxide (CrO). Alternatively and/or in addition, the narrow-band red phosphor particles may be coated with one or more fluorides, for example: calcium fluoride ($CaF_2$), magnesium fluoride ($MgF_2$), zinc fluoride ($ZnF_2$), aluminum fluoride ($AlF_3$) or titanium fluoride ($TiF_4$). The coatings may be a single layer, or multiple layers with combinations of the aforesaid coatings. The combination coatings may be coatings with an abrupt transition between the first and second materials, or may be coatings in which there is a gradual/smooth transition from the first material to the second material thus forming a zone with mixed composition that varies through the thickness of the coating.

Figure 3:
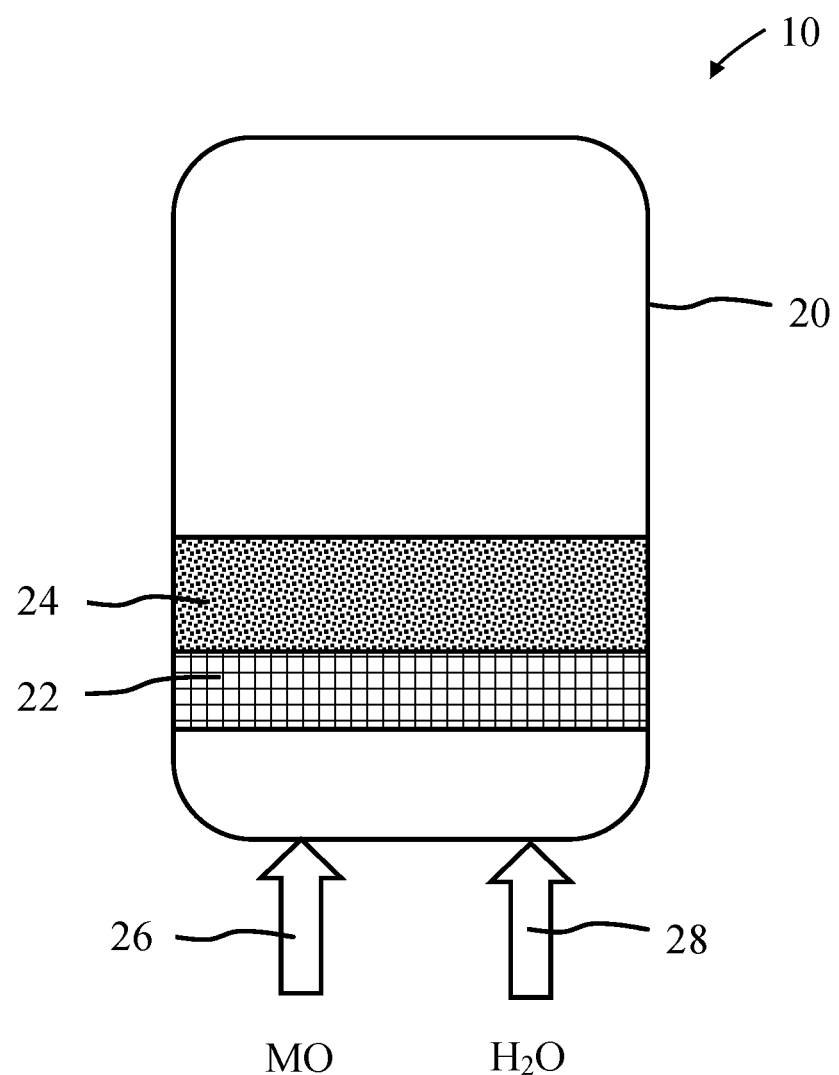
FIG. 3 is a schematic representation of a phosphor particle coating apparatus.

The particles can be coated by a CVD process in a fluidized bed reactor. FIG. 3 is a schematic representation of a phosphor particle coating apparatus 10. Reactor 20 comprises a porous support disc 22, over which phosphor powder 24 is held, and inlets 26 and 28 for metal organic precursor and water vapor, respectively. The thickness of the coating may be a few micrometers. For example, typically, 1 μm to 2 μm.

Coated CSS narrow-band red phosphors are typically coated with approximately 1 μm of amorphous alumina ($Al_2O_3$). In the case of alumina coatings, the coatings comprise a dense amorphous oxide coating layer on the CSS phosphor particle surface without pinholes (pinhole-free) that is a water impermeable coating.

In a typical coating process, the phosphor powder sample was loaded into the reactor and heated to 100-250° C., preferably 200° C., under $N_2$ gas flow. When an oxide coating is to be deposited, a metal organic oxide precursor MO such as TrimethylAluminum (TMA), Titanium tetra-chloride ($TiCl_4$), Silicon tetra-chloride ($SiCl_4$), or Dimethylzinc (DMZ) was introduced in to the reactor 20 through inlet 26 with a $N_2$ carrier gas through a bubbler. $H_2O$ vapor was also introduced into the reactor 20 through inlet 28 to react with the metal oxide precursor to form oxide coating layers on phosphor particles. Complete fluidization of the particles being coated (from gas flow optimization, etc.) without any dead space is important to ensure homogeneous coating of all phosphor particles. In a typical coating conducted at 200° C., for a 250 g phosphor particle loading of the reactor, the coating was produced with a metal oxide precursor feeding rate of 1 to 10 g/hour for 4 hours, while feeding H$_2$O at a rate of 2 to 7 g/hour. These conditions can produce dense and pinhole free coatings and these conditions are able to produce dense substantially pinhole free coatings of uniform thickness, with a theorized percentage solid space (percentage bulk density) of greater than 95%, 97% and 99%. In this patent specification, percentage solid space=(bulk density of the coating/density of the material within a single particle)×100. It will be understood that the percentage solid space (% solid space) provides a measure of the porosity of the coating resulting from pinholes.

A variation of the phosphor particle coating apparatus of FIG. 3 for depositing a fluoride coating comprises introducing a metal organic fluoride MF precursor in to the reactor 20 through inlet 26 with a N$_2$ carrier gas through a bubbler. When depositing a fluoride coating, no H$_2$O is introduced into the reactor. In other respects, coating with a fluoride is analogous to coating with an oxide as described above.

Narrow-Band Red Phosphors: Doped-CSS Phosphors

A second example of a Group IIA/IIB selenide sulfide-based phosphor material has a general composition MS$_x$Se$_y$A$_z$:Eu, wherein M is at least one of Mg, Ca, Sr and Ba, A comprises one or more of carbon, nitrogen, boron, phosphorous and a monovalent combining group NCN (cyanamide), $0 < z \leq 0.05$, and $0.8 < x+y < 1.25$. A particular example of this phosphor material is a doped-CSS phosphor (CaS$_x$Se$_y$A$_z$:Eu). Details of these doped-CSS phosphors are provided in co-pending United States patent application Publication Number US2017/0145310 filed 18 Mar. 2016, which is hereby incorporated by reference in its entirety. It is envisaged that the doped-CSS phosphors described in co-pending United States patent publication US2017/0145310 can be used in the present invention. More generally, a narrow-band red phosphor can have a general composition MS$_x$Se$_y$A$_z$:Eu, wherein M is at least one of Mg, Ca, Sr and Ba, A is at least one of C, N, B, P, and the monovalent combining group NCN(cyanamide), and can further include one or more of O, F, Cl, Br and I. It can be that (1) $0.8 < x+y < 1.25$ (where $x \geq 0$ and $y \geq 0.1$) and $0 < z \leq 0.05$, and it can be that (2) x+y is not equal to 1, $x \geq 0$, $y \geq 0.1$ and $0 < z \leq 0.05$, and it can be that (3) $1.0 < x+y < 1.25$ (where $x \geq 0$ and $y \geq 0.1$) and $0 < z \leq 0.05$, and it can be that (4) x, y and z are determined strictly by charge balancing. The narrow-band red phosphor can have a particle size distribution defined by $D_{50}$ in the range of 3 to 45 μm (microns), end points included, and it can be that $D_{50}$ in the range of 5 to 25 μm (microns), end points included. It is expected that the element A may be found in the phosphor material in one or more of the following positions: an interstitial position, a substitutional position, on a grain boundary or crystal surface, or within a second phase (such as within calcium fluoride). Although the doped-CSS phosphors can comprise phosphor compounds in which M is one or more alkaline earth metals, some amount of other metals such as zinc, lithium or cadmium can substitute for some of the alkaline earth metal.

Narrow-Band Red Phosphors: Synthesis of Doped-CSS Phosphors (MS$_x$Se$_y$A$_z$:Eu)

Example 1: Synthesis of 120 g of CaSeO$_4$ with 0.3 wt. % Eu$_2$O$_3$

After dissolving 83.4 g SeO$_2$ in 300 ml of de-ionized water in a beaker, 45.0 g of 30% H$_2$O$_2$ solution is slowly added, then stirred for about 1 hour. Ammonium hydroxide (29 wt. %) is then slowly added to the solution until the pH reached approximately 10—this is solution #1.

110.0 g of CaCl$_2$.2H$_2$O is dissolved in 450 ml of ethanol in another beaker, then 0.40 g of Eu$_2$O$_3$ powder is added, followed by 36% HCl which is slowly added until the solution became clear—this is solution #2.

The solution of (NH$_4$)$_2$SeO$_4$ (solution #1) is added dropwise to solution #2 precipitating white crystals; the solution with precipitates is stirred for about 2 hours, then the solution is filtered and the precipitates are dried at 80° C.

Example 2: Synthesis of Doped-CSS Phosphors (CaS$_{0.25-z}$Se$_{0.75}$C$_z$Eu$_{0.003}$)

30 g of white CaSeO$_4$ with 0.3 wt. % Eu powder is mixed with 1.2 g of sulfur powder and 1.2 g powdered carbon (such as Alfa Aesar: carbon black, 99.9+%). The mixture is put in an alumina crucible with an alumina cover and fired at 600° C. for 2 hours under 5% hydrogen balanced with nitrogen, then the temperature is increased to 900° C. for 4 hours. Furthermore, amounts of LiF, NH$_4$Cl, CaCl$_2$) or NH$_4$Br can also be added as a flux. It can be that 0.9 g of boric acid is used in place of the powdered carbon to make MS$_x$Se$_y$B$_z$:Eu phosphors. Similarly, calcium nitride, phosphorus pentasulfide and calcium cyanamide can be used in place of carbon as sources of N, P and NCN in the phosphor material.

Example 3: Washing as-Synthesized Doped-CSS Phosphors (CaS$_{0.25-z}$Se$_{0.75}$C$_z$Eu$_{0.003}$)

The above as-synthesized phosphors are ground in a ceramic mortar, then placed in 600 ml of methanol solution in a 1.0 liter beaker and stirred for 1 hour, then the phosphor particles are allowed to settle, the solvents are decanted off the phosphor particles, and the particles are dried.

As with CSS phosphors, the doped-CSS phosphor can be coated in the same manner and with the same materials detailed above.

Narrow-Band Red Photoluminescence Materials: Red Quantum Dots (QDs)

A quantum dot (QD) is a portion of matter (e.g. semiconductor) whose excitons are confined in all three spatial dimensions that may be excited by radiation energy to emit light of a particular wavelength or range of wavelengths. The color of light generated by a QD is enabled by the quantum confinement effect associated with the nano-crystal structure of the QD. The energy level of each QD relates directly to the physical size of the QD. For example, the larger QDs, such as red QDs, can absorb and emit photons having a relatively lower energy (i.e. a relatively longer wavelength). On the other hand, blue QDs, which are smaller in size can absorb and emit photons of a relatively higher energy (shorter wavelength). QDs generate light with a FWHM emission intensity in a range XX nm to YY nm.

The QD materials can comprise core/shell nano-crystals containing different materials in an onion-like structure. For example, the above-described exemplary materials can be used as the core materials for the core/shell nano-crystals. The optical properties of the core nano-crystals in one material can be altered by growing an epitaxial-type shell of another material. Depending on the requirements, the core/shell nano-crystals can have a single shell or multiple shells. The shell materials can be chosen based on the band gap engineering. For example, the shell materials can have a band gap larger than the core materials so that the shell of the nano-crystals can separate the surface of the optically active core from its surrounding medium. In the case of the cadmium-based QDs, e.g. CdSe QDs, the core/shell quantum dots can be synthesized using the formula of CdSe/ZnS, CdSe/CdS, CdSe/ZnSe, CdSe/CdS/ZnS, or CdSe/ZnSe/ZnS. Similarly, for $CuInS_2$ quantum dots, the core/shell nanocrystals can be synthesized using the formula of $CuInS_2$/ZnS, $CuInS_2$/CdS, $CuInS_2$/$CuGaS_2$, $CuInS_2$/$CuGaS_2$/ZnS and so on.

QDs can comprise different materials and examples of red QD compositions are given in Table 1.

TABLE 1

| Red Quantum | dot composition (580 nm-640 nm) |
|---|---|
| CdSe ~4.2 nm | cadmium selenide |
| $Cd_xZn_{1-x}Se$ | cadmium zinc selenium |
| CdZnSeS | cadmium zinc selenium sulfide |
| $CdSe_xS_{1-x}$ | cadmium selenium sulfide |
| CdTe | cadmium telluride |
| $CdTe_xS_{1-x}$ | cadmium tellurium sulfide |
| InP | indium phosphide |
| $In_xGa_{1-x}P$ | indium gallium phosphide |
| InAs | indium arsenide |
| $CuInS_2$ | copper indium sulfide |
| $CuInSe_2$ | copper indium selenide |
| $CuInS_xSe_{2-x}$ | copper indium sulfur selenide |
| $CuIn_xGa_{1-x}S_2$ | copper indium gallium sulfide |
| $CuIn_xGa_{1-x}Se_2$ | copper indium gallium selenide |
| $CuGaS_2$ | copper gallium sulfide |
| $CuIn_xAl_{1-x}Se_2$ | copper indium aluminum selenide |
| $CuInS_{2x}ZnS_{1-x}$ | copper indium sulfur zinc sulfide |
| $CuInSe_{2x}ZnSe_{1-x}$ | copper indium selenium zinc selenide |

Green Photoluminescence Materials

In this patent specification, a green photoluminescence material refers to a material which generates light having a peak emission wavelength ($\lambda_{pe}$) in a range ~520 nm to ~570 nm, more typically in a range ~520 nm to ~540 nm, that is in the green region of the visible spectrum. Preferably, the green photoluminescence material has a broad emission characteristic and preferably has a FWHM of ~100 nm or wider. The green photoluminescence material can comprise any photoluminescence material, such as for example silicate, aluminate or garnet-based inorganic green phosphor materials. Examples of silicate phosphors include europium activated ortho-silicate phosphors of general composition $(Ba, Sr)_2SiO_4$:Eu such as for example G, EG, Y and EY series of phosphors from Intematix Corporation, Fremont California, USA which have a peak emission wavelength in a range 507 nm to 570 nm and a FWHM of ~70 nm to ~80 nm. In some embodiments, the green photoluminescence materials comprises a cerium-activated yttrium aluminum garnet phosphor of general composition $Y_3(Al,Ga)_5O_{12}$:Ce (YAG) such as for example a GNYAG series phosphor from Intematix Corporation, Fremont California, USA which have a peak emission wavelength of in a range 527 nm to 543 nm and a FWHM of ~120 nm. In some embodiments, the green photoluminescence material can comprise an aluminate phosphor of general composition $Lu_3Al_5O_{12}$:Ce (GAL). Examples of such phosphors include for example the GAL series of phosphor from Intematix Corporation, Fremont California, USA which have a peak emission wavelength of 516 nm to 560 nm and a FWHM of ~120 nm. In this patent specification, the notation GAL # represents the phosphor type (GAL)—LuAG—based phosphors—followed by the peak emission wavelength in nanometers (#). For example, GAL535 denotes a GAL phosphor with a peak emission wavelength of 535 nm.

Light Emitting Device

Figure 4:
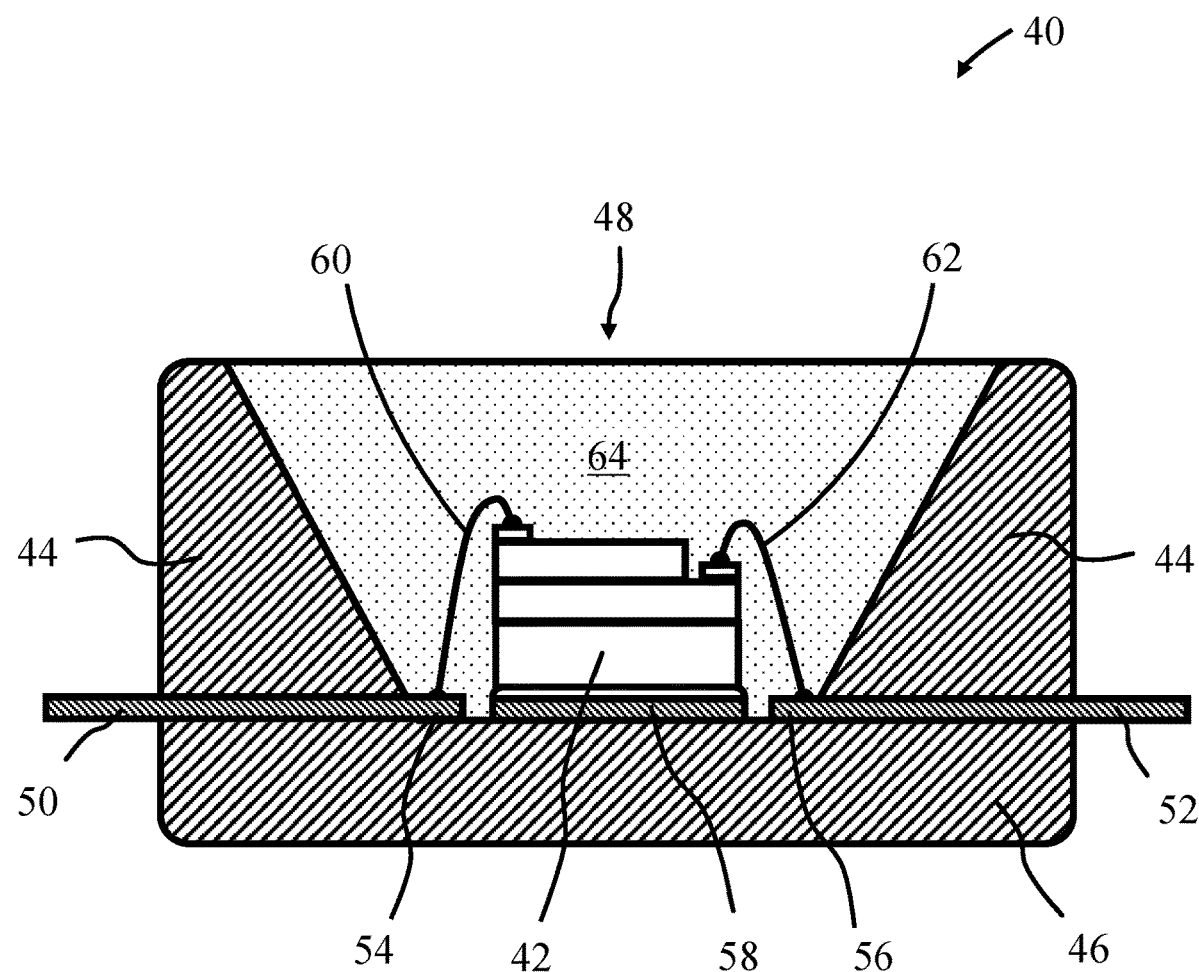
FIG. 4 is a cross-sectional side view of a light emitting device in accordance with an embodiment of the invention.

FIG. 4 illustrates a schematic cross-sectional representation of a white light emitting device 40, according to some embodiments. The device 40 can comprise a blue light emitting, within the range of 450 nm to 470 nm, GaN (gallium nitride) LED chip 42, for example, housed within a package. The package, which can for example comprise a low temperature co-fired ceramic (LTCC) or high temperature polymer, comprises upper and lower body parts 44, 46. The upper body part 44 defines a recess 48, often circular in shape, which is configured to receive the LED chip(s) 42. The package further comprises electrical connectors 50 and 52 that also define corresponding electrode contact pads 54 and 56 on the floor of the recess 48. Using for example adhesive or solder, the LED chip 42 can be mounted to a thermally conductive pad 58 located on the floor of the recess 48. The LED chip's electrode pads are electrically connected to corresponding electrode contact pads 54 and 56 on the floor of the package using bond wires 60 and 62 and the recess 48 is completely filled with a transparent polymer material 64, typically a silicone, which is loaded with a combination (for example, a mixture of particles) of a green photoluminescence material and at least two narrow-band red photoluminescence materials such that the exposed surfaces of the LED chip 42 are covered by the phosphor/polymer material mixture. It will be understood that, in other embodiments, the LED chip may be at least partially covered by the combination of photoluminescence materials. To enhance the emission brightness of the device the walls of the recess are inclined and have a light reflective surface.

Cavity Test

The cavity test method involves mixing the phosphor powder mixture with an uncurable optical encapsulant (e.g. silicone) and placing the mixture in a LED cavity containing a blue LED and measuring total light emission in an integrating sphere. Once the measurement is completed the phosphor/encapsulant mixture is removed and the cavity cleaned ready for the next test.

In this specification, the following nomenclature is used to denote light emitting devices and LED-filaments: Ref. # denotes a reference light emitting device or LED-filament comprising a green phosphor and a broad-band red nitride phosphor (e.g. CASN); Com. # denotes a comparative light emitting device or LED-filament comprising a green phosphor and a single narrow-band red phosphor, and Dev. # denotes a light emitting device or LED-filament in accordance with an embodiment of the invention comprising a green phosphor and a combination (for instance, a mixture of particles) of two or more narrow-band red phosphors.

Narrow-Band Red Phosphor Vs Broad-Band Red Phosphor

Before discussing light emitting devices in accordance with the invention that comprise a combination of at least two narrow-band red phosphors, comparative devices comprising a single narrow-band red phosphor are compared with a reference device comprising a broad-band red phosphor.

Table 2 tabulates 2700K (nominal) device phosphor compositions for comparative devices, denoted Com.1-3, comprising CSS narrow-band phosphors with differing ratios of S/Se; and a reference device (2700K, CRI Ra 80), denoted Ref.1, comprising a CASN628 broad-band red phosphor. In this patent specification, the notation CASN # represents the phosphor type (CASN) followed by the peak emission wavelength ($\lambda_{pe}$) in nanometers (#). For example CASN628 denotes a CASN (Calcium Aluminum Silicon Nitride phosphor—$CaAlSiN_3:Eu^{2+}$) red nitride phosphor with a peak emission wavelength of 628 nm.

As can be seen from the table, in terms of phosphor composition, Ref 1 comprises GAL535+red nitride phosphor (CASN628); Com.1 comprises green aluminate phosphor (GAL535)+narrow-band red phosphor CSS610 ($\lambda_{pe}$=610 nm, FWHM~50 nm); Com.2 comprises GAL535+CSS615 ($\lambda_{pe}$=615 nm, FWHM~60 nm); and Com.3 comprises GAL535+CS S620=620 nm, FWHM~60 nm).

TABLE 2

2700K light emitting device phosphor composition

| Device | Red phosphor composition | | Phosphor composition (wt. %) | | Total phosphor per 100 g silicone (g) |
|---|---|---|---|---|---|
| | Broad-band red phosphor | Narrow-band red phosphor | Red | Green (GAL535) | |
| Ref.1 | CASN628 | — | 8.0 | 92.0 | 50 |
| Com. 1 | — | CSS610 | 10.5 | 89.5 | 50 |
| Com. 2 | — | CSS615 | 10.2 | 89.8 | 50 |
| Com. 3 | — | CSS620 | 9.8 | 90.2 | 50 |

Table 3 tabulates measured phosphor cavity test data for light emitting devices Com.1-3 and Ref 1 and illustrates the effect on optical performance of using a narrow-band red phosphor (CSS) compared with using a broad-band red phosphor (CASN).

TABLE 3

Measured test data for 5630 cavity test (Excitation source dominant wavelength 452 nm)

| Device | Brightness CE | Brightness CE (%) | Efficacy LE | Efficacy LE (%) | CIE x | CIE y | CCT (K) | CRI Ra | CRI R9 |
|---|---|---|---|---|---|---|---|---|---|
| Ref. 1 | 242.6 | 100.0 | 327.9 | 100.0 | 0.4606 | 0.4127 | 2707 | 82.9 | 6.9 |
| Com. 1 | 268.1 | 110.6 | 377.2 | 115.0 | 0.4583 | 0.4085 | 2706 | 68.0 | −74.8 |
| Com. 2 | 258.7 | 106.4 | 362.6 | 110.6 | 0.4604 | 0.4126 | 2707 | 78.4 | −30.1 |
| Com. 3 | 248.2 | 102.0 | 351.4 | 107.2 | 0.4592 | 0.4134 | 2731 | 84.6 | −1.1 |

Figure 5:
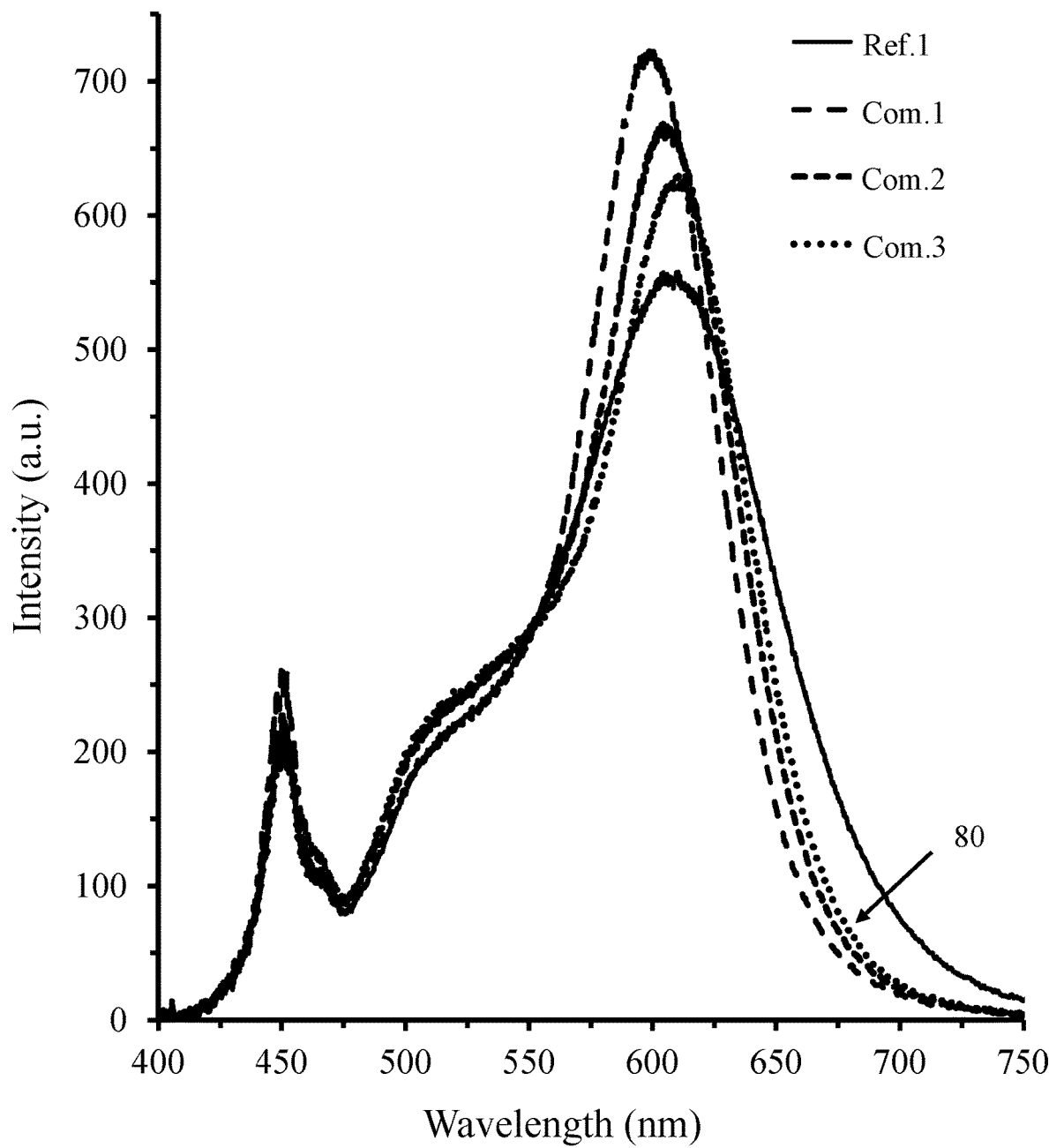
FIG. 5 shows measured emission spectra for light emitting devices: i) Ref.1–green aluminate phosphor (GAL535)+red nitride phosphor (CASN628), ii) Com.1–GAL535+narrow-band red phosphor (CSS610), iii) Com.2–GAL535+narrow-band red phosphor (CSS615), and iv) Com.3–GAL535+narrow-band red phosphor (CSS620)

FIG. 5 shows measured emission spectra for light emitting devices Com.1-3 and Ref.1 which illustrates the visual effect on emission spectrum of using a single narrow-band red phosphor compared with using a single broad-band red phosphor (CASN628: $\lambda_{pe}$=628 nm, FWHM~80 nm). Comparing the emission spectra, it can be seen that using a single CSS narrow-band red phosphor: i) reduces the energy content of the emission spectrum at wavelength longer than about 630 nm as indicated by call-out 80 in FIG. 5 and ii) increases by about 20% (550→725) the emission peak intensity at about 610 nm. As can be seen from Table 3, the combined effects of reducing the spectral content at wavelengths greater than 630 nm and increasing the peak emission intensity, increases the brightness CE by 2%-11% and increases luminous efficacy LE by 7%-15% depending on the peak emission wavelength of the CSS phosphor. However, while the brightness/luminous efficacy may increase there is a decrease in CRI R9 from 6.9 (Ref.1) to a negative value of −1.1 to −74.8 depending on the peak emission wavelength $\lambda_{pe}$ of the CSS phosphor. Additionally, there can be a decrease in CRI Ra from 82.9 (Ref.1) to as low as 68.0 (Com.1).

Devices Comprising a Combination of Narrow-Band Red Phosphors

Table 4 tabulates light emitting device phosphor composition for 2700K (nominal) light emitting devices denoted Dev.1-6 in accordance with an embodiment of the invention that comprise a combination (typically, a mixture of particles) of two narrow-band red phosphors (CSS615 and KSF). For comparison, Table 4 includes details of a reference light emitting device (2700K, CRI Ra 80), denoted Ref.2 and 2700K comparative light emitting device, denoted Com.4 comprising a single KSF narrow-band red phosphor.

As can be seen from the table, in terms of phosphor composition, Dev.1 comprises a GAL535+a narrow-band red phosphor mixture (30 wt. % CSS615 & 70 wt. % KSF); Dev.2 comprises GAL535+a narrow-band red phosphor mixture (20 wt. % CSS615 & 80 wt. % KSF); Dev.3 comprises GAL535+narrow-band red phosphor mixture (15 wt. % CSS615 & 85 wt. % KSF); Dev.4 comprises GAL535+narrow-band red phosphor mixture (10 wt. % CSS615 & 90 wt. % KSF); Dev.5 comprises GAL535+narrow-band red phosphor mixture (6 wt. % CSS615 & 94 wt. % KSF); Dev.6 comprises GAL535+narrow-band red phosphor mixture (3 wt. % CSS615 & 97 wt. % KSF); comparative device Com.4 comprises GAL535+KSF narrow-band red phosphor; and reference device, Ref.2, comprises GAL535+red nitride phosphor

TABLE 4

2700 K light emitting device phosphor composition

| | Red phosphor composition (wt. %) | | | Phosphor composition (wt. %) | | Total phosphor per 100 g |
|---|---|---|---|---|---|---|
| Device | CASN628 | CSS615 | KSF | Red | Green (GAL535) | silicone (g) |
| Ref. 2 | 100.0 | — | — | 8.0 | 92.0 | 60 |
| Dev. 1 | — | 30.0 | 70.0 | 29.0 | 71.0 | 85 |
| Dev. 2 | — | 20.0 | 80.0 | 39.8 | 60.2 | 90 |
| Dev. 3 | — | 15.0 | 85.0 | 46.0 | 54.0 | 93 |
| Dev. 4 | — | 10.0 | 90.0 | 51.0 | 49.0 | 95 |
| Dev. 5 | — | 6.0 | 94.0 | 62.0 | 38.0 | 105 |

TABLE 4-continued

2700 K light emitting device phosphor composition

| | Red phosphor composition (wt. %) | | | Phosphor composition (wt. %) | Green | Total phosphor per 100 g |
|---|---|---|---|---|---|---|
| Device | CASN628 | CSS615 | KSF | Red | (GAL535) | silicone (g) |
| Dev. 6 | — | 3.0 | 97.0 | 71.0 | 29.0 | 120 |
| Com. 4 | — | — | 100.0 | 82.0 | 18.0 | 150 |

Table 5 tabulates measured phosphor cavity test data for light emitting devices Dev.1-6, comparative device Com.4 and reference device Ref.2. This data illustrates the effect of CSS phosphor proportion (wt. %) of the total narrow-band red phosphor content on device optical characteristics.

TABLE 5

Measured test data for 5630 cavity test (LED dominant wavelength 452.4 nm)

| Device | Brightness CE | Brightness CE (%) | Efficacy LE | Efficacy LE (%) | CIE x | CIE y | CCT (K) | CRI Ra | CRI R9 |
|---|---|---|---|---|---|---|---|---|---|
| Ref. 2 | 244.2 | 100.0 | 331.8 | 100.0 | 0.4623 | 0.4150 | 2700 | 82.5 | 4.0 |
| Dev. 1 | 251.0 | 102.8 | 370.9 | 111.8 | 0.4642 | 0.4185 | 2700 | 82.2 | −12.8 |
| Dev. 2 | 257.0 | 105.2 | 361.8 | 109.0 | 0.4617 | 0.4140 | 2700 | 85.8 | 5.7 |
| Dev. 3 | 256.2 | 104.9 | 360.2 | 108.6 | 0.4622 | 0.4148 | 2700 | 87.2 | 11.8 |
| Dev. 4 | 253.4 | 103.7 | 357.8 | 107.8 | 0.4623 | 0.4151 | 2700 | 90.2 | 27.0 |
| Dev. 5 | 251.6 | 103.0 | 345.6 | 104.2 | 0.4624 | 0.4145 | 2695 | 95.2 | 67.8 |
| Dev. 6 | 246.9 | 101.1 | 337.3 | 101.7 | 0.4613 | 0.4131 | 2700 | 91.7 | 95.5 |
| Com. 4 | 239.7 | 98.1 | 319.0 | 96.1 | 0.4636 | 0.4174 | 2701 | 71.0 | 16 |

Figure 6:
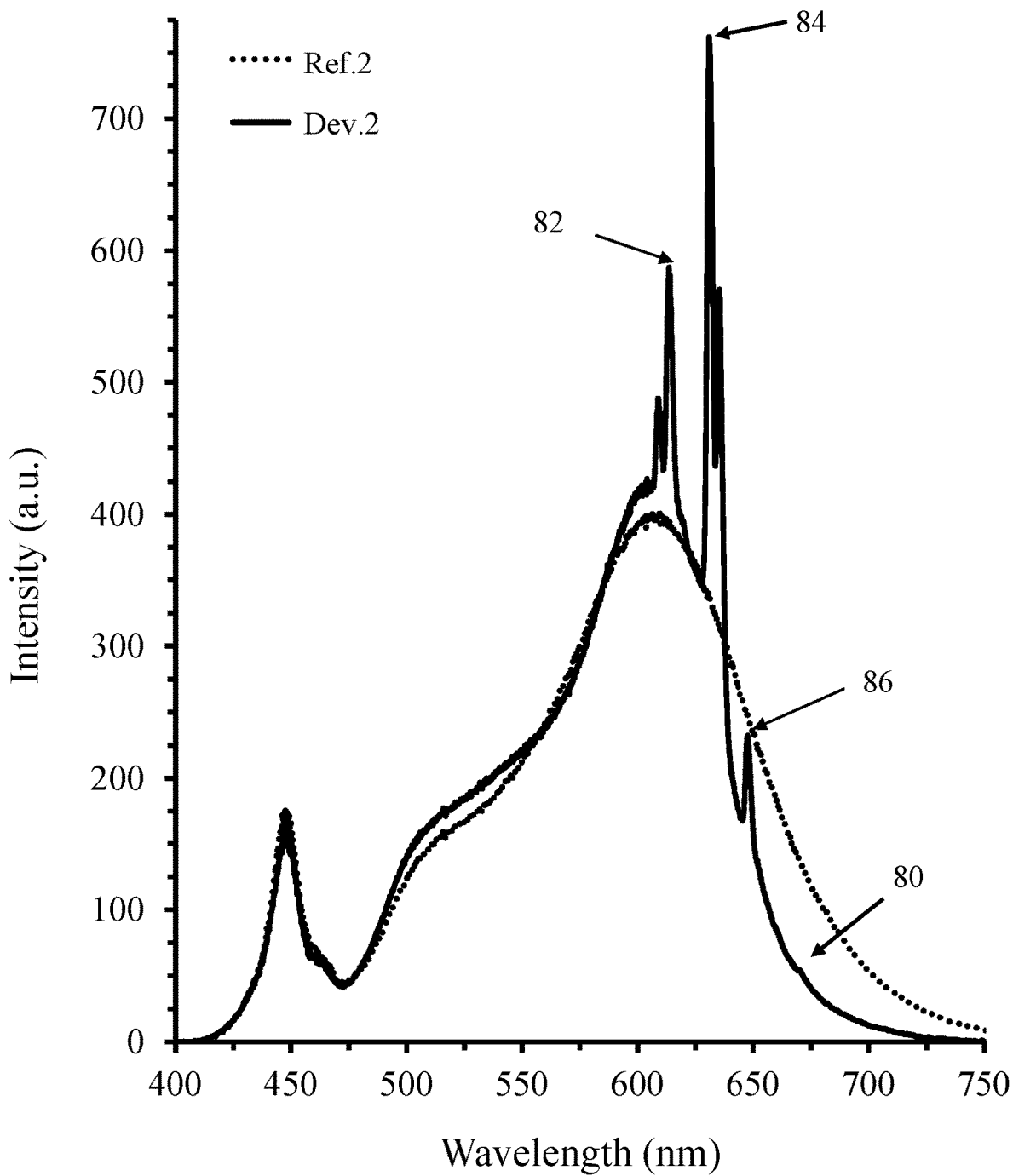
FIG. 6 shows measured emission spectra for light emitting devices: i) Ref 2–GAL535+CASN628 and ii) Dev.2–GAL535+narrow-band red phosphor mixture (20 wt. % CSS615 & 80 wt. % KSF)

FIG. 6 shows measured emission spectra for light emitting devices Dev.2 and Ref.2 and illustrates the visual effect on emission spectrum of using a mixture of two narrow-band red phosphors (CSS+KSF) compared with a single broad-band red phosphor (CASN). As can be seen from FIG. 6, and in common with comparative devices Com.1-3 (FIG. 5), the emission spectra for light emitting device Dev.2 has a reduced spectral energy content 80 at wavelength longer than about 650 nm as compared with Ref 2. The inclusion of a second narrow-band red phosphor (KSF) has reduced the emission peak intensity and introduced narrow emission peaks 82, 84, 86 at respective wavelengths ~615 nm, 631 nm, ~650 nm. As indicated in Table 5 (Dev.2), using a mixture of two narrow-band red phosphors can increase brightness CE (5%) and luminous efficacy LE (9%) without reducing CRI R9 (4.0–>5.7) and CRI Ra (82.5–>85.8).

Figure 7:
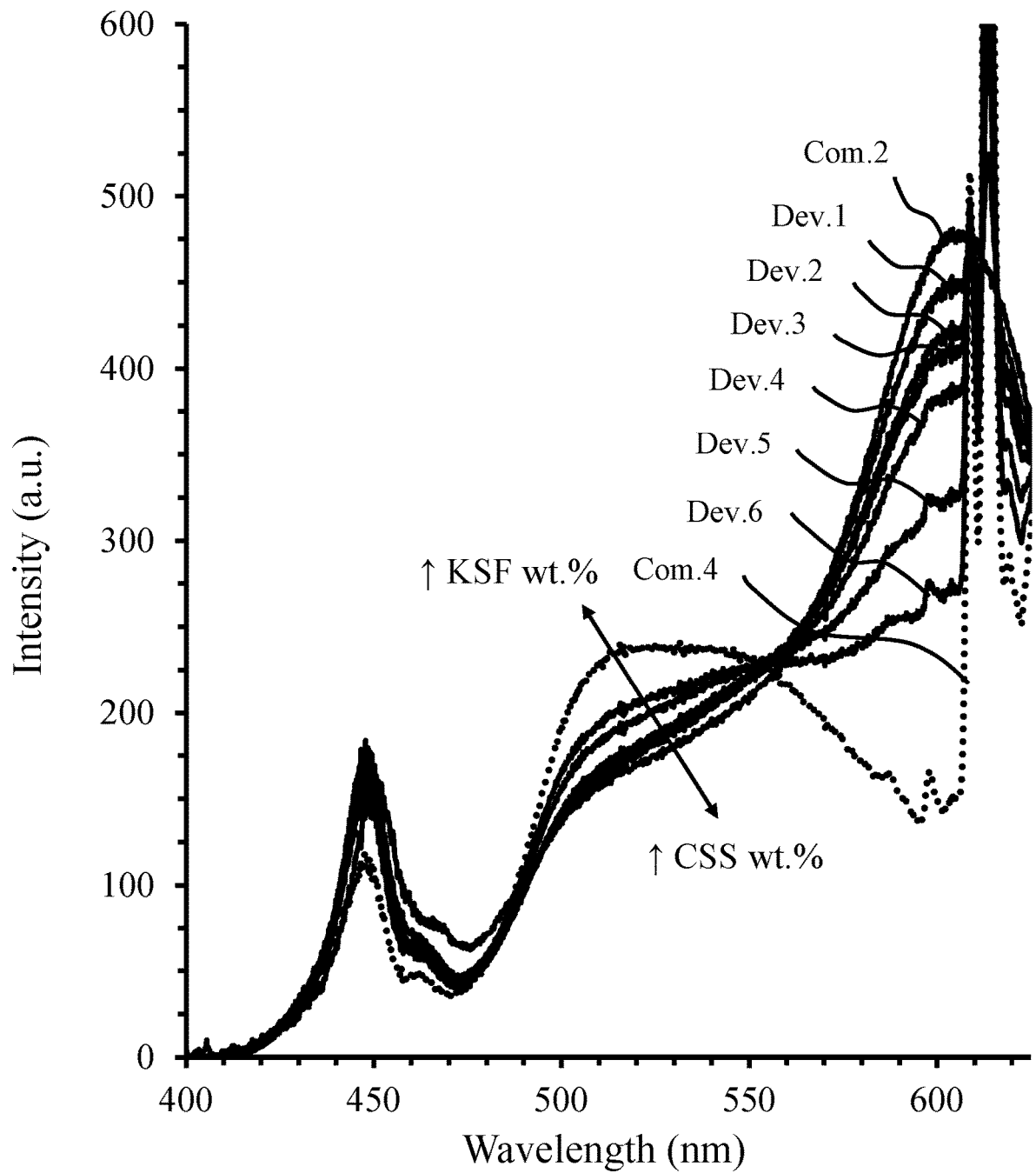
FIG. 7 shows measured emission spectra for light emitting devices Dev.1-6–GAL535+narrow-band red phosphor mixture comprising varying wt. % of CSS615 and KSF, Com.2, and Com.4–GAL535+narrow-band red phosphor (KSF)

FIG. 7 shows measured emission spectra for light emitting devices Dev.1-6 and comparative devices Com.2 (100% CSS) and Com.4 (100% KSF). The figure illustrates the visual effect on emission spectrum of CSS phosphor proportion (wt. %) of total narrow-band red phosphor content. As can be seen from FIG. 7, the effect of increasing the proportion (wt. %) of CSS phosphor of the total narrow-band red phosphor content (↑CSS wt. %) content simultaneously i) increases the intensity of the peak at ~605 nm and ii) to a lesser extent decreases the energy content in the wavelength range ~510 nm to ~560 nm.

Figure 8:
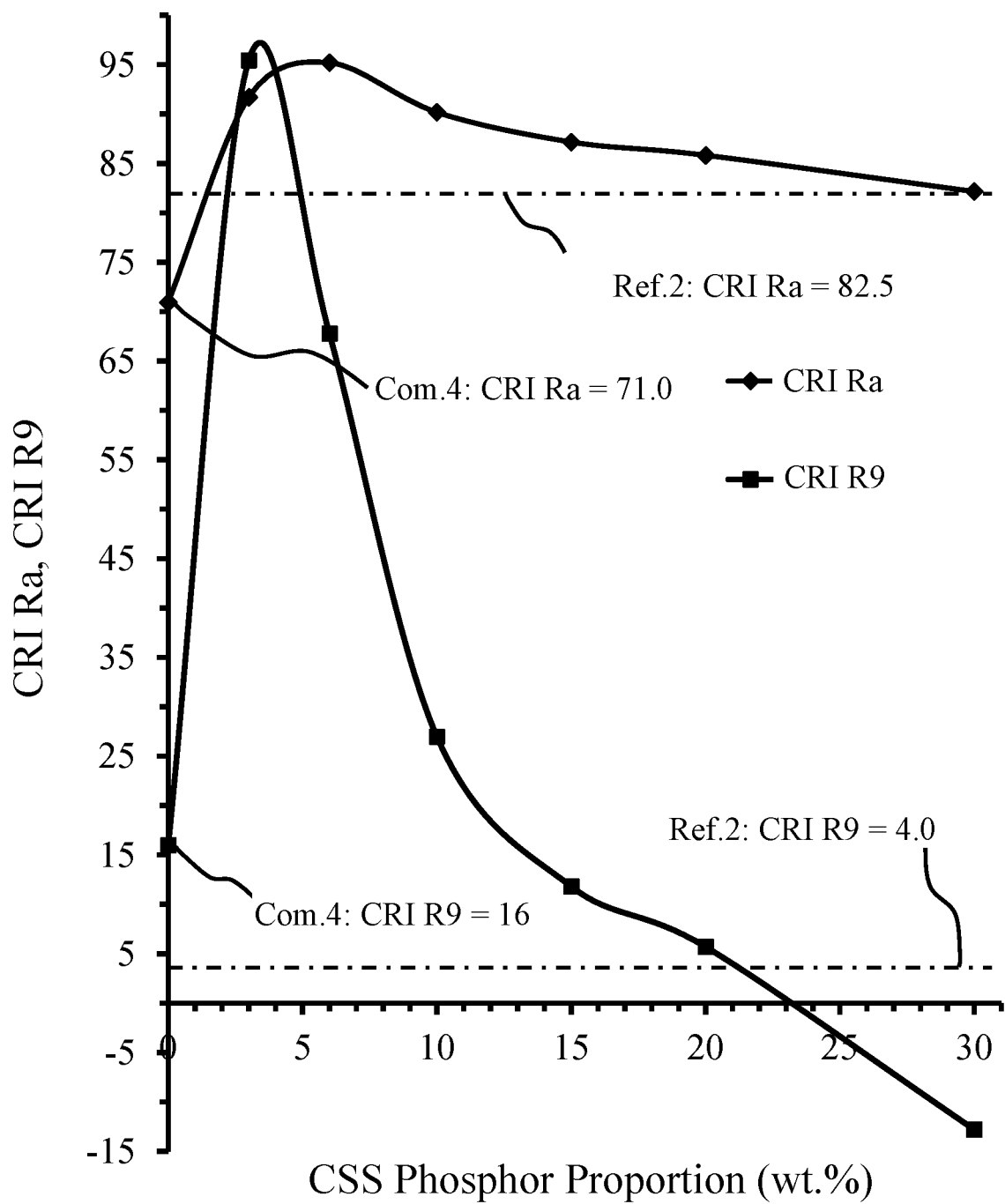
FIG. 8 shows measured General Color Rendering Index (CRI Ra) and CRI R9 versus CSS phosphor proportion (wt. %) of total narrow-band red phosphor for light emitting devices Dev.1-6 and Com.4.
Figure 9:
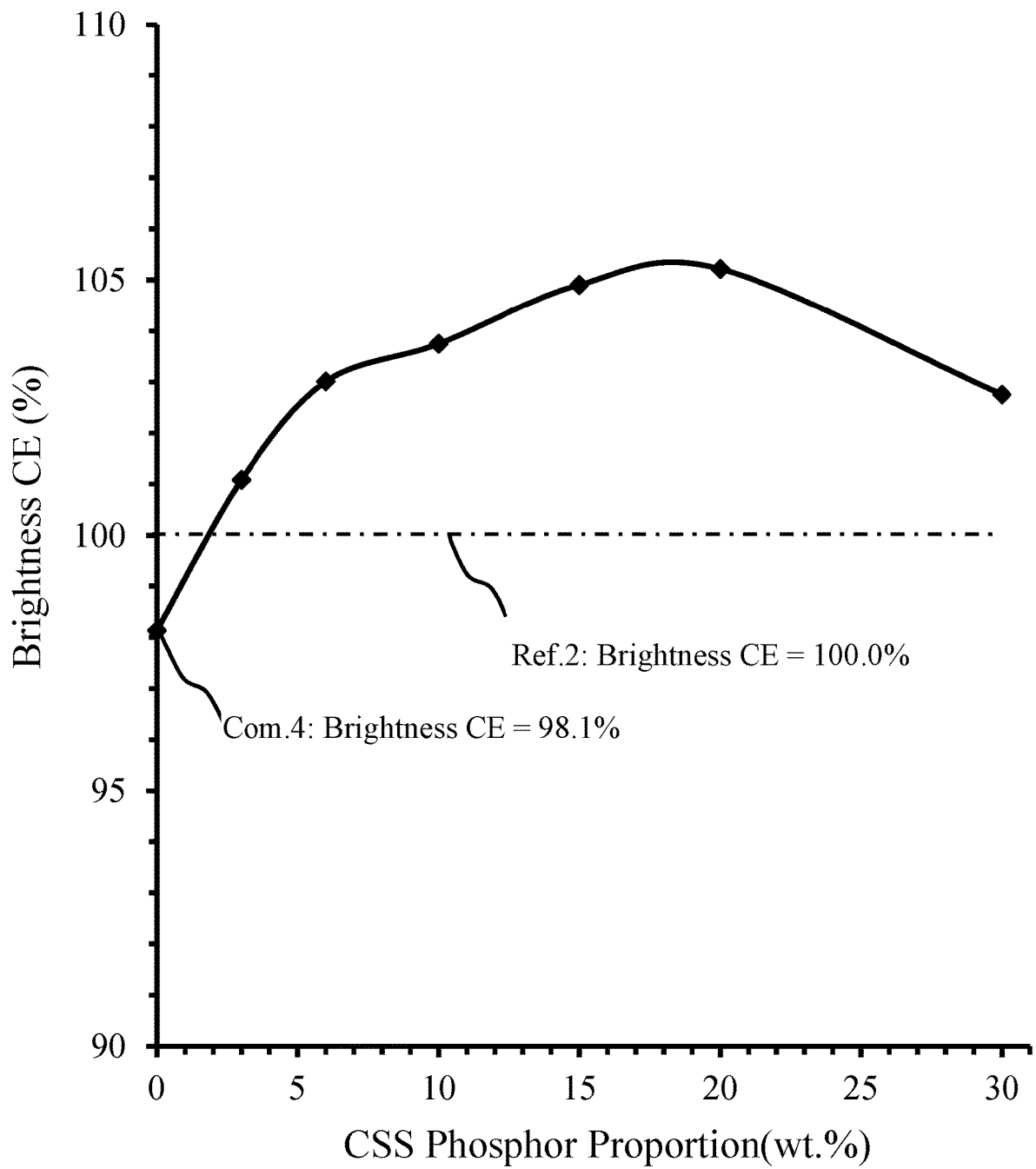
FIG. 9 shows measured brightness CE (%) versus CSS phosphor proportion (wt. %) of total narrow-band red phosphor for light emitting devices Dev.1-6 and Com.4.
Figure 10:
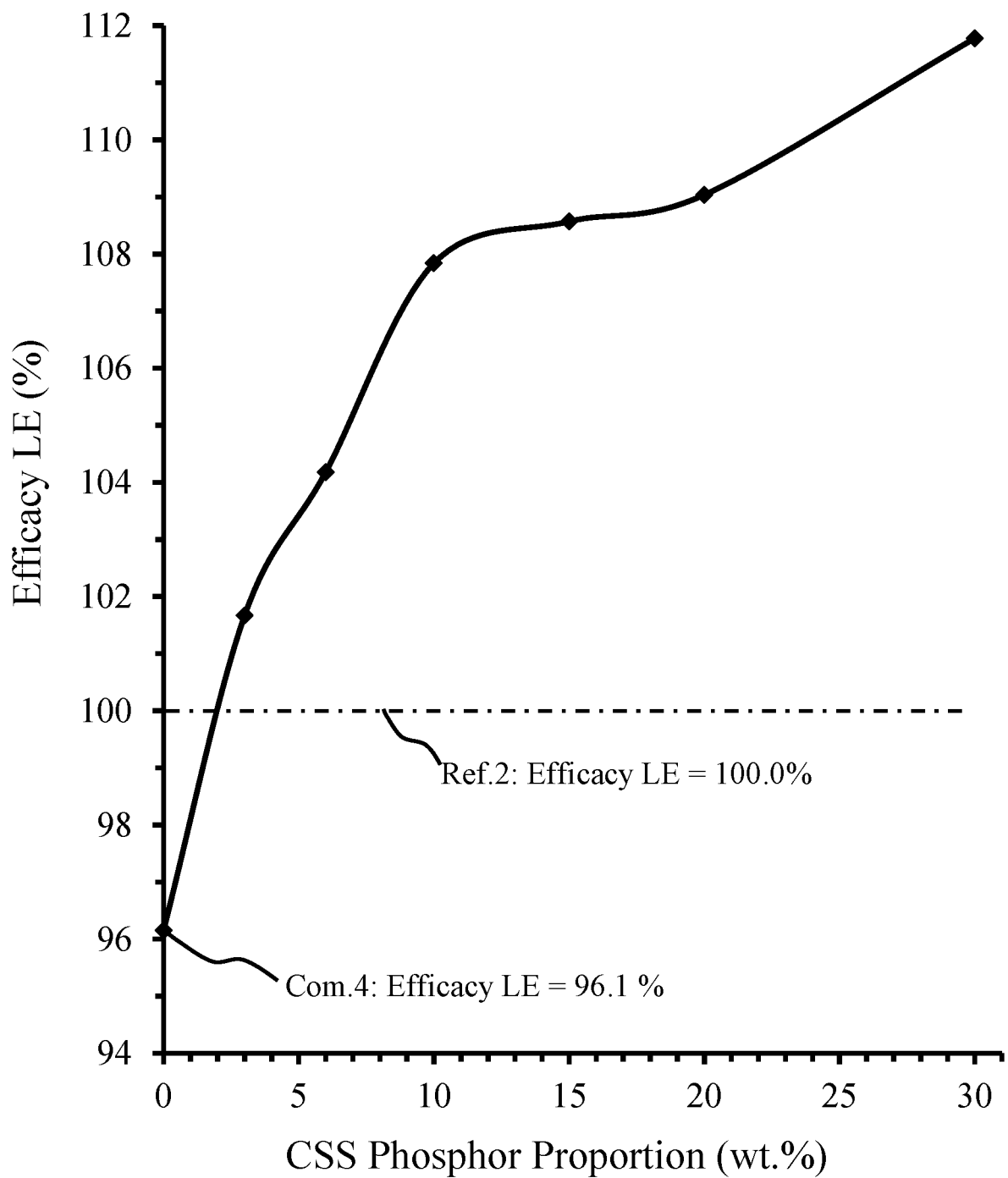
FIG. 10 shows measured luminous efficacy LE (%) versus CSS phosphor proportion (wt. %) of total narrow-band red phosphor for light emitting devices Dev.1-6 and Com.4.

FIGS. 8-10 show measured test data versus CSS phosphor proportion (wt. %) of total narrow-band red phosphor content (%) for light emitting devices Dev.1-6 and illustrate the effect of CSS phosphor proportion (wt. %) on various optical parameters. Each of these figures also includes data for comparative device Com.4 (100 wt. % KSF, 0 wt. % CSS) and indicates the performance of reference device Ref.2 (CASN628).

FIG. 8 shows measured general Color Rendering Index CRI Ra and CRI R9 versus CSS phosphor proportion (wt. %) of total narrow-band red phosphor content for light emitting devices Dev.1-6 and comparative device Com.4 (0 wt. % CSS). As can be seen in FIG. 8, CRI Ra increases rapidly with increasing CSS phosphor proportion, reaches a maximum value (CRI Ra~95) for devices with a CSS phosphor proportion in a range ~2 wt. % to ~6 wt. % and then decreases generally exponentially. Compared with the reference device Ref 2, devices having a CSS proportion in a range ~2 wt. % to ~30 wt. % have a higher CRI Ra value (i.e. CRI Ra>82.5). CRI R9 increases rapidly with increasing CSS phosphor proportion and reaches a maximum value (CRI R9~96) for devices with a CSS phosphor proportion in a range ~3 wt. % to ~4 wt. % before decreasing rapidly. Compared with the reference device, Ref.2, devices having a CSS proportion in a range 0 wt. % to ~21 wt. % have a higher CRI R9 value (i.e. CRI R9>4). Moreover, compared with the comparative device Com.4 comprising a single narrow-band phosphor, devices having a CSS proportion in a range of >0 wt. % to ~6 wt. % have a higher CRI Ra value (i.e. CRI Ra>71.0), while devices having a CSS proportion in a range of >0 wt. % to ~13 wt. % have a higher CRI R9 value (i.e. CRI R9>16).

FIG. 9 shows measured brightness CE (%) versus CSS phosphor proportion (wt. %) of total narrow-band red phosphor content for devices Dev.1-6 and comparative device Com.4. As can be seen in FIG. 9, brightness CE increases slowly with increasing CSS phosphor proportion, reaches a maximum value (CE~105%) for devices with a CSS phosphor proportion in a range ~16 wt. % to ~21 wt. %, and then decreases slowly. Compared with the reference device Ref 2, devices having a CSS proportion in a range ~2 wt. % to 30+wt. % have a higher brightness CE value (i.e. CE>100%). Moreover, compared with the comparative device Com.4, devices having a CSS proportion in a range of >0 wt. % to 30+wt. % have a higher brightness CE value (i.e. CE>98.1%).

FIG. 10 shows measured luminous efficacy LE (%) versus CSS phosphor proportion (wt. %) of total narrow-band red phosphor content for devices Dev.1-6 and comparative device Com.4. As can be seen in FIG. 10, luminous efficacy LE increases rapidly with increasing CSS phosphor proportion and reaches a plateau (LE~109%) for devices with a CSS phosphor proportion in a range ~12 wt. % to ~20 wt. % before increasing again. Compared with the reference device Ref.2, light emitting devices having a CSS proportion in a range ~2 wt. % to 30+wt. % have a higher luminous efficacy LE value (i.e. LE>100.0%). Moreover, compared with the comparative device Com.4, devices having a CSS proportion in a range of >0 wt. % to 30+wt. % have a higher luminous efficacy LE value (i.e. LE>96.1%).

Figure 11:
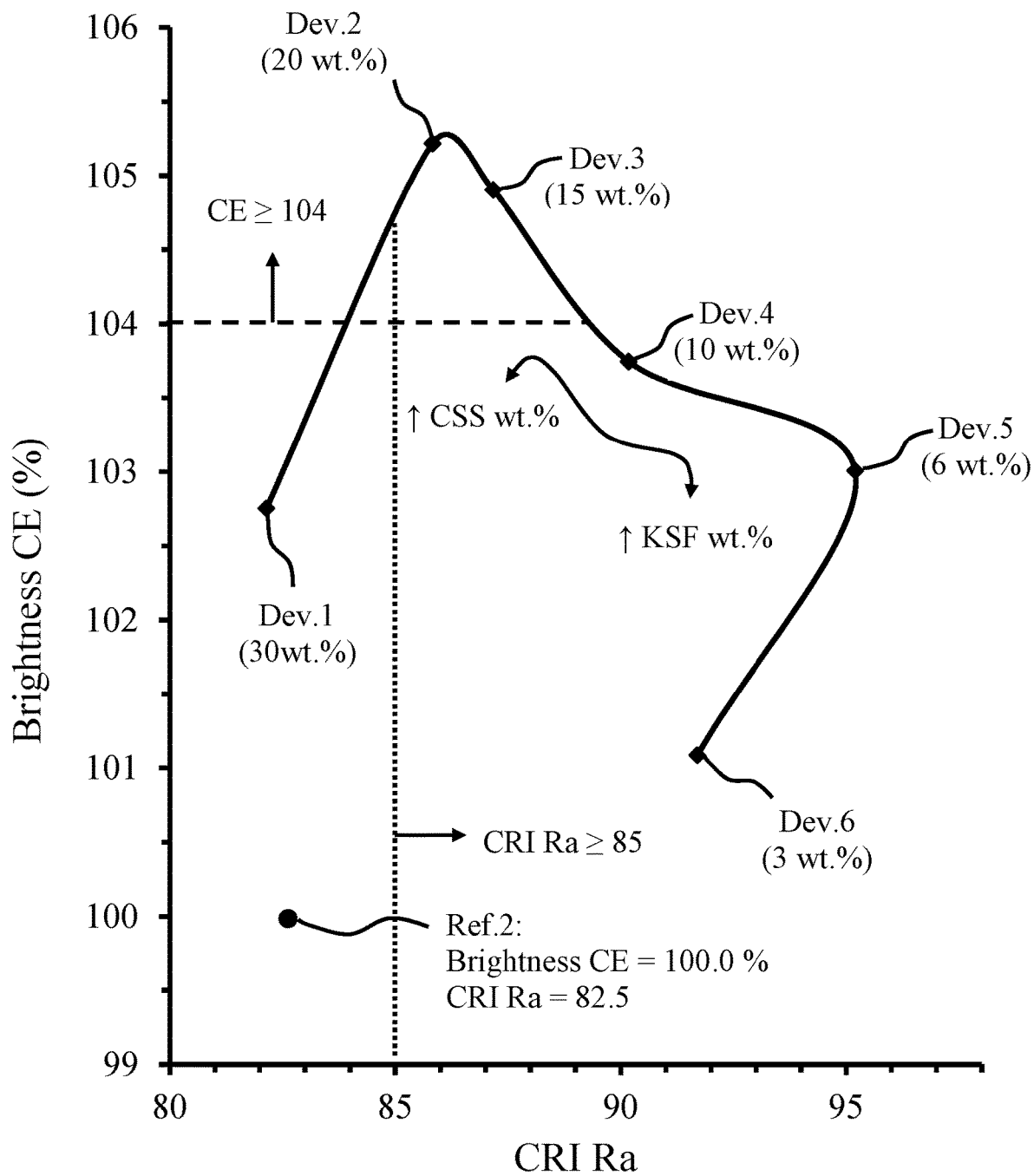
FIG. 11 shows measured brightness CE (%) versus CRI Ra for light emitting devices Dev. 1-6.

FIG. 11 shows measured brightness CE (%) versus CRI Ra for devices Dev.1-6 and illustrates the effect of CSS phosphor proportion (wt. %) of total narrow-band red phosphor content on CE and CRI Ra. For comparison, FIG. 11 indicates CE/CRI Ra values for the reference light emitting device Ref.2. The plot indicates how device CSS/KSF phosphor proportion (wt. %) can be selected to optimize brightness and CRI Ra. For example, where it is required that the light emitting device has a minimum CRI Ra of 85 (indicated by vertical dotted line in FIG. 11), then the CSS phosphor proportion can be in a range 3 wt. % to ~22 wt. % and such a device will have a maximum CRI Ra of 95 for a CSS phosphor proportion of ~6 wt. % and a corresponding brightness CE of 103%. Conversely, where it is required that the light emitting device has a minimum brightness CE of for example 104% (indicated by horizontal dashed line in FIG. 11), then the CSS phosphor proportion can be in a range 11 wt. % to ~25 wt. % and such a device will have a maximum brightness CE of 105.3% for a CSS phosphor proportion of ~20 wt. % and a corresponding CRI Ra~86.5. Finally, where it is required that the light emitting device has a minimum CRI Ra of 85 and a minimum brightness CE of 104%, then the CSS phosphor proportion can be in a range 11 wt. % to ~22 wt. %.

Figure 12:
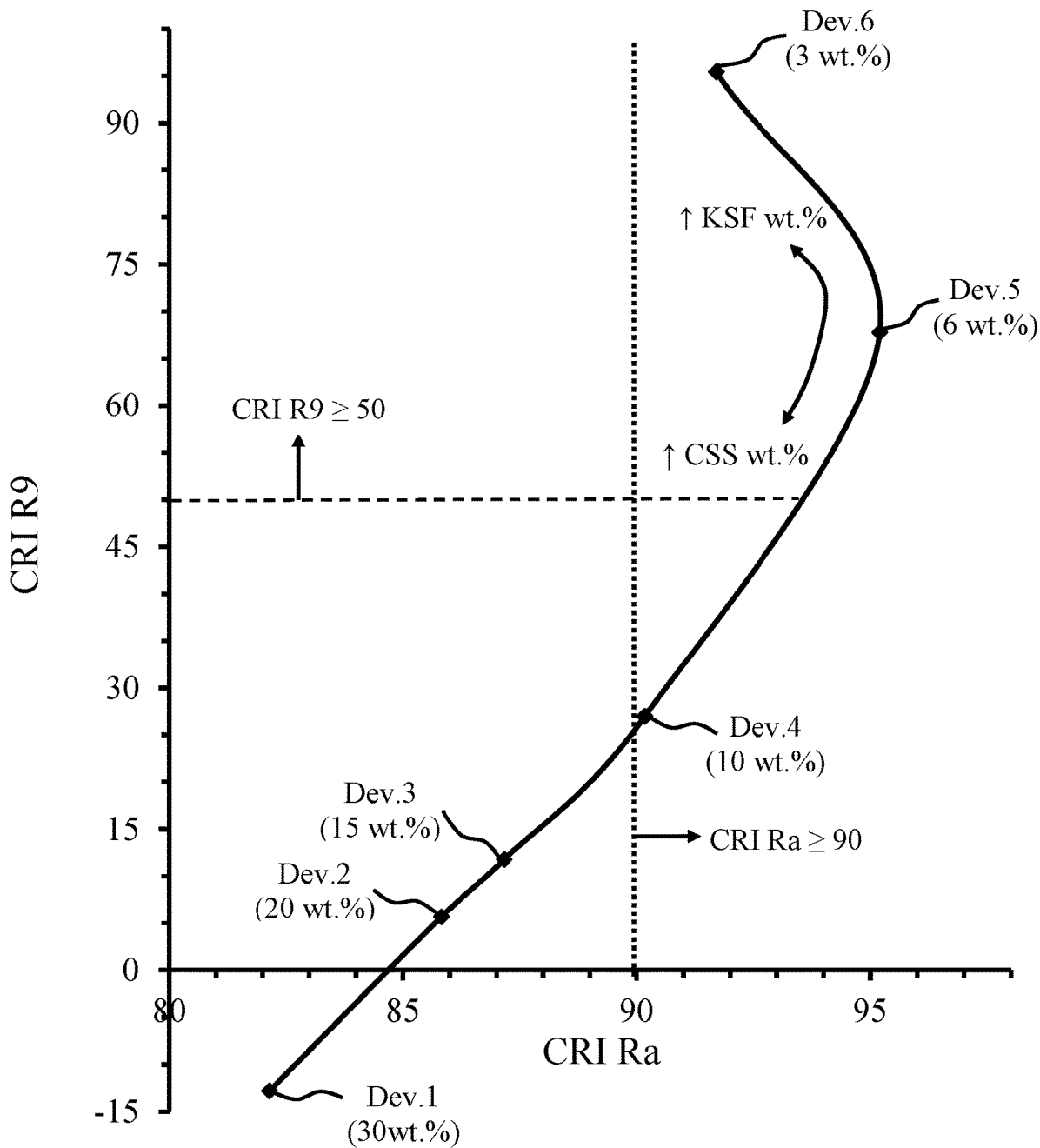
FIG. 12 shows measured CRI R9 versus CRI Ra for light emitting devices Dev.1-6.

Depending on application, a similar process can be used to optimize device phosphor composition using other optical parameters. For example, FIG. 12 shows measured CRI R9 versus CRI Ra for devices Dev.1-6 and illustrates the effect of CSS phosphor proportion (wt. %) of total narrow-band red phosphor content on CRI R9 and CRI Ra. The plot indicates how device CSS/KSF phosphor proportion (wt. %) can be selected to optimize CRI R9 and CRI Ra. For example, where it is required that the light emitting device has a minimum CRI R9 of 50 (indicated by horizontal dashed line in FIG. 12), then the CSS phosphor proportion can be in a range 3 wt. % to ~8 wt. % and such devices will have a corresponding range of CRI Ra of 92 to 95 and a maximum CRI R9 of 96 for a CSS phosphor proportion of 3 wt. % and a corresponding CRI Ra of 92. Conversely, where it is required that the light emitting device has a minimum CRI Ra of for example 90 (indicated by vertical dotted line in FIG. 12), then the CSS phosphor proportion can be in a range 3 wt. % to ~10 wt. % and such devices will have a corresponding range of CRI R9 of 25 to 96 and a maximum CRI Ra of 95 for a CSS phosphor proportion of 6 wt. %.

Table 6 tabulates simulated (calculated) optical performance data for 2700K light emitting devices comprising GAL535+narrow-band red phosphor mixture CSS615 and KSF for varying CSS phosphor proportion (wt. %) of total narrow-band red phosphor content. For comparison, the table also includes measured data values for Dev. 1 to 6 and Com.4 (0 wt. % CSS615).

TABLE 6

Simulated optical performance data for 2700 K light emitting devices GAL535 + narrow-band red phosphor mixture CSS615 and KSF (LED dominant wavelength 452.4 nm). Values in parenthesis and bold are measured data for Dev. 1-6 and Com. 4 (0 wt. % CSS615).

| CSS | Brightness | Efficacy | | | CCT | CRI | |
|---|---|---|---|---|---|---|---|
| (wt. %) | CE (%) | LE | CIE x | CIE y | (K) | Ra | R9 |
| 30.0 | 102.0 (102.8) | 362.4 (370.9) | 0.4597 | 0.4124 | 2716 | 82.4 (82.2) | −11.6 (−12.8) |
| 23.3 | 101.8 | 359.9 | 0.4601 | 0.4128 | 2713 | 84.8 | 0.1 |
| 20.0 | 101.7 (105.2) | 358.7 (361.8) | 0.4603 | 0.4130 | 2712 | 86.0 (85.8) | 5.7 (5.7) |
| 15.0 | 101.5 (104.9) | 357.4 (360.2) | 0.4605 | 0.4132 | 2711 | 87.2 (87.2) | 11.8 (11.8) |
| 10.0 | 101.3 (103.7) | 354.2 (357.8) | 0.4611 | 0.4138 | 2708 | 90.3 (90.2) | 27.0 (27.0) |
| 9.2 | 101.1 | 352.3 | 0.4614 | 0.4142 | 2706 | 92.0 | 35.8 |
| 7.8 | 100.8 | 349.2 | 0.4619 | 0.4147 | 2703 | 94.3 | 50.1 |
| 6.8 | 100.6 | 347.1 | 0.4623 | 0.4151 | 2701 | 95.1 | 60.0 |
| 6.0 | 100.5 (103.0) | 345.4 (345.6) | 0.4626 | 0.4154 | 2699 | 94.7 (95.2) | 67.8 (67.8) |
| 3.9 | 100.0 | 340.4 | 0.4635 | 0.4164 | 2694 | 93.4 | 90.2 |
| 3.1 | 99.8 | 338.6 | 0.4638 | 0.4168 | 2692 | 92.0 | 96.2 |
| 3.0 | 99.8 (101.1) | 338.4 (337.3) | 0.4639 | 0.4168 | 2692 | 91.9 (91.7) | 96.3 (95.5) |
| 2.7 | 99.6 | 336.8 | 0.4642 | 0.4171 | 2690 | 90.0 | 91.3 |
| 1.6 | 99.0 | 330.0 | 0.4655 | 0.4185 | 2683 | 82.3 | 61.0 |
| 1.3 | 98.8 | 328.2 | 0.4659 | 0.4189 | 2681 | 80.1 | 52.5 |
| 0.0 | 98.1 (98.1) | 320.8 (319.0) | 0.4674 | 0.4205 | 2672 | 71.7 (71.0) | 18.8 (16.0) |

Figure 13:
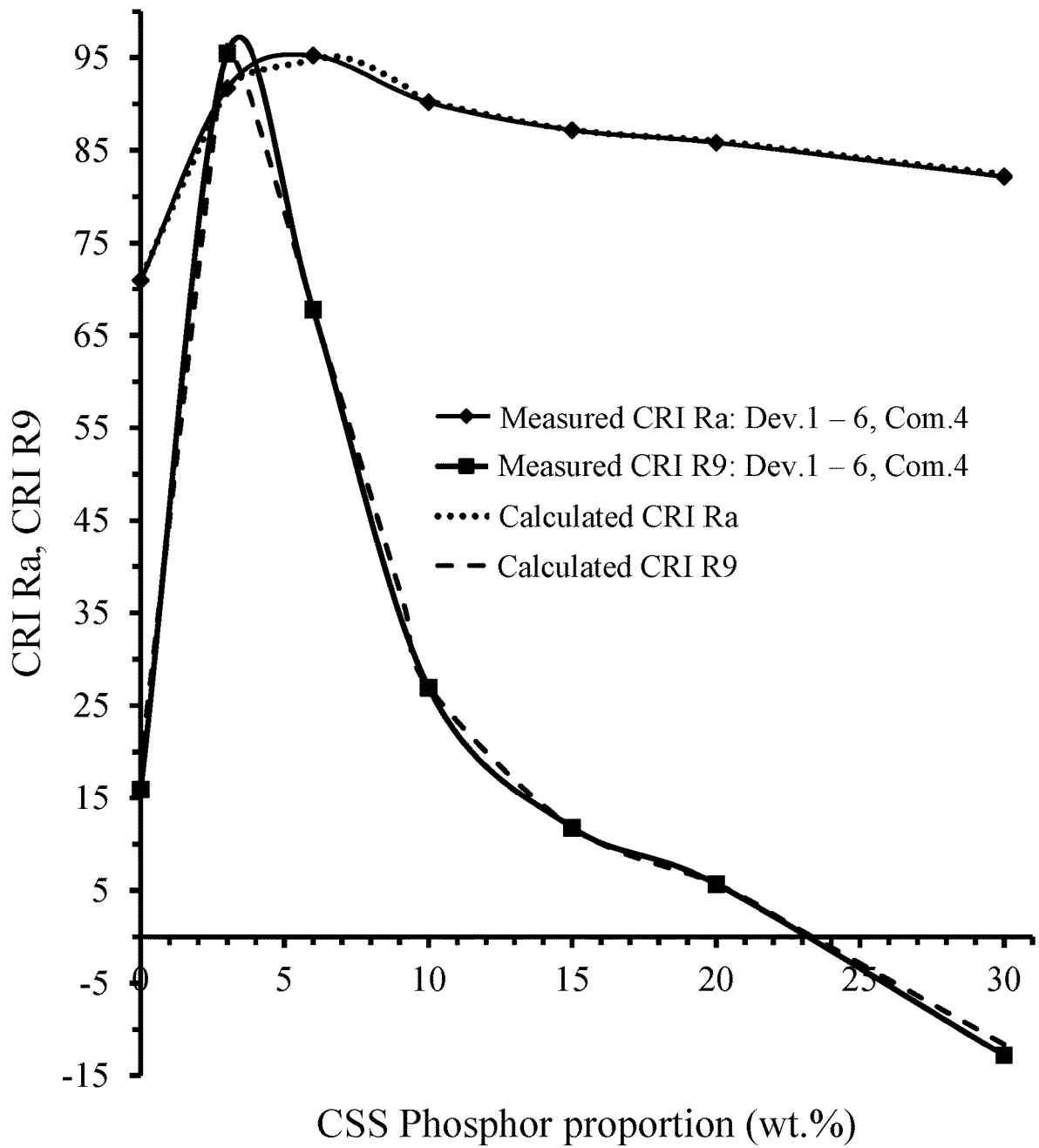
FIG. 13 shows calculated and measured CRI Ra and CRI R9 versus CSS phosphor proportion (wt. %) of total narrow-band red phosphor for light emitting devices Dev.1-6 and Com.4.
Figure 14:
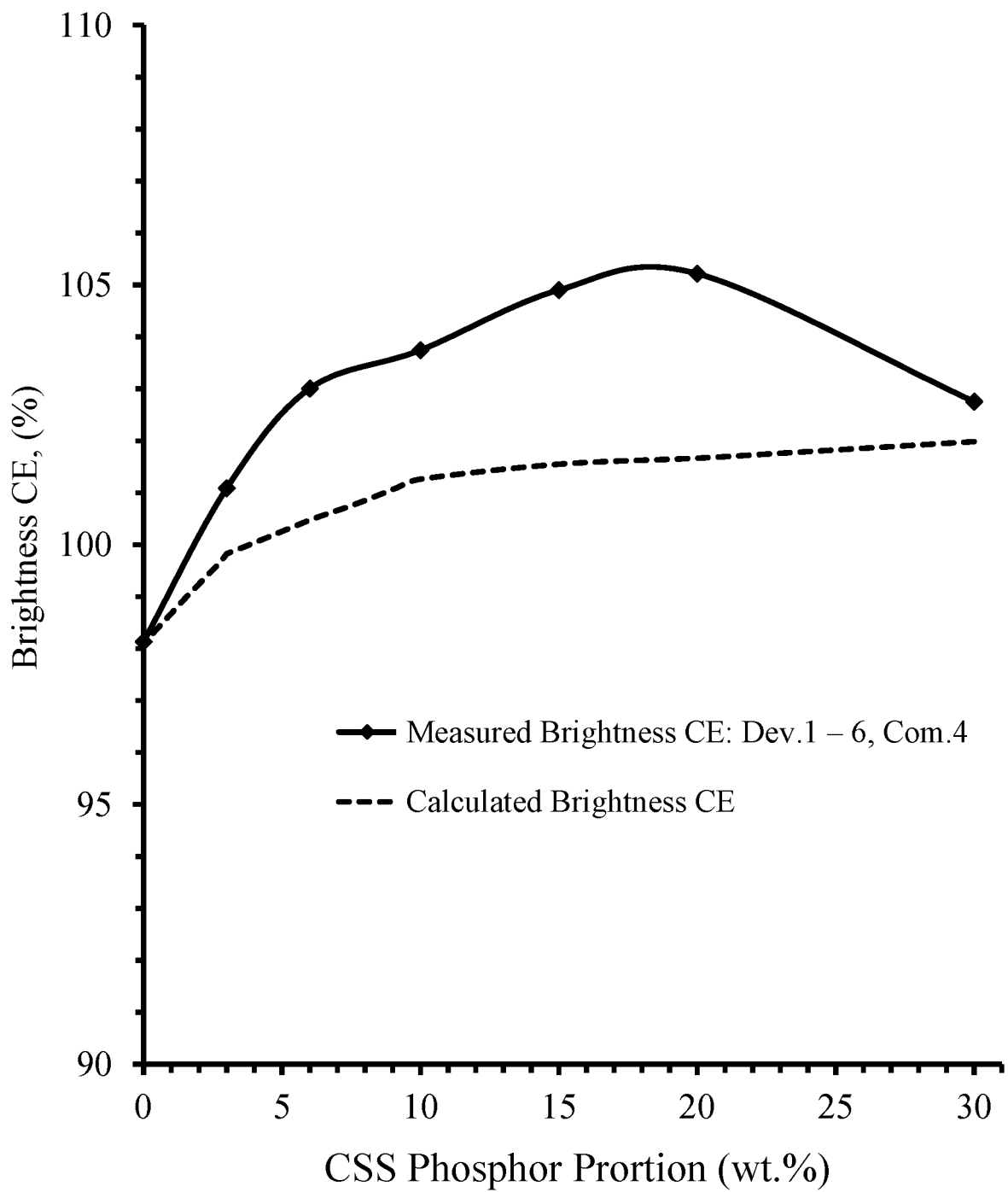
FIG. 14 shows calculated and measured brightness CE (%) versus CSS phosphor proportion (wt. %) of total narrow-band red phosphor for light emitting devices Dev.1-6 and Com.4.
Figure 15:
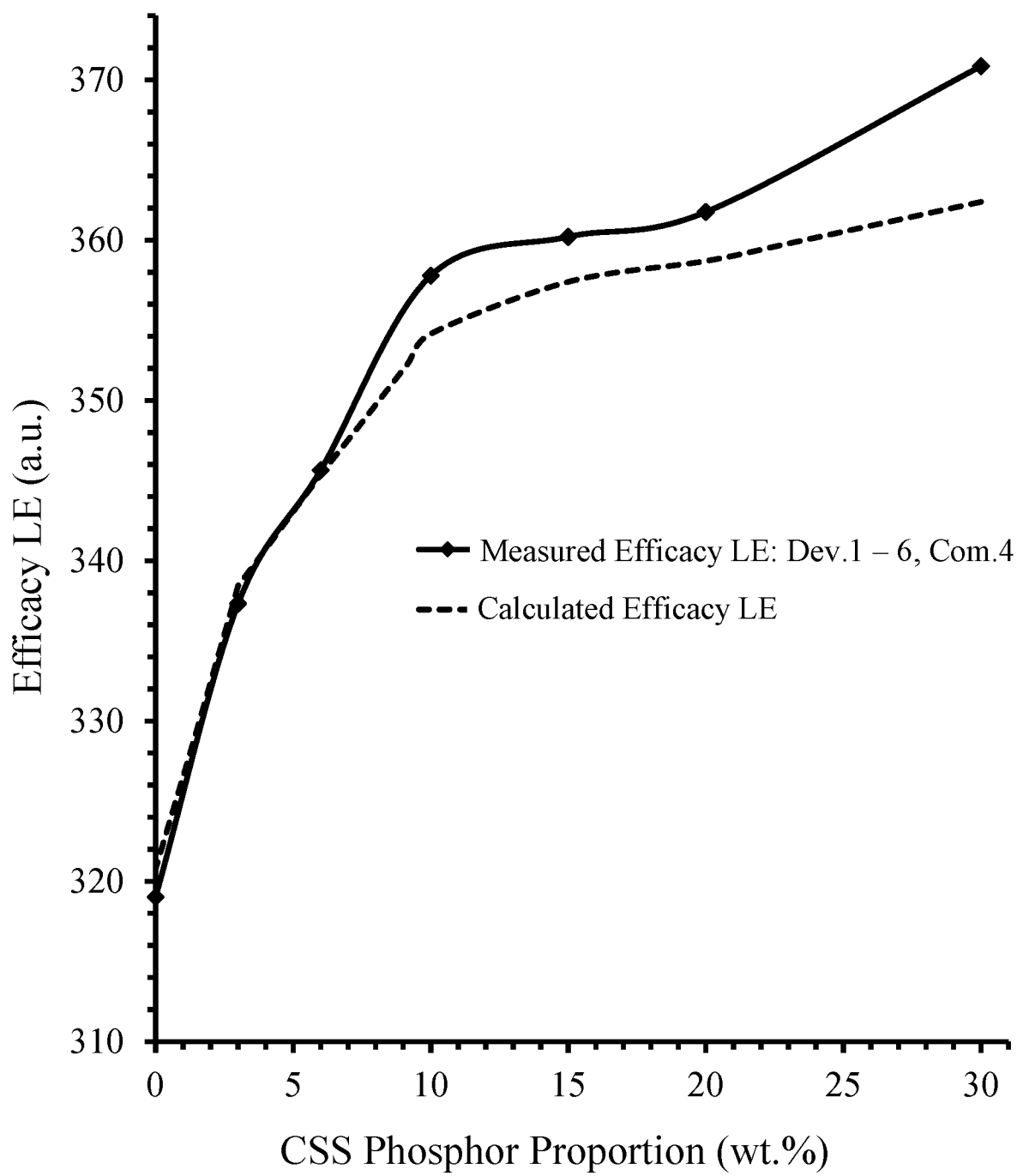
FIG. 15 shows calculated and measured luminous efficacy LE (a.u.) versus CSS phosphor proportion (wt. %) of total narrow-band red phosphor for light emitting devices Dev.1-6 and Com.4.

FIGS. 13-15 show calculated data: CRI Ra; CRI Ra; brightness CE (%); and luminous efficacy LE (a.u.) versus CSS phosphor proportion (wt. %) of total narrow-band red phosphor content (%). For comparison, the figures include measured data for light emitting devices Dev.1-6 and comparative device Com.4. (0 wt. % CSS). As can be seen from these figures, the calculated data indicate the general trend and, with the exception of brightness CE, there is a high correlation between the calculated and measured values.

The data in Tables 5 and 6 indicates that compared to Ref 2 (2700K, CRI Ra 80: GAL535+CASN628) the brightness of light emitting devices in accordance with the invention comprising GAL535+a mixture of narrow-band red phosphors (CSS615+KSF) will be:

5% brighter for CRI Ra>85, CRI R9>0 (~20 wt. % CS S);
3% brighter for CRI Ra>90, CRI R9>50 (~8 wt. % CSS);
3% brighter for CRI Ra>95, CRI R9>50 (~7 wt. % CSS); and
1% brighter for CRI Ra>90, CRI R9>90 (~3 wt. % CSS).

Moreover, the inventors have discovered that compared with a 2700K, CRI Ra 90 reference device (GAL535+CAS628+CASN 650) the brightness increase can be 20% or higher (i.e. an increase of about 17% on top of each of the above figures).

Table 7 tabulates CSS phosphor proportion (wt. %) ranges for achieving various optical performance for 2700K light emitting devices comprising GAL535+a narrow-band red phosphor mixture CSS615 and KSF. The data of Table 7 is derived from the calculated and measured CRI Ra and CRIR9 data of FIG. 13.

TABLE 7

2700K light emitting device: GAL535 + narrow-band red phosphor mixture CSS615 and KSF

| Optical Performance | Proportion of CSS615 of total red phosphor content (wt. %) |
|---|---|
| CRI Ra ≥ 85 | ~2 wt. % to ~22 wt. % |
| CRI Ra ≥ 90 | ~3 wt. % to ~10 wt. % |
| CRI Ra ≥ 95 | ~4 wt. % to ~6 wt. % |
| CRI R9 ≥ 50 | ~1 wt. % to ~8wt. % |
| CRI Ra ≥ 85 & CRI R9 ≥ 50 | ~2 wt. % to ~8 wt. % |

TABLE 7-continued 2700K light emitting device: GAL535 + narrow-band red phosphor mixture CSS615 and KSF

| Optical Performance | Proportion of CSS615 of total red phosphor content (wt. %) |
|---|---|
| CRI Ra ≥ 90 & CRI R9 ≥ 50 | ~3 wt. % to ~8 wt. % |
| CRI Ra ≥ 95 & CRI R9 ≥ 50 | ~4 wt. % to ~6 wt. % |

Table 8 tabulates device phosphor composition for 2700K (nominal) light emitting devices denoted Dev.7-13 in accordance with an embodiment of the invention that comprise a mixture of two narrow-band red phosphors. For comparison, Table 8 includes details of a reference light emitting device (2700K, CRI Ra 80), denoted Ref 3, and a 2700K comparative light emitting device, denoted Com.5, comprising a single narrow-band red phosphor.

As can be seen from the table, in terms of phosphor composition, Dev.7 comprises a green aluminate phosphor (GAL540, $\lambda_{pe}$=540 nm)+a narrow-band red phosphor mixture (30 wt. % CSS615 & 70 wt. % KSF); Dev.8 comprises GAL540+a narrow-band red phosphor mixture (20 wt. % CSS615 & 80 wt. % KSF); Dev.9 comprises GAL540+ narrow-band red phosphor mixture (15 wt. % CSS615 & 85 wt. % KSF); Dev.10 comprises GAL540+narrow-band red phosphor mixture (10 wt. % CSS615 & 90 wt. % KSF); Dev.11 comprises GAL540+narrow-band red phosphor mixture (7.5 wt. % CSS615 & 92.5 wt. % KSF); Dev.12 comprises GAL540+narrow-band red phosphor mixture (5 wt. % CSS615 & 95 wt. % KSF); Dev.13 comprises GAL540+narrow-band red phosphor mixture (2.5 wt. % CSS615 & 97.5 wt. % KSF); Com.5 comprises GAL540+KSF narrow-band red phosphor; and Ref 3, comprises GAL540+red nitride phosphor

TABLE 8

2700 K light emitting device phosphor composition

| | Red phosphor composition (wt. %) | | | | Green | Total phosphor per 100 g |
|---|---|---|---|---|---|---|
| Device | CASN628 | CSS615 | KSF | Red | (GAL540) | silicone (g) |
| Ref. 3 | 100.0 | — | — | 8.0 | 92.0 | 60 |
| Dev. 7 | — | 30.0 | 70.0 | 29.8 | 71.2 | 85 |
| Dev. 8 | — | 20.0 | 80.0 | 39.8 | 60.2 | 95 |
| Dev. 9 | — | 15.0 | 85.0 | 46.0 | 54.0 | 98 |
| Dev. 10 | — | 10.0 | 90.0 | 52.5 | 47.5 | 100 |
| Dev. 11 | — | 7.5 | 92.5 | 59.0 | 41.0 | 110 |
| Dev. 12 | — | 5.0 | 95.0 | 65.8 | 34.2 | 120 |
| Dev. 13 | — | 2.5 | 97.5 | 70.0 | 30.0 | 130 |
| Com. 5 | — | — | 100.0 | 82.0 | 18.0 | 150 |

Table 9 tabulates measured phosphor cavity test data for light emitting devices Dev.7-13, comparative device Com.5 and reference device Ref.3 and illustrates the effect of CSS phosphor proportion (wt. %) of the total narrow-band red phosphor content on device optical performance.

TABLE 9

Measured test data for 5630 cavity test (LED dominant wavelength 452.4 nm)

| Device | Brightness CE | Brightness CE (%) | Efficacy LE | Efficacy LE (%) | CIE x | CIE y | CCT (K) | CRI Ra | R9 |
|---|---|---|---|---|---|---|---|---|---|
| Ref. 3 | 242.4 | 100.0 | 330.7 | 100.0 | 0.4620 | 0.4145 | 2701 | 82.5 | 4.4 |
| Dev. 7 | 263.2 | 108.6 | 361.7 | 109.4 | 0.4622 | 0.4147 | 2700 | 81.1 | −14.3 |

TABLE 9-continued

Measured test data for 5630 cavity test (LED dominant wavelength 452.4 nm)

| Device | Brightness CE | Brightness CE (%) | Efficacy LE | Efficacy LE (%) | CIE x | CIE y | CCT (K) | CRI Ra | CRI R9 |
|---|---|---|---|---|---|---|---|---|---|
| Dev. 8 | 263.1 | 108.5 | 360.2 | 108.9 | 0.4624 | 0.4152 | 2700 | 83.7 | −2.2 |
| Dev. 9 | 262.5 | 108.3 | 360.2 | 108.9 | 0.4627 | 0.4158 | 2701 | 85.8 | 8.1 |
| Dev. 10 | 257.9 | 106.4 | 356.1 | 107.7 | 0.4618 | 0.4140 | 2698 | 89.9 | 29.2 |
| Dev. 11 | 255.8 | 105.5 | 354.2 | 107.1 | 0.4622 | 0.4147 | 2700 | 92.4 | 43.6 |
| Dev. 12 | 251.7 | 103.8 | 350.8 | 106.1 | 0.4625 | 0.4154 | 2701 | 95.0 | 62.8 |
| Dev. 13 | 246.0 | 101.5 | 341.7 | 103.3 | 0.4608 | 0.4123 | 2699 | 92.5 | 96.5 |
| Com. 5 | 244.2 | 100.7 | 324.4 | 98.1 | 0.4623 | 0.4153 | 2702 | 73.9 | 24.9 |

FIGS. 16-19 show measured test data versus CSS phosphor proportion (wt. %) of total narrow-band red phosphor content (%) for light emitting devices Dev.7-13 and illustrate the effect of CSS phosphor proportion (wt. %) on various optical parameters. Each of these figures also includes data for comparative device Com.5 (0 wt. % CSS) and indicates the performance of reference device Ref 3 (CASN628).

Figure 16:
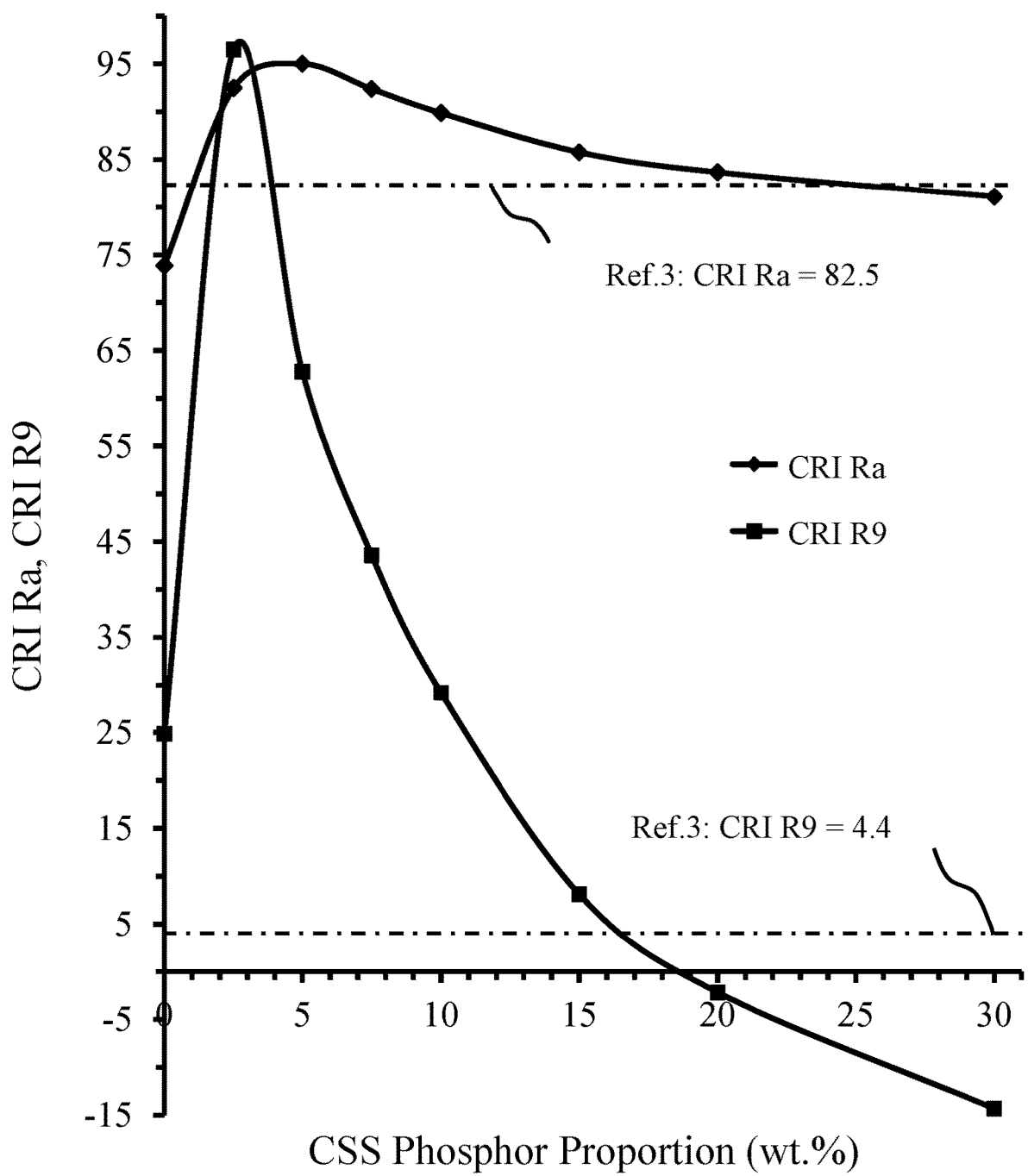
FIG. 16 shows measured CRI Ra and CRI R9 versus CSS phosphor proportion (wt. %) of total narrow-band red phosphor for light emitting devices Dev.7-13–green aluminate phosphor (GAL540)+narrow-band red phosphor mixture comprising varying wt. % CSS615 and KSF and Com.5–GAL540+narrow-band red phosphor (CSS615)

FIG. 16 shows measured general Color Rendering Index CRI Ra and CRI R9 versus CSS phosphor proportion (wt. %) of total narrow-band red phosphor content for light emitting devices Dev.1-6 and comparative device Com.5. As can be seen in FIG. 16, CRI Ra increases rapidly with increasing CSS phosphor proportion, reaches a maximum value (CRI Ra~95) for devices with a CSS phosphor proportion in a range ~3 wt. % to ~7 wt. % and then decreases gradually. Compared with the reference device Ref.3, devices having a CSS proportion in a range ~2 wt. % to ~24 wt. % have a higher CRI Ra value (i.e. CRI Ra>82.5). CRI R9 increases rapidly with increasing CSS phosphor proportion and reaches a maximum value (CRI R9~97) for devices with a CSS phosphor proportion in a range ~3 wt. % to ~4 wt. % before decreasing rapidly. Compared with the reference device, Ref.3, devices having a CSS proportion in a range 0 wt. % to ~16 wt. % have a higher CRI R9 value (i.e. CRI R9>4.4).

Figure 17:
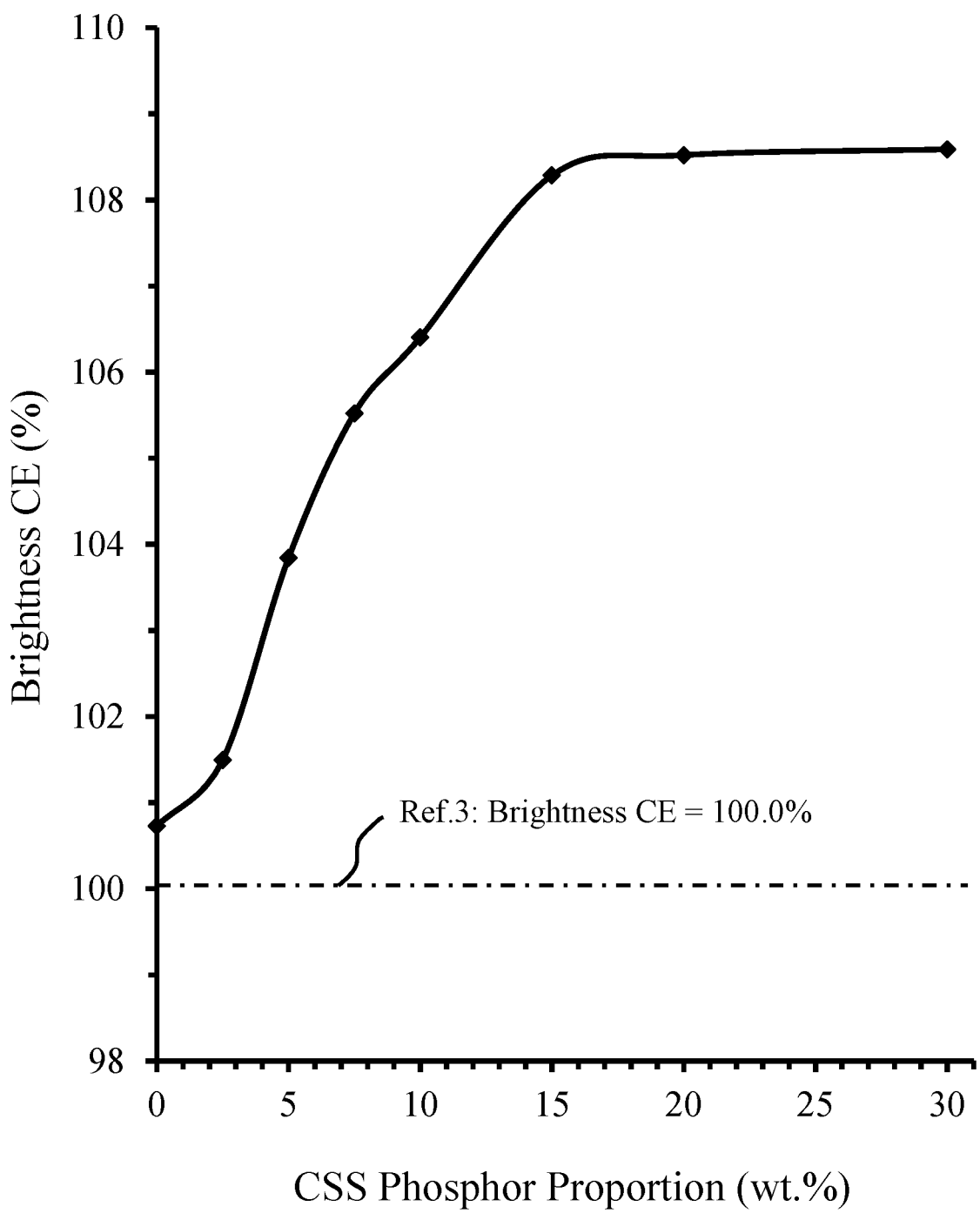
FIG. 17 shows measured brightness CE (%) versus CSS phosphor proportion (wt. %) of total narrow-band red phosphor for light emitting devices Dev.7-13 and Com.5.

FIG. 17 shows measured brightness CE (%) versus CSS phosphor proportion (wt. %) of total narrow-band red phosphor content for devices Dev.7-13 and Com.5. As can be seen in FIG. 17, brightness CE increases with increasing CSS phosphor proportion and flattens out a maximum value (CE~108%) for light emitting devices having a CSS phosphor proportion greater than ~15 wt. %. Compared with the reference device Ref.3, light emitting devices having a CSS proportion in a range 0 wt. % to 30+wt. % have a higher brightness CE value (i.e. CE>100%).

Figure 18:
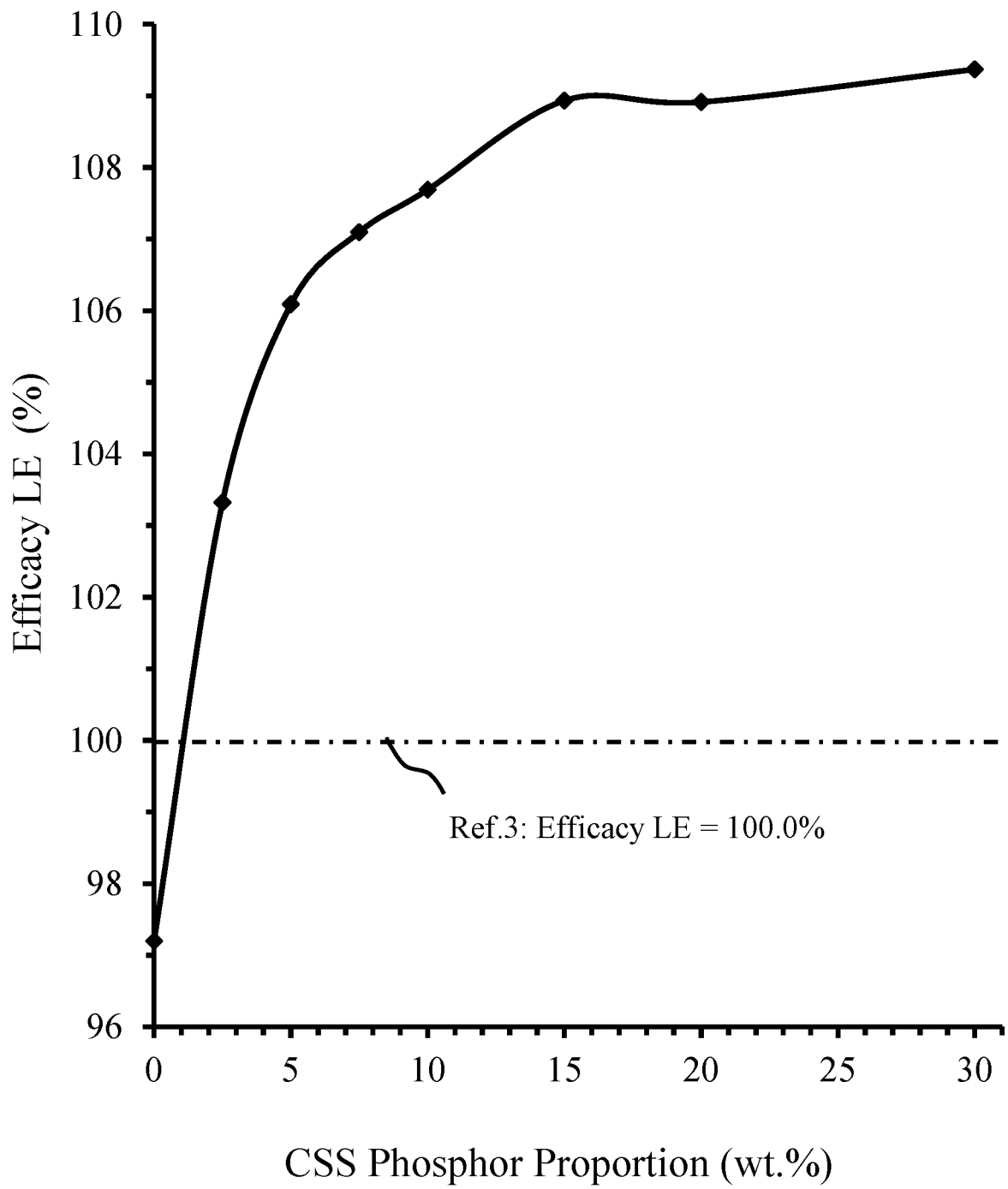
FIG. 18 shows measured luminous efficacy LE (%) versus CSS phosphor proportion (wt. %) of total narrow-band red phosphor for light emitting devices Dev.7-13 and Com.5.

FIG. 18 shows measured luminous efficacy LE (%) versus CSS phosphor proportion (wt. %) of total narrow-band red phosphor content for devices 7-13 and Com.5. As can be seen in FIG. 18, luminous efficacy LE increases with increasing CSS phosphor proportion and generally flattens out a maximum value (LE~109%) for light emitting devices with a CSS phosphor proportion greater than ~16 wt. %. Compared with the reference device Ref.3, light emitting devices having a CSS proportion in a range ~2 wt. % to 30+wt. % have a higher luminous efficacy LE value (i.e. LE>100.0%).

Figure 19:
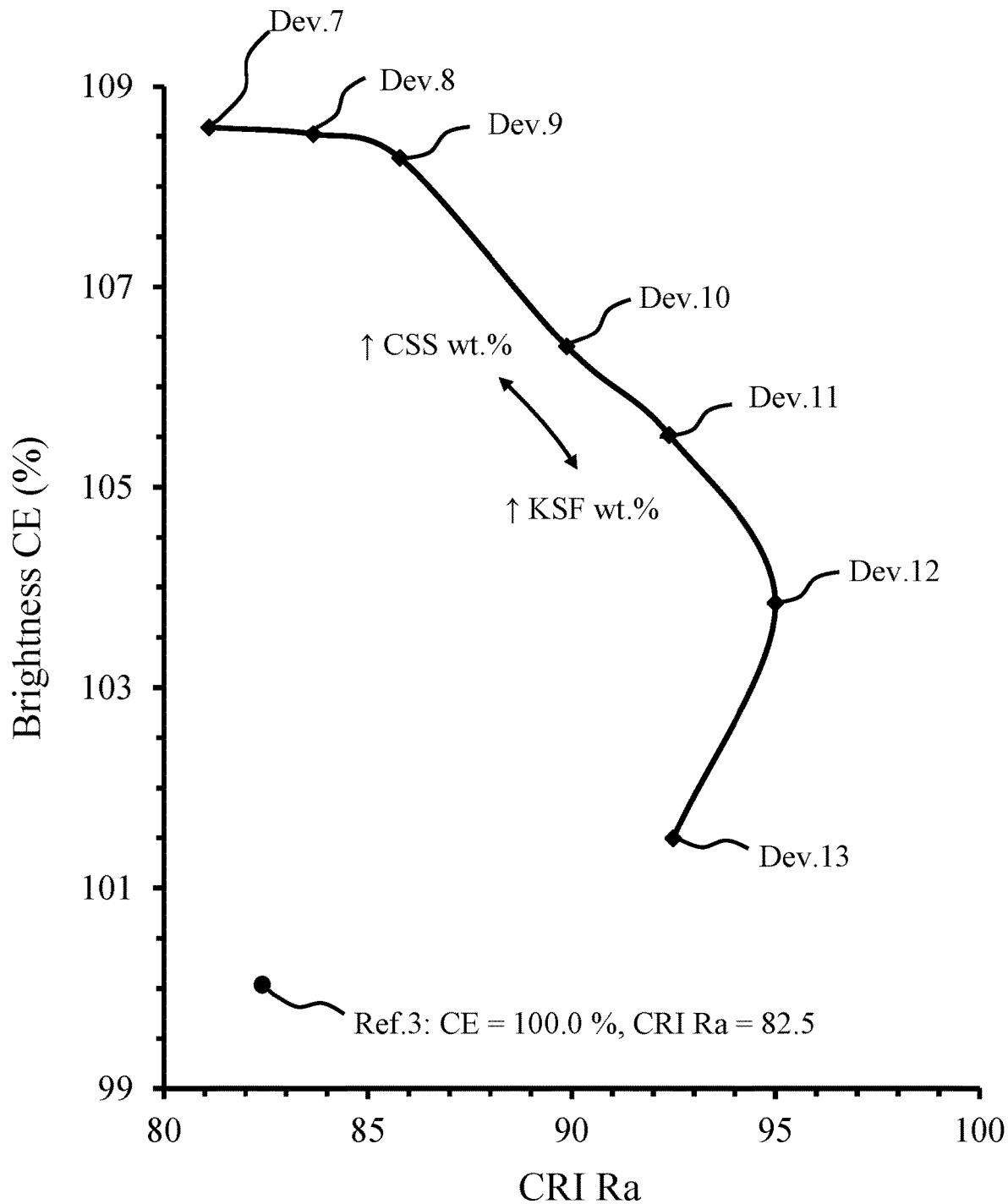
FIG. 19 shows measured brightness CE (%) versus CRI Ra for light emitting devices Dev.7-13.

FIG. 19 shows measured brightness CE (%) versus CRI Ra for devices Dev.7-13 and Com.5 illustrating the effect of CSS phosphor proportion (wt. %) of total narrow-band red phosphor content.

Table 10 tabulates simulated (calculated) optical performance data for 2700K light emitting devices comprising GAL540+narrow-band red phosphor mixture CSS615 and KSF for varying CSS phosphor proportion (wt. %) of total narrow-band red phosphor content. For comparison, the table also includes measured data values for Dev.7-13 and Com.5 (0 wt. % CSS615).

TABLE 10

Simulated optical performance data for 2700 K light emitting devices GAL540 + narrow-band red phosphor mixture CSS615 and KSF (LED dominant wavelength 452.4 nm). Values in parenthesis and bold are measured data for Dev. 7-10, 13 and Com. 5 (0 wt. % CSS615).

| CSS (wt. %) | Brightness CE (%) | Efficacy LE | CIE x | CIE y | CCT (K) | CRI Ra | CRI R9 |
|---|---|---|---|---|---|---|---|
| 30.0 | 109.2 (108.6) | 361.8 (361.7) | 0.4626 | 0.4150 | 2696 | 81.1 (81.1) | −14.5 (−14.3) |
| 20.0 | 108.7 (108.5) | 359.2 (360.2) | 0.4627 | 0.4152 | 2697 | 83.7 (83.7) | −2.3 (−2.2) |
| 15.0 | 108.2 (108.3) | 357.1 (360.2) | 0.4628 | 0.4155 | 2697 | 85.9 (85.8) | 8.1 (8.1) |
| 10.0 | 107.3 (106.4) | 352.6 (356.1) | 0.4630 | 0.4160 | 2698 | 90.2 (89.9) | 29.2 (29.2) |
| 6.4 | 106.3 | 348.2 | 0.4632 | 0.4165 | 2699 | 93.8 | 50.3 |
| 5.1 | 105.9 | 346.1 | 0.4633 | 0.4167 | 2699 | 95.0 | 60.3 |
| 4.7 | 105.6 | 344.8 | 0.4634 | 0.4169 | 2700 | 95.4 | 66.4 |
| 3.1 | 104.5 | 339.7 | 0.4636 | 0.4175 | 2701 | 94.4 | 90.1 |
| 2.5 | 104.1 (103.8) | 337.8 (341.7) | 0.4637 | 0.4177 | 2701 | 92.7 (92.5) | 96.6 (96.5) |
| 2.2 | 103.7 | 336.0 | 0.4638 | 0.4179 | 2702 | 90.8 | 91.1 |
| 1.0 | 102.0 | 328.6 | 0.4642 | 0.4189 | 2703 | 82.0 | 56.2 |
| 0.0 | 100.7 (100.7) | 322.6 (321.4) | 0.4645 | 0.4196 | 2705 | 74.8 (73.9) | 27.8 (24.9) |

Figure 20:
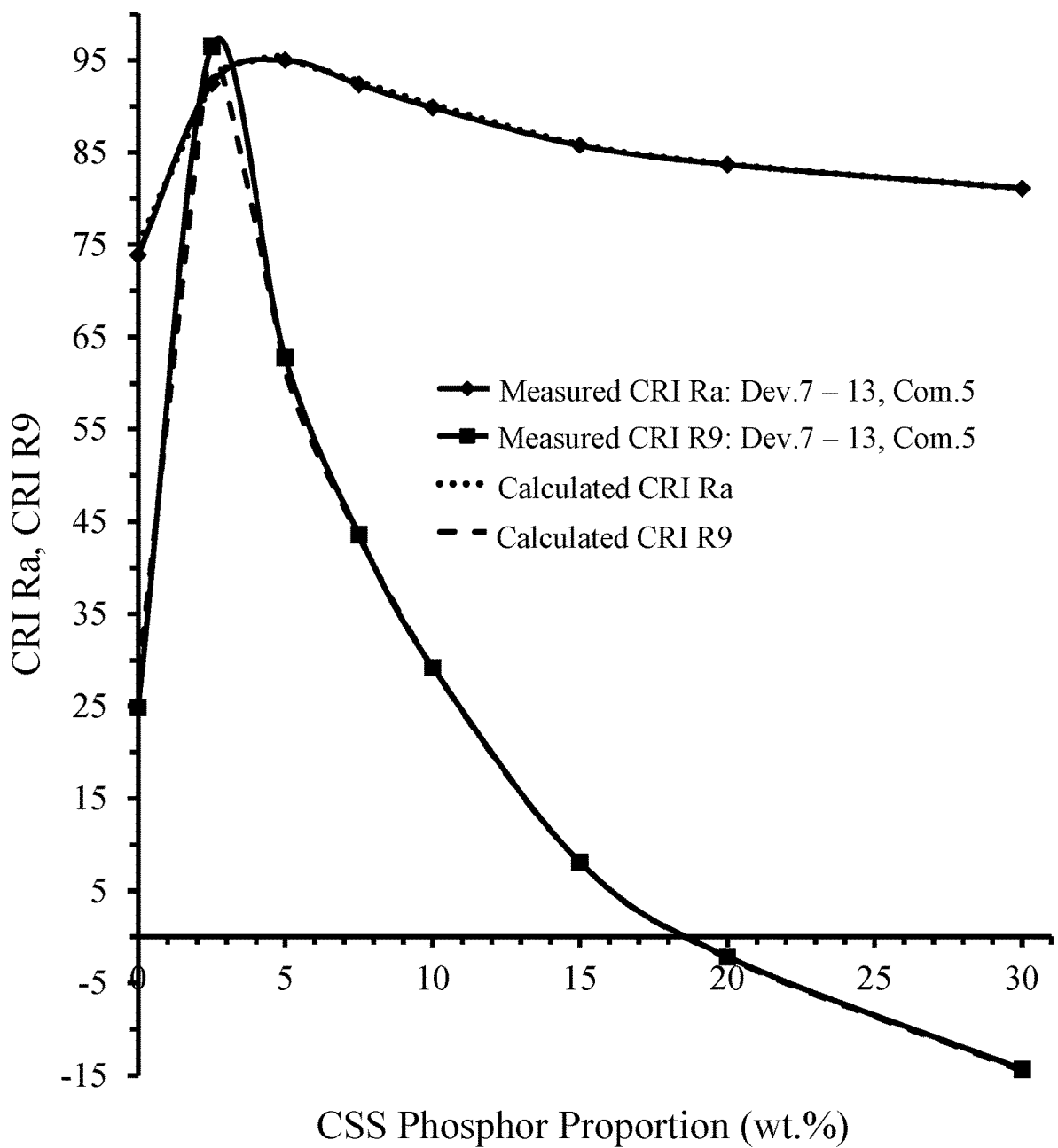
FIG. 20 shows calculated and measured CRI Ra and CRI R9 versus CSS phosphor proportion (wt. %) of total narrow-band red phosphor for light emitting devices Dev.7-13 and Com.5.
Figure 21:
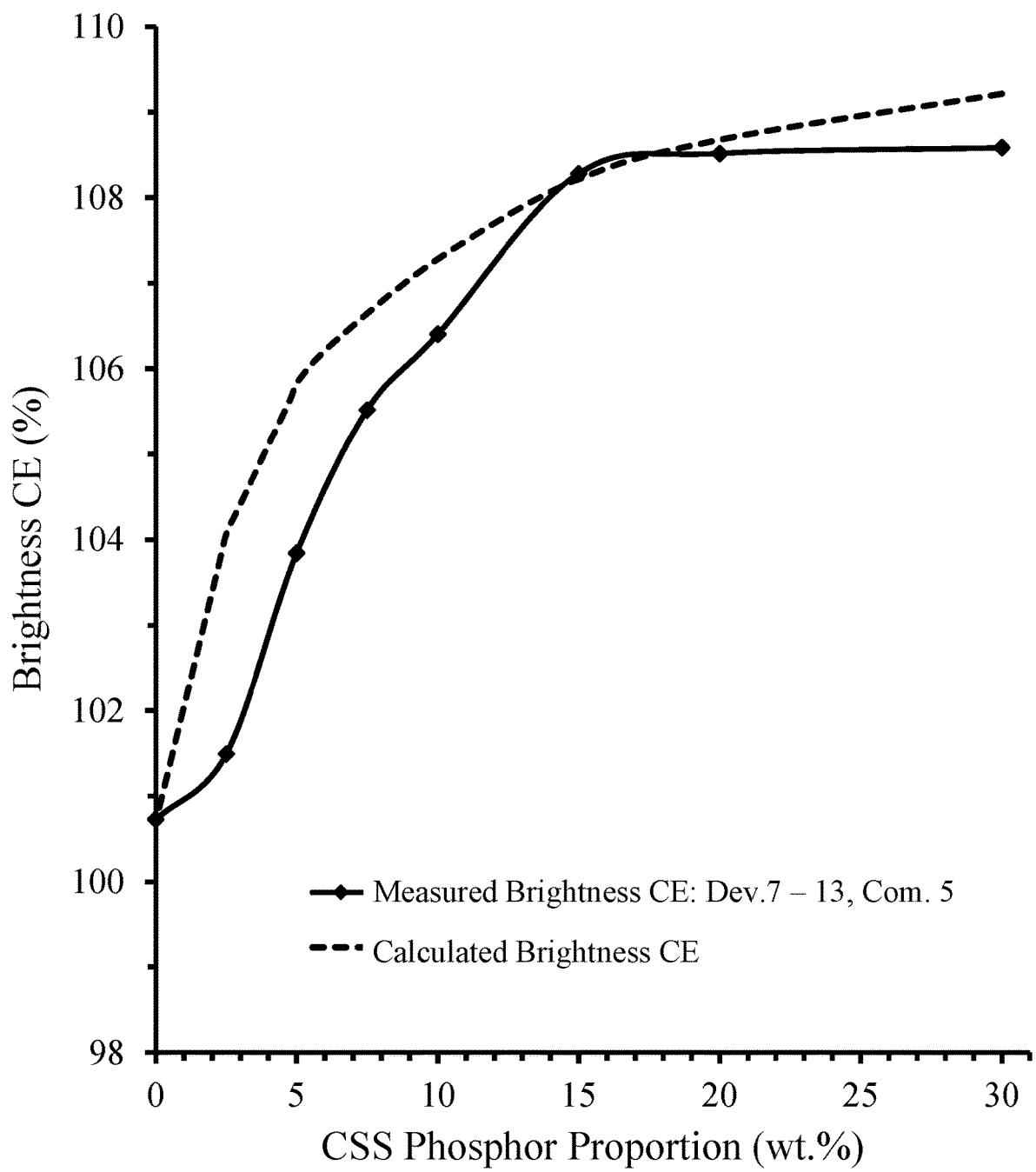
FIG. 21 shows calculated and measured brightness CE (%) versus CSS phosphor proportion (wt. %) of total narrow-band red phosphor for light emitting devices Dev.7-13 and Com.5.
Figure 22:
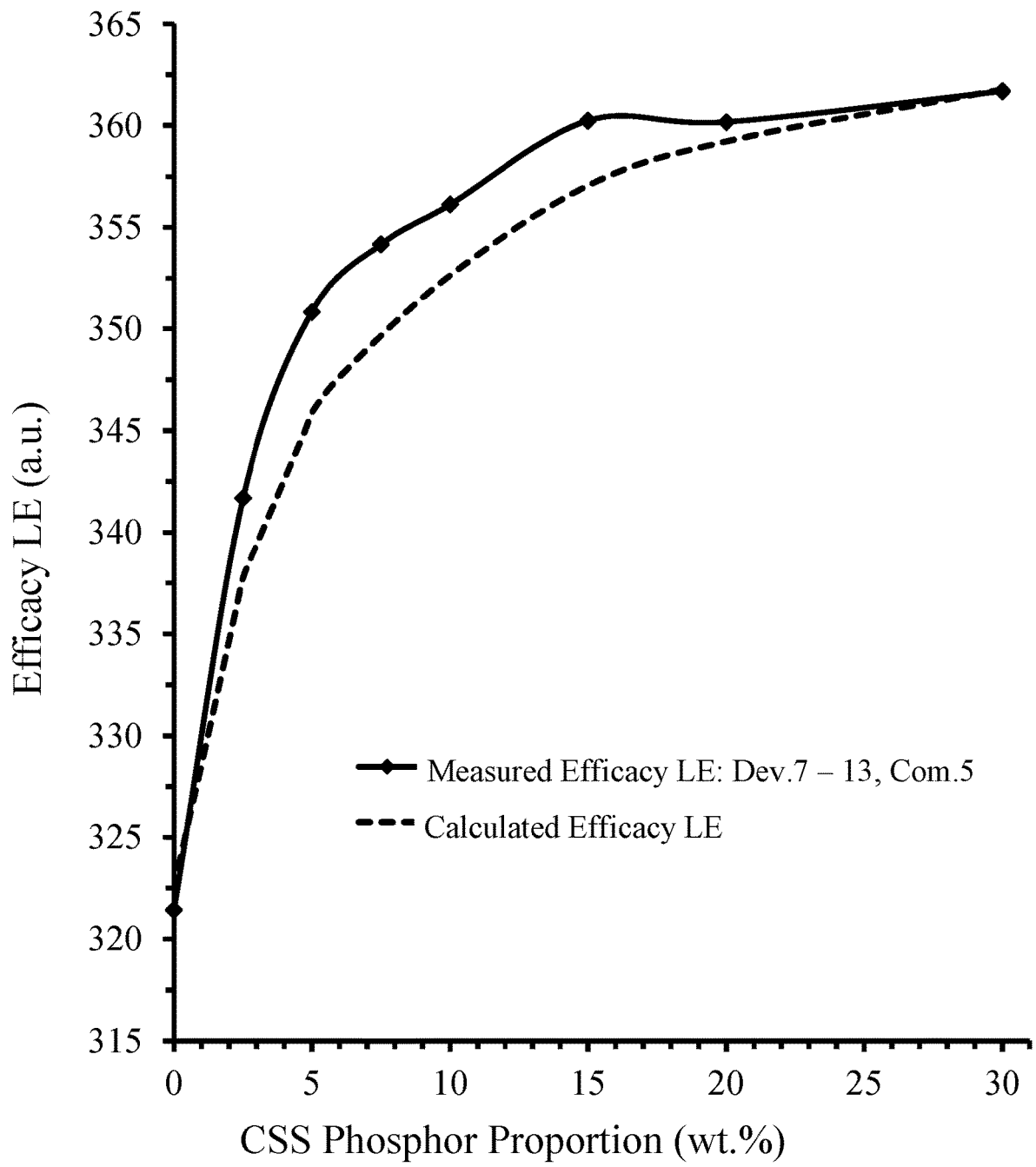
FIG. 22 shows calculated and measured luminous efficacy LE (a.u.) versus CSS phosphor proportion (wt. %) of total narrow-band red phosphor for light emitting devices Dev.7-13 and Com.5.

FIGS. 20-22 show calculated data: CRI Ra; CRI Ra; brightness CE (%); and luminous efficacy LE (a.u.) versus CSS phosphor proportion (wt. %) of total narrow-band red phosphor content (%). For comparison, the figures include measured data for light emitting devices Dev.7-13 and comparative device Com.5. (i.e. 0% CSS, 100% KSF). As can be seen from these figures, the calculated data indicate the general trend and there is a high correlation between the calculated and measured values.

The data in Tables 9 and 10 indicates that compared to Ref 3 (GAL540+CASN628) the brightness of light emitting devices in accordance with the invention comprising GAL540+a mixture of narrow-band red phosphors (CSS615+KSF) will be:

8% brighter for CRI Ra>85, CRI R9>0 (15 wt. % CSS);

5% brighter for CRI Ra>90, CRI R9>50 (~8 wt. % CSS);

4% brighter for CRI Ra>95, CRI R9>50 (~5 wt. % CSS); and

1% brighter for CRI Ra>90, CRI R9>90 (~2.5 wt. % CSS).

Moreover, the inventors have discovered that compared with a 2700K, CRI Ra 90 reference device (GAL535+ CAS628+CASN 650) the brightness increase can be 20% or higher (i.e. an increase of about 17% on top of each of the above figures).

Table 11 tabulates CSS phosphor proportion (wt. %) ranges for achieving various optical performance for 2700K light emitting devices comprising GAL540+a narrow-band red phosphor mixture CSS615 and KSF. The data of Table 11 is derived from the calculated and measured CRI Ra and CRI R9 data of FIG. 20.

TABLE 11

2700K light emitting device: GAL540 + narrow-band red phosphor mixture CSS615 and KSF

| Optical Performance | Proportion of CSS615 of total red phosphor content (wt. %) |
|---|---|
| CRI Ra ≥ 85 | ~1 wt. % to ~17 wt. % |
| CRI Ra ≥ 90 | ~2 wt. % to ~10 wt. % |
| CRI Ra ≥ 95 | ~4 wt. % to ~6 wt. % |
| CRI R9 ≥ 50 | ~1 wt. % to ~7 wt. % |
| CRI Ra ≥ 85 & CRI R9 ≥ 50 | ~1 wt. % to ~7 wt. % |
| CRI Ra ≥ 90 & CRI R9 ≥ 50 | ~2 wt. % to ~7 wt. % |
| CRI Ra ≥ 95 & CRI R9 ≥ 50 | ~4 wt. % to ~6 wt. % |

Measured Data Using Cavity Phosphor Test: 4000K Devices

Table 12 tabulates device phosphor composition for 4000K (nominal) light emitting devices denoted Dev.14-16 in accordance with an embodiment of the invention that comprise a mixture of two narrow-band red phosphors. For comparison, Table 12 includes details of a reference light emitting device (4000K, CRI Ra 80), denoted Ref 4, and a 4000K comparative light emitting device, denoted Com.6, comprising a single narrow-band red phosphor. As can be seen from the table, in terms of phosphor composition, Dev.14 comprises a green aluminate phosphor (GAL540)+a narrow-band red phosphor mixture (30 wt. % CSS615 & 70 wt. % KSF); Dev.15 comprises GAL540+narrow-band red phosphor mixture (5 wt. % CSS615 & 95 wt. % KSF); Dev.16 comprises GAL540+narrow-band red phosphor mixture (2.5 wt. % CSS615 & 97.5 wt. % KSF); and Com.6 comprises GAL540+narrow-band red phosphor KSF.

TABLE 12

4000 K device composition

| | Red phosphor composition (wt. %) | | | Phosphor composition (wt. %) | | Total phosphor |
|---|---|---|---|---|---|---|
| Device | CASN628 + CASN620 | CSS615 | KSF | Red | Green (GAL540) | per 100 g silicone (g) |
| Ref. 4 | 100.0 | — | — | 7.2 | 92.8 | 50 |
| Dev. 14 | — | 30.0 | 70.0 | 16.5 | 83.5 | 70 |
| Dev. 15 | — | 5.0 | 95.0 | 48.0 | 52.0 | 105 |
| Dev. 16 | — | 2.5 | 97.5 | 59.0 | 41.0 | 115 |
| Com. 6 | — | — | 100.0 | 70.0 | 30.0 | 130 |

Table 13 tabulates measured phosphor cavity test data for devices Dev.14-16, Com.6 and Ref.4 and illustrates the effect of CSS phosphor proportion (wt. %) of the total narrow-band red phosphor content on optical performance.

TABLE 13

Measured test data for 5630 cavity test (LED dominant wavelength 452.4 nm)

| Device | Brightness CE | Brightness CE (%) | Efficacy LE | Efficacy LE (%) | CIE x | CIE y | CCT (K) | CRI Ra | R9 |
|---|---|---|---|---|---|---|---|---|---|
| Ref. 4 | 264.3 | 100.0 | 330.6 | 100.0 | 0.3813 | 0.3797 | 4000 | 82.7 | 5.0 |
| Dev. 14 | 274.5 | 103.8 | 346.1 | 104.7 | 0.3814 | 0.3802 | 3999 | 83.4 | 3.2 |
| Dev. 15 | 263.7 | 99.8 | 339.9 | 102.8 | 0.3815 | 0.3805 | 4000 | 91.7 | 65.5 |
| Dev. 16 | 261.7 | 99.0 | 335.1 | 101.4 | 0.3813 | 0.3799 | 4000 | 93.8 | 94.0 |
| Com. 6 | 250.1 | 94.6 | 325.2 | 98.4 | 0.3811 | 0.3793 | 4000 | 86.0 | 43.5 |

FIGS. 23-26 show measured test data versus CSS phosphor proportion (wt. %) of total narrow-band red phosphor content (%) for light emitting devices Dev.14-16 and illustrate the effect of CSS phosphor proportion (wt. %) on various optical parameters. Each of these figures also includes data for comparative device Com.6 (0% CSS) and indicates the performance of reference device Ref.4 (CASN628+CASN620).

Figure 23:
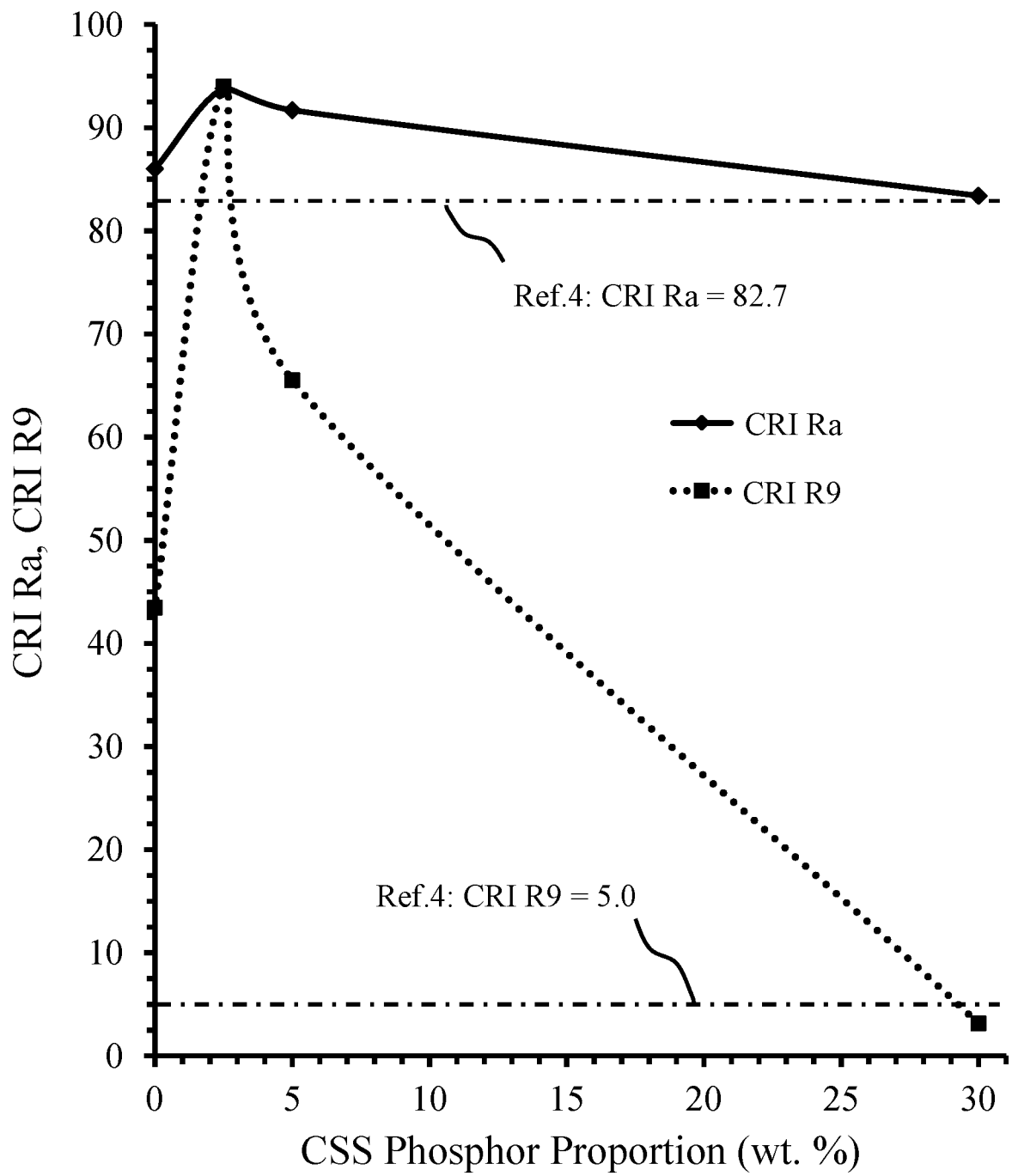
FIG. 23 shows measured CRI Ra and CRI R9 versus CSS phosphor proportion (wt. %) of total narrow-band red phosphor for light emitting devices Dev.14-16–GAL540+narrow-band red phosphor mixture comprising varying wt. % CSS615 and KSF and Com.6–GAL540+narrow-band red phosphor (CSS615)
Figure 26:
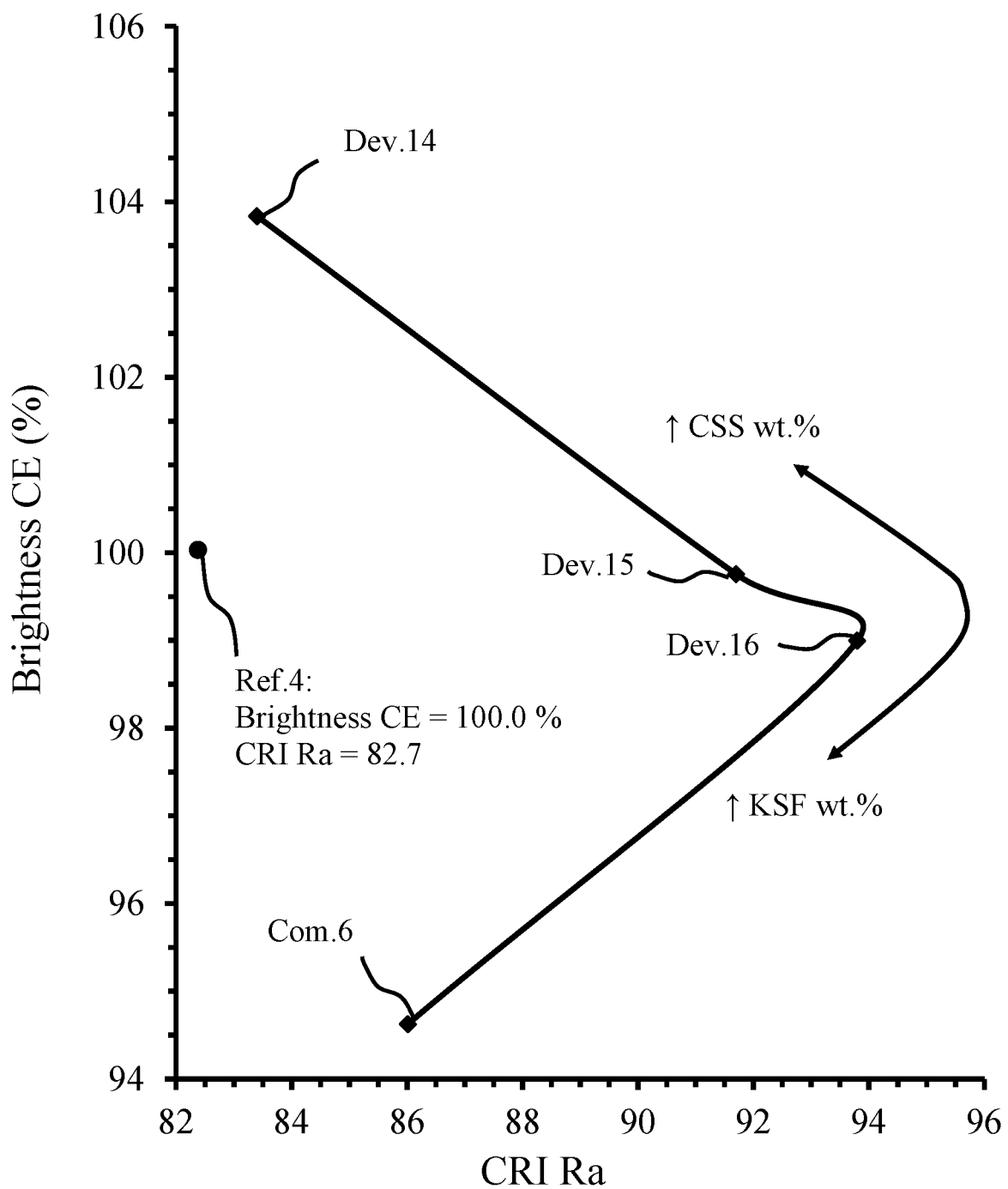
FIG. 26 shows measured brightness CE (%) versus CRI Ra for light emitting devices Dev.14-16 and Com.6.

FIG. 23 shows measured general Color Rendering Index CRI Ra and CRI R9 versus CSS phosphor proportion (wt. %) of total narrow-band red phosphor content for light emitting devices Dev.14-16 and comparative device Com.6. As can be seen in FIG. 23, CRI Ra increases rapidly with FIG. 26 shows measured brightness CE (%) versus CRI Ra for devices Dev.14-16 and Com.6 illustrating the effect of CSS phosphor proportion (wt. %) of total narrow-band red phosphor content.

Table 14 tabulates simulated (calculated) optical performance data for 4000K light emitting devices comprising GAL540+narrow-band red phosphor mixture CSS615 and KSF for varying CSS phosphor proportion (wt. %) of total narrow-band red phosphor content. For comparison, the table also includes measured data values for Dev.14-16 and Com.6 (0 wt. % CSS615).

TABLE 14

Simulated optical performance data for 4000 K light emitting devices GAL540 + narrow-band red phosphor mixture CSS615 and KSF (LED dominant wavelength 452.4 nm). Values in parenthesis and bold are measured data for Dev. 14-16 and Com. 6 (0 wt. % CSS615).

| CSS (wt. %) | Brightness CE (%) | Efficacy LE | CIE x | CIE y | CCT (K) | CRI Ra | CRI R9 |
|---|---|---|---|---|---|---|---|
| 30.0 | 104.1 (103.8) | 346.1 (346.1) | 0.3814 | 0.3802 | 3999 | 83.5 (83.4) | 3.4 (3.2) |
| 21.0 | 102.7 | 343.1 | 0.3815 | 0.3802 | 3997 | 85.8 | 26.6 |
| 15.0 | 101.8 | 341.3 | 0.3815 | 0.3802 | 3995 | 88.7 | 40.1 |
| 10.0 | 100.9 | 339.6 | 0.3816 | 0.3801 | 3995 | 90.6 | 54.1 |
| 8.0 | 100.6 | 338.8 | 0.3816 | 0.3801 | 3995 | 91.2 | 59.9 |
| 5.0 | 100.2 (99.8) | 337.8 (339.9) | 0.3816 | 0.3801 | 3994 | 92.1 (91.7) | 66.5 (65.5) |
| 4.0 | 100.0 | 337.0 | 0.3816 | 0.3800 | 3994 | 92.5 | 70.2 |
| 2.5 | 98.7 (99.0) | 334.5 (335.1) | 0.3816 | 0.3800 | 3992 | 94.1 (93.8) | 90.8 (94.0) |
| 2.0 | 98.1 | 333.2 | 0.3816 | 0.3800 | 3992 | 93.7 | 98.3 |
| 1.5 | 97.5 | 331.9 | 0.3816 | 0.3800 | 3991 | 92.6 | 90.1 |
| 1.0 | 96.0 | 328.5 | 0.3817 | 0.3799 | 3999 | 89.5 | 65.6 |
| 0.0 | 94.6 (94.6) | 325.4 (325.2) | 0.3817 | 0.3798 | 3988 | 86.0 (86.0) | 43.6 (43.5) | increasing CSS phosphor proportion, reaches a maximum value (CRI Ra~95) for devices with a CSS phosphor proportion in a range ~2 wt. % to ~3 wt. % and then decreases relatively more slowly. Compared with the reference device Ref 4, devices having a CSS proportion in a range 0 wt. % to ~30 wt. % have a higher CRI Ra value (i.e. CRI Ra>82.7). CRI R9 increases rapidly with increasing CSS phosphor proportion and reaches a maximum value (CRI R9~95) for devices with a CSS phosphor proportion in a range ~2 wt. % to ~3 wt. % before decreasing generally exponentially. Compared with the reference device, Ref 4, devices having a CSS proportion in a range 0 wt. % to ~29 wt. % have a higher CRI R9 value (i.e. CRI R9>5.0).

Figure 24:
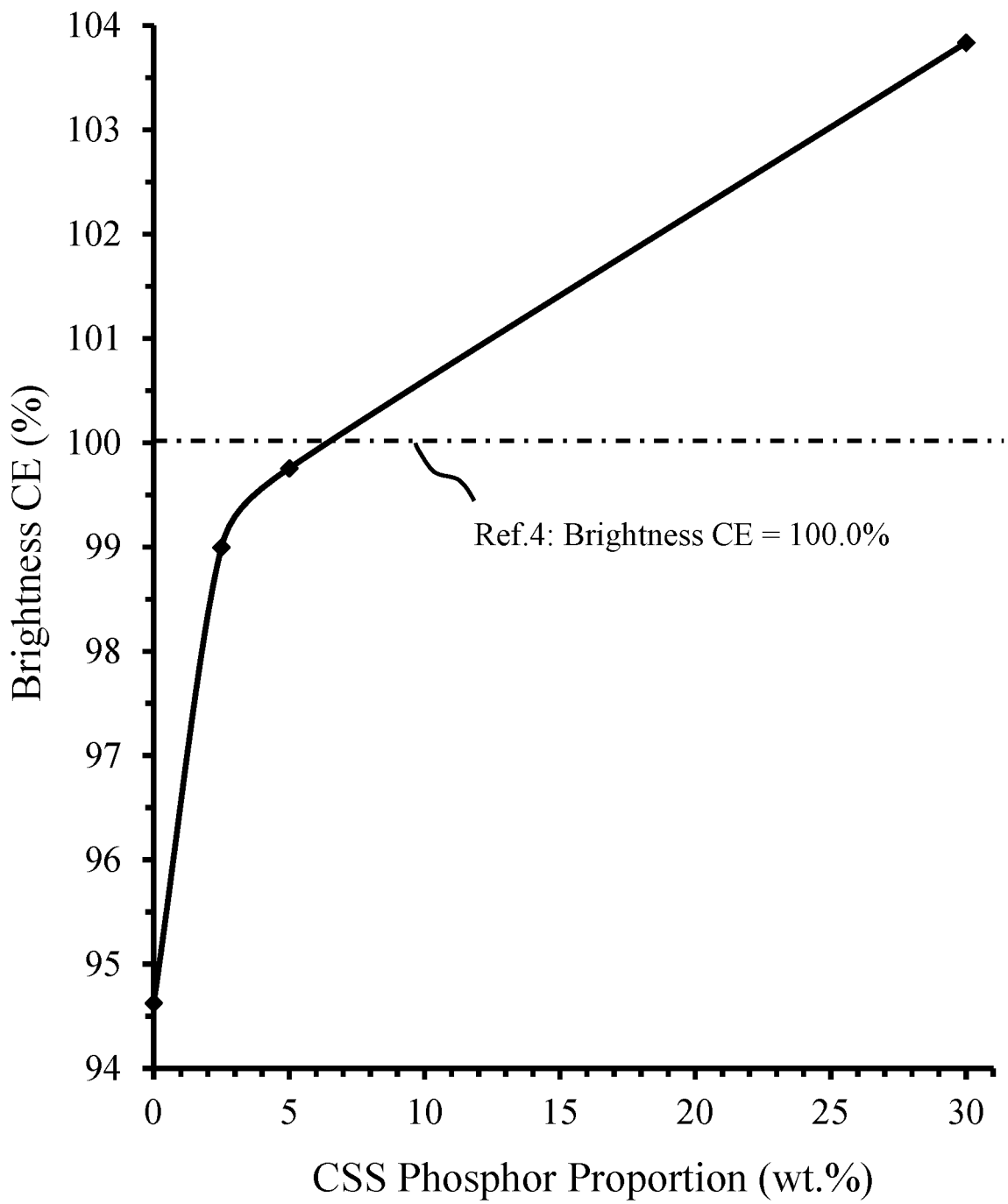
FIG. 24 shows measured brightness CE (%) versus CSS phosphor proportion (wt. %) of total narrow-band red phosphor for light emitting devices Dev.14-16 and Com.6.

FIG. 24 shows measured brightness CE (%) versus CSS phosphor proportion (wt. %) of total narrow-band red phosphor content for devices Dev.14-16 and Com.6. As can be seen in FIG. 24, brightness CE increases rapidly with increasing CSS phosphor proportion up to CSS phosphor proportions of about 5 wt. % (Brightness CE~99.5%) and then continues to increase relatively more slowly. Compared with the reference device Ref 4, light emitting devices having a CSS proportion in a range ~6 wt. % to 30+wt. % have a higher brightness CE value (i.e. CE>100%).

Figure 25:
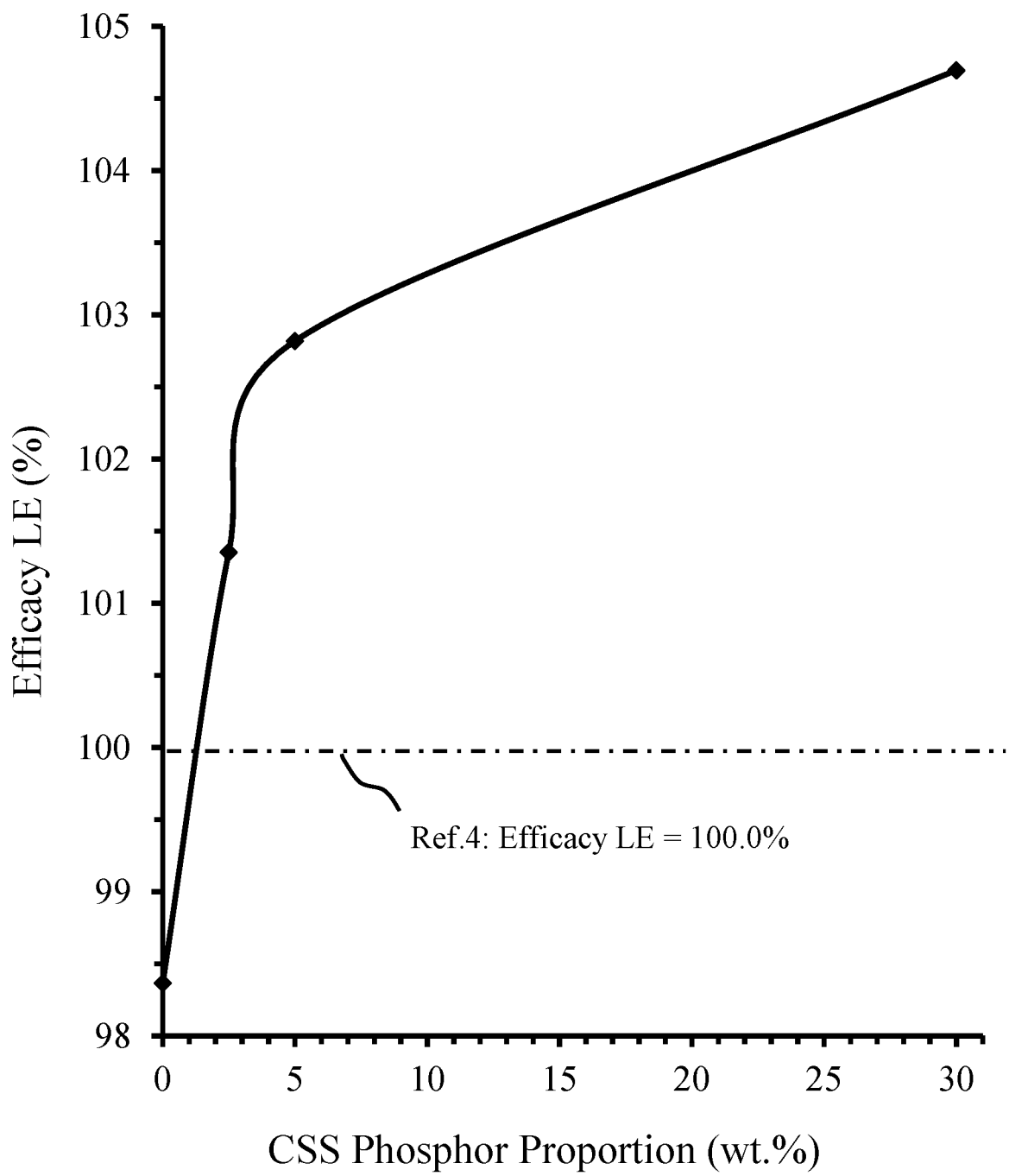
FIG. 25 shows measured luminous efficacy LE (%) versus CSS phosphor proportion (wt. %) of total narrow-band red phosphor content for light emitting devices Dev.14-16 and Com.6.

FIG. 25 shows measured luminous efficacy LE (%) versus CSS phosphor proportion (wt. %) of total narrow-band red phosphor content for devices 14-16 and Com.6. As can be seen in FIG. 25, luminous efficacy LE increases rapidly with increasing CSS phosphor proportion up to CSS phosphor proportions of about ~3 wt. % (Luminous efficacy LE~102.5%) and then continues to increase relatively more slowly. Compared with the reference device Ref.4, light emitting devices having a CSS proportion in a range ~2 wt. % to 30+wt. % have a higher luminous efficacy LE value (i.e. LE>100.0%).

Figure 27:
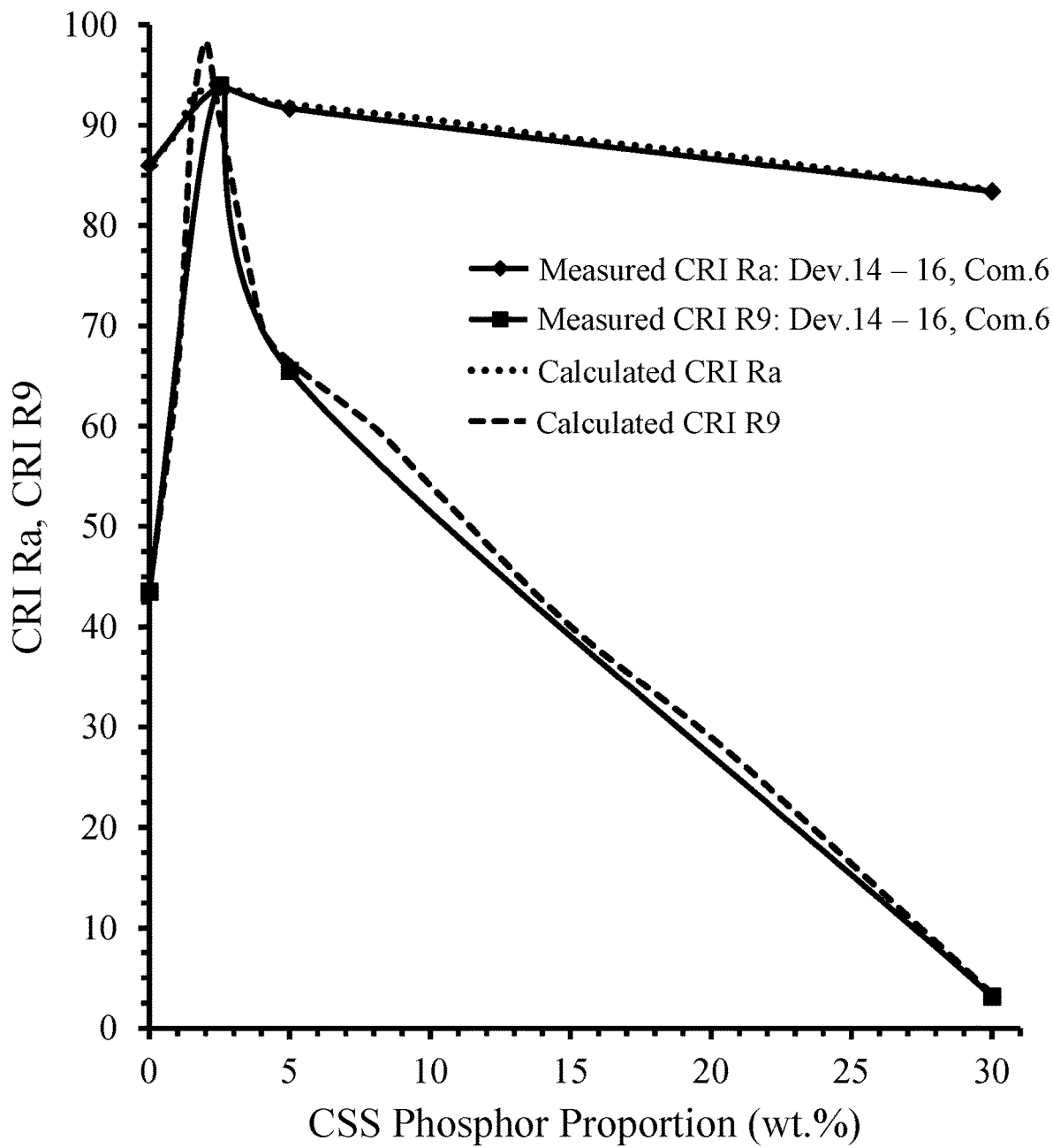
FIG. 27 shows calculated and measured CRI Ra and CRI R9 versus CSS phosphor proportion (wt. %) of total narrow-band red phosphor for light emitting devices Dev.14-16 and Com.6.
Figure 28:
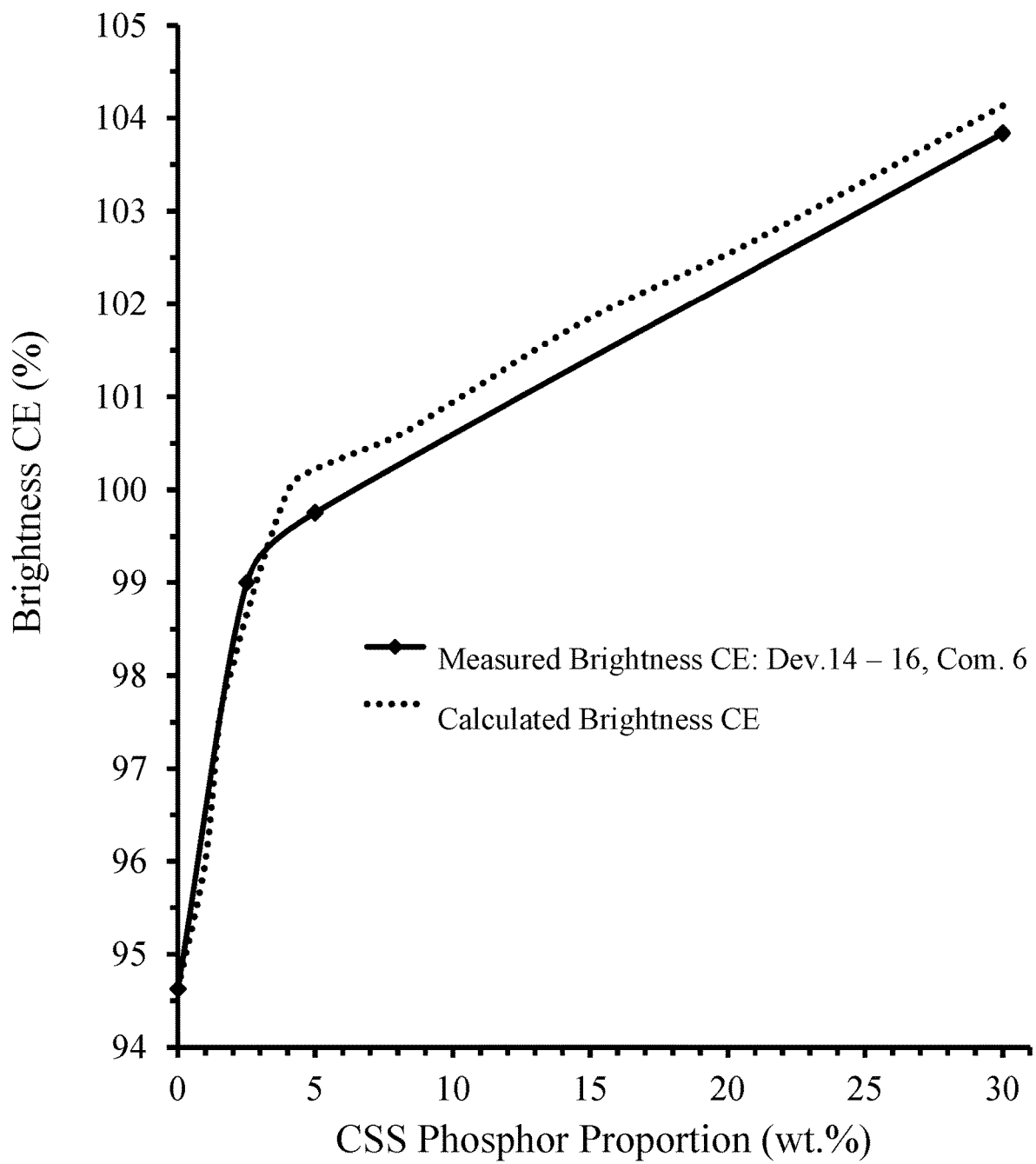
FIG. 28 shows calculated and measured brightness CE (%) versus CSS phosphor proportion (wt. %) of total narrow-band red phosphor for light emitting devices Dev.14-16 and Com.6.
Figure 29:
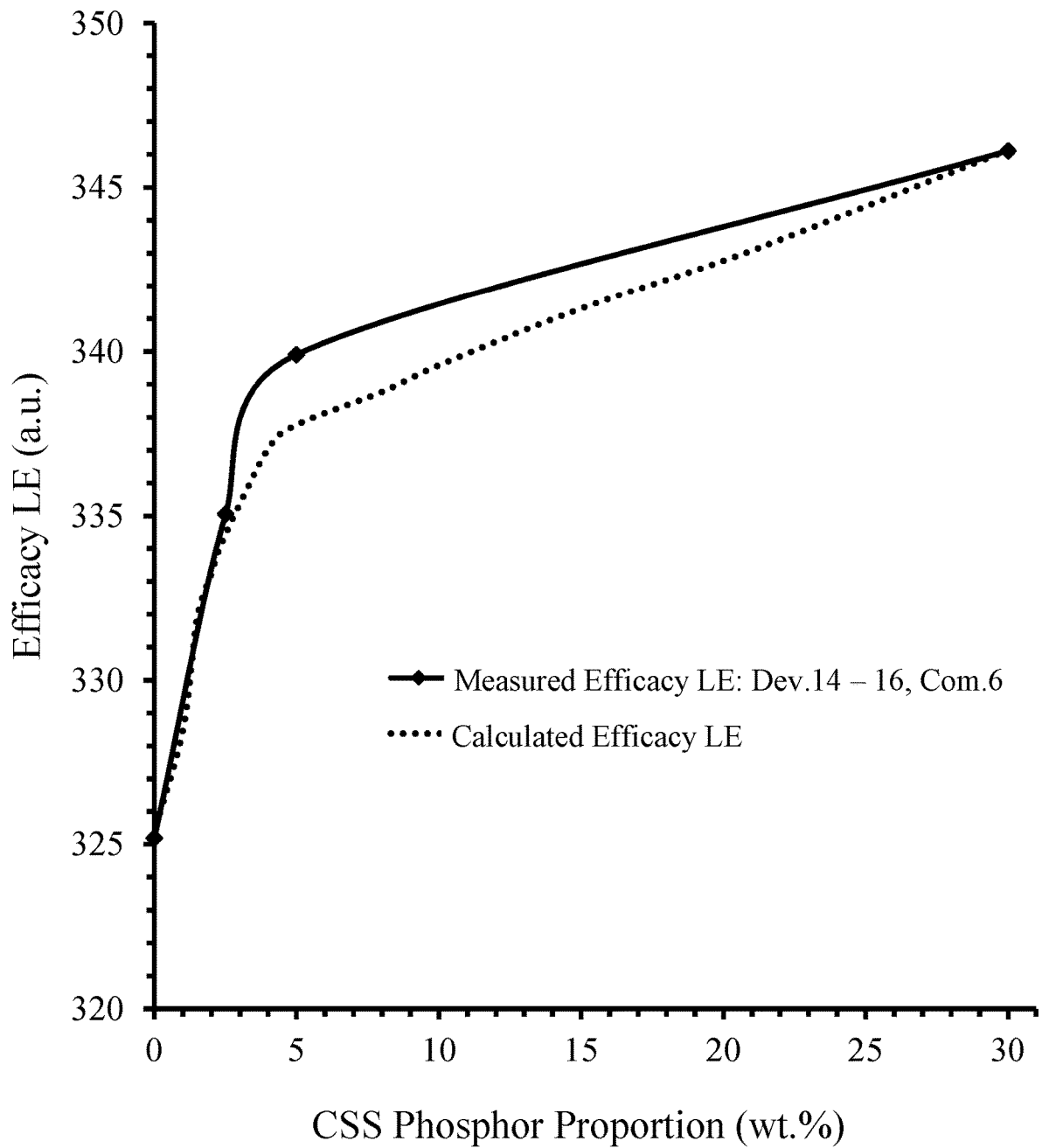
FIG. 29 shows calculated and measured luminous efficacy LE (a.u.) versus CSS phosphor proportion (wt. %) of total narrow-band red phosphor for light emitting devices Dev.14-16 and Com.6.

FIGS. 27-29 show calculated data: CRI Ra; CRI Ra; brightness CE (%); and luminous efficacy LE (a.u.) versus CSS phosphor proportion (wt. %) of total narrow-band red phosphor content (%). For comparison, the figures include measured data for light emitting devices Dev.14-16 and comparative device Com.6. (0 wt. % CSS). As can be seen from these figures, the calculated data indicate the general trend and there is a high correlation between the calculated and measured values.

The data in Tables 13 and 14 indicate that compared to Ref.4 (GAL540+CASN628+CASN620) the brightness of light emitting devices in accordance with the invention comprising GAL540+a mixture of narrow-band red phosphors (CSS615+KSF) will be:

4% brighter for CRI Ra>80, CRI R9>0 (15 wt. % CSS);

0% brighter for CRI Ra>90, CRI R9>50 (~8 wt. % CSS); and

1% dimmer for CRI Ra>90, CRI R9>90 (~2.5 wt. % CSS).

Moreover, the inventors have discovered that compared with a 4000K, CRI Ra 90 reference device (GAL540+CAS628+CASN 650) the brightness increase can be 20% or higher (i.e. an increase of about 17% on top of each of the above figures).

Table 15 tabulates CSS phosphor proportion (wt. %) ranges for achieving various optical performance for 4000K light emitting devices comprising GAL540+a narrow-band red phosphor mixture CSS615 and KSF. The data of Table 15 is derived from the calculated and measured CRI Ra and CRI R9 data of FIG. 27.

TABLE 15

4000K light emitting device: GAL540 + narrow-band red phosphor mixture CSS615 and KSF

| Performance | Proportion of CSS615 of total red phosphor content (wt. %) |
|---|---|
| CRI Ra ≥ 85 | 0 wt. % to ~26 wt. % |
| CRI Ra ≥ 90 | ~1 wt. % to ~11 wt. % |
| CRI Ra ≥ 95 | ~1 wt. % to ~2 wt. % |
| CRI R9 ≥ 50 | ~1 wt. % to ~11 wt. % |
| CRI Ra ≥ 85 & CRI R9 ≥ 50 | ~1 wt. % to ~11 wt. % |
| CRI Ra ≥ 90 & CRI R9 ≥ 50 | ~1 wt. % to ~11 wt. % |
| CRI Ra ≥ 95 & CRI R9 ≥ 50 | ~1 wt. % to ~2 wt. % |

In summary, it can be seen from the foregoing examples that light emitting devices in accordance with the invention comprising a combination, typically a mixture, of two narrow-band red photoluminescence materials can, compared with the known devices comprising one or more broad-band red phosphor or compared with devices comprising a single narrow-band red phosphor, increase brightness by up to 20%, CRI Ra and CRI R9.

LED-Filaments and LED-Filament Lamps

Although the present invention has been particularly described with reference to light emitting devices comprising a combination of two narrow-band red photoluminescence materials, the invention also finds utility in LED-filaments and LED-filament lamps.

Figure 30A:
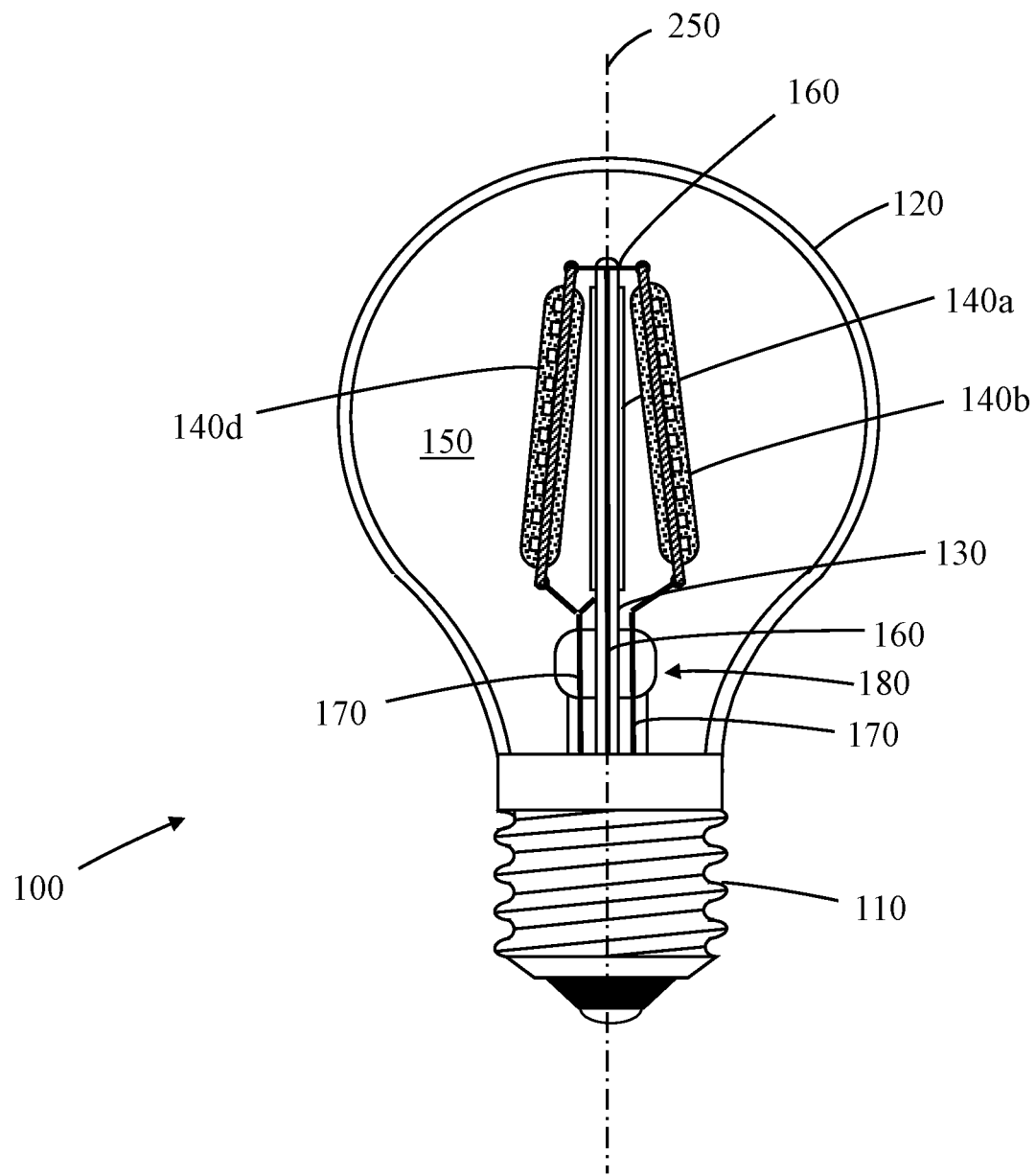
FIGS. 30A and 30B respectively illustrate partial cross-sectional A-A side and plan views of a four LED-filament A-Series (A19) lamp in accordance with an embodiment of the invention.
Figure 30B:
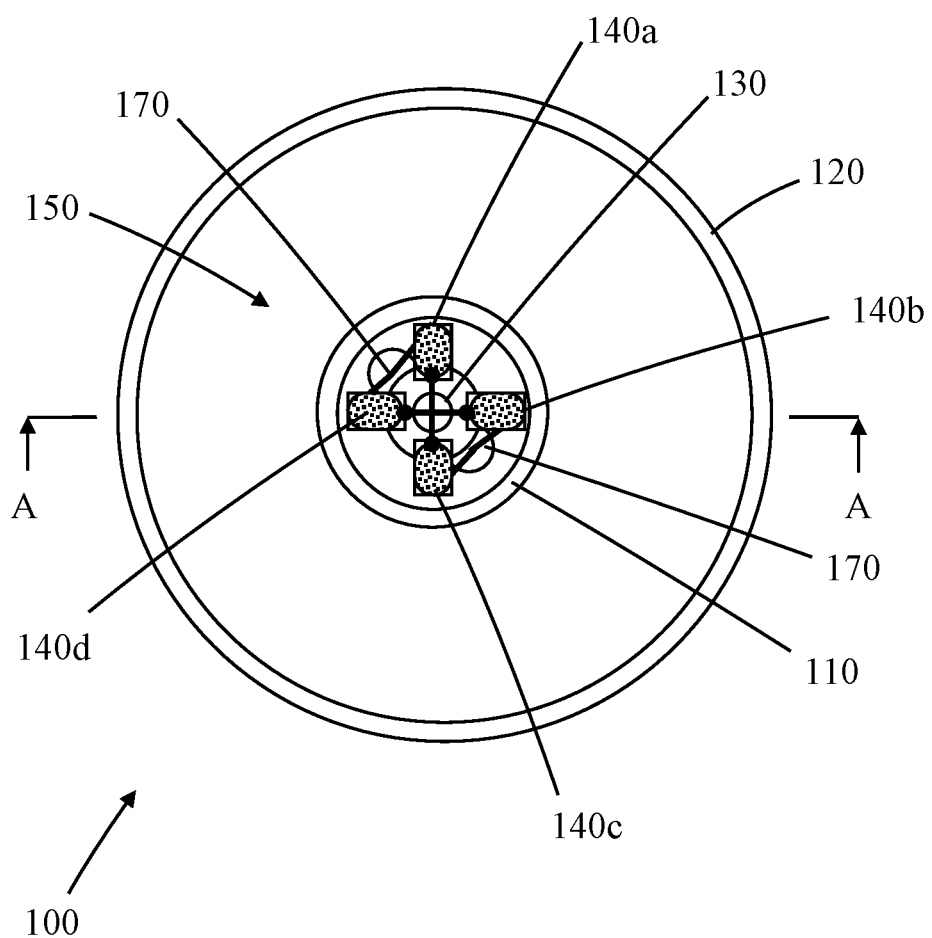

FIGS. 30A and 30B respectively illustrate a partial cross-sectional side view through A-A and a partial cutaway plan view of an LED-filament A-Series lamp (bulb) 100 in accordance with an embodiment of the invention. The LED-filament lamp 100 is intended to be an energy efficient replacement for an incandescent A19 light bulb and is configured to generate 550 lm of light with a CCT (Correlated Color Temperature) of 2700 K and a CRI Ra of 80 and CRI R9>0. The LED-filament lamp is nominally rated at 4 W. As is known, an A-series lamp is the most common lamp type and an A19 lamp is 2⅜ inches (19/8) wide at its widest point and approximately 4⅜ inches in length.

The LED-filament lamp 100 comprises a connector base 110, a light-transmissive glass envelope 120; a glass LED-filament support (stem) 130 and four LED-filaments 140a, 140b, 140c, 140d.

In some embodiments, the LED-filament lamp 100 can be configured for operation with a 110V (r.m.s.) AC (60 Hz) mains power supply as used in North America. As illustrated, the LED-filament lamp 100 can comprise an E26 (φ26 mm) connector base (Edison screw lamp base) 110 enabling the lamp to be directly connected to a mains power supply using a standard electrical lighting screw socket. It will be appreciated that depending on the intended application other connector bases can be used such as, for example, a double contact bayonet connector (i.e. B22d or BC) as is commonly used in the United Kingdom, Ireland, Australia, New Zealand and various parts of the British Commonwealth or an E27 (φ27 mm) screw base (Edison screw lamp base) as used in Europe. The connector base 110 can house rectifier or other driver circuitry (not shown) for operating the LED-filament lamp.

The light-transmissive glass envelope 120 is attached to the connector 110 and defines a hermetically sealed volume 150 in which the LED-filaments 140a to 140d are located. The envelope 120 can additionally incorporate or have a layer of a light diffusive (scattering) material such as for example particles of Zinc Oxide (ZnO), titanium dioxide ($TiO_2$), barium sulfate ($BaSO_4$), magnesium oxide (MgO), silicon dioxide ($SiO_2$) or aluminum oxide ($Al_2O_3$).

The LED-filaments 140a to 140d, which are linear (elongate) in form, are oriented such that each runs in a direction that is generally parallel to an axis 250 of the lamp 100. The LED-filaments 140a to 140b can be circumferentially spaced, for instance equally circumferentially spaced, around the glass filament support (stem) 130 (FIG. 30B). A first end of each LED-filament 140a to 140d distal to the connector base 110 is electrically and mechanically connected to a first conducting wire 160 that passes down an axis of the LED filament support 130 to the connector base 110. A second end of each LED-filament 140a to 140d proximal to the connector base 110 is electrically and mechanically connected to a second conducting wire 170 that passes through a base portion 180 of the LED filament support 130 to the connector base 110.

Figure 31A:
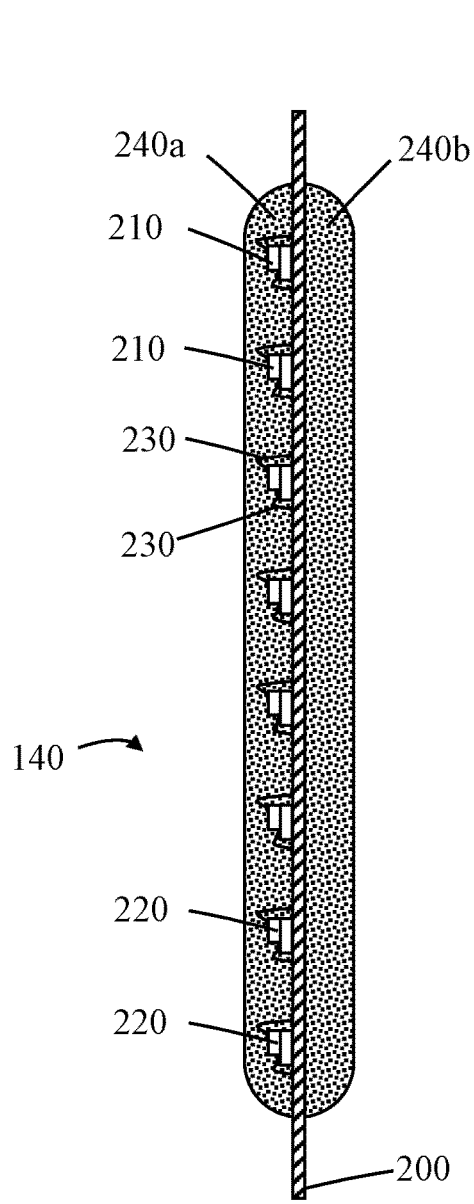
FIGS. 31A and 31B illustrates schematic cross-sectional B-B side and partial cutaway plan views of an LED-filament in accordance with an embodiment of the invention for use in the lamp of FIGS. 30A and 30B.
Figure 31B:
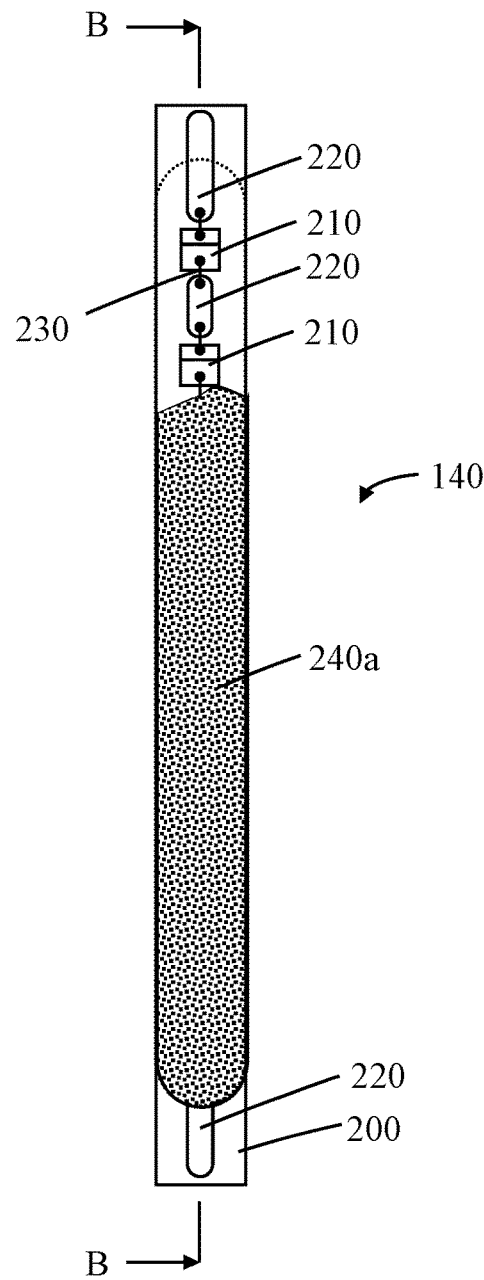

An LED-filament 140 according to an embodiment of the invention is now described with reference to FIGS. 31A and 31B which shows a cross-sectional side view through A-A and a partial cut-away plan of an LED-filament. The LED-filament 140 comprises a light-transmissive circuit board (substrate) 200 having an array of blue emitting (dominant wavelength typically ~450 to ~460 nm) unpackaged LED chips (dies) 210 mounted directly to one face. In the embodiment, illustrated the circuit board 200 is planar and has an elongate form (strip) with the LED chips 210 being configured as a linear array along the length of the substrate. An elongate array may be preferred when the LED-filament 200 is used as a part of an energy efficient bulb since the appearance and emission characteristics of the device more closely resembles a traditional filament of an incandescent bulb. Depending on the application the circuit board can comprise other forms such as for example being square or circular and the LED chips configured as other arrays or configurations. It should be noted that the LED chips 210 are mounted directly to the circuit board 200 and are not packaged. Such packaging would otherwise block the emission of light in a backward direction towards and through the circuit board 200. Furthermore, it should be noted that the light-transmissive substrate may have a transmittance in a range of 20% to 100% in the visible light spectrum.

Typically each LED-filament comprises fifteen LED 65 mW chips with a total nominal power of about 1 W.

The circuit board 200 can comprise any light-transmissive material which is at least translucent and preferably has a transmittance to visible light of 50% or greater. Accordingly, the circuit board can comprise a glass or a plastics material such as polypropylene, silicone or an acrylic. To aid in the dissipation of heat generated by the LED chips 210, the circuit board 200 is not only light-transmissive but is advantageously also thermally conductive. Examples of suitable light-transmissive thermally conductive materials include: magnesium oxide, sapphire, aluminum oxide, quartz glass, aluminum nitride and diamond. The transmittance of the thermally conductive circuit board can be increased by making the circuit board thin. To increase mechanical strength, the circuit board can comprise a laminated structure with the thermally conductive layer mounted on a light-transmissive support such as a glass or plastics material. To further assist in the dissipation of heat the volume within the glass envelope is preferably filled with a thermally conductive gas such as helium, hydrogen or a mixture thereof.

The circuit board 200 further comprises electrically conductive tracks 220 configured in a desired circuit configuration for electrically connecting the LED chips 210. As illustrated the LED chips 210 of the LED filament can be connected serially as a string and the LED filaments 140a to 140b connected in parallel. It will be appreciated that other circuit configurations can be used. The electrically conductive tracks 220 can comprise copper, silver or other metal or a transparent electrical conductor such as indium tin oxide (ITO). As illustrated the LED chips 210 are electrically connected to the conducting tracks 220 using bond wires 230. In other embodiments, the LED chip can comprise surface mountable or flip-chip devices. The LED chips 210 can be mounted to the circuit board by soldering, a thermally conductive adhesive or by other fixing methods which will be apparent to those skilled in the art. Where the light-transmissive circuit board 200 comprises a thermally conductive material the LED chips 210 are advantageously mounted in thermal communication with the circuit board. A heat sink compound such as beryllium oxide can be used to aid in thermal coupling of the LED chips to the circuit board.

The LED-filament 140 further comprises a photoluminescence wavelength conversion material 240 comprising a combination, typically a mixture, of a green photoluminescence material (peak emission wavelength $\lambda_{pe}$ 520 nm to 570 nm) and two narrow-band red photoluminescence materials (e.g., CSS+KSF phosphor) directly to the LEDs chips 210 in the form of an encapsulating layer 240a. To prevent blue light emitted from the rear of the LED chips 210 being emitted through the rear face of the circuit board 200, the photoluminescence wavelength conversion material can, as indicated in FIG. 31A, be applied as a layer 240b to cover the rear face of the circuit board 200.

In operation, blue excitation light generated by the LED chips 210 excites the green and narrow-band red photoluminescence materials to generate green and orange to red photoluminescence light. The emission product of the LED-filament which appears white in color comprises the combined photoluminescence light and unconverted blue LED light. Since the photoluminescence light generation process is isotropic, phosphor light is generated equally in all directions and light emitted in a direction towards the circuit board can pass through the circuit board and be emitted from the rear of the device. It will be appreciated that the use of a light-transmissive circuit board (substrate) enables the device to achieve a generally omnidirectional emission characteristic. Additionally, particles of a light reflective material can be combined with the phosphor material to reduce the quantity of phosphor required to generate a given emission product color. Furthermore, it is understand that the color of the light emitted by the bulb can be changed by combining a different phosphor, or no other phosphor with the narrow-band red phosphor.

Table 16 tabulates an LED-filament phosphor composition for a 2700K (nominal) CRI Ra 80 LED-filament denoted Dev.17 in accordance with an embodiment of the invention that comprises a combination (typically, a mixture of particles) of two narrow-band red phosphors (CSS615 and KSF). For comparison, Table 16 includes details of a reference LED-filament (2700K, CRI Ra 80), denoted Ref.5, comprising a CASN628 broad-band red phosphor. As can be seen from the table, in terms of phosphor composition, Dev.17 comprises a GAL540+a narrow-band red phosphor mixture (15 wt. % CSS615 & 85 wt. % KSF) while Ref.5 comprises GAL535+red nitride phosphor (CASN628). Each LED-filament comprises twenty nine 0.41 mm×0.27 mm LED chips.

TABLE 16

2700 K LED-filament composition

| LED-filament | Red phosphor composition (wt. %) | | | Phosphor composition (wt. %) | Green | | Total phosphor per 100 g silicone (g) |
| --- | --- | --- | --- | --- | --- | --- | --- |
| | CASN628 | CSS615 | KSF | Red | GAL 540 | GAL 535 | |
| Ref. 5 | 100.0 | — | — | 6.1 | — | 93.9 | 89 |
| Dev. 17 | — | 15.0 | 85.0 | 35.0 | 65.0 | — | 150 |

TABLE 17

Measured test data for 2700 K LED-filaments

| LED-filament | Power (W) | Brightness CE (%) | Efficacy Lumens | (lm/W) | CIE x | CIE y | CCT (K) | CRI Ra | R9 |
| --- | --- | --- | --- | --- | --- | --- | --- | --- | --- |
| Ref. 5 | 0.7814 | 100.0 | 141.5 | 335.3 | 0.4709 | 0.4250 | 2661 | 81.2 | −1.0 |
| Dev. 17 | 0.7791 | 106.0 | 149.7 | 356.5 | 0.4699 | 0.4263 | 2684 | 81.8 | −10.4 |

As can be seen from Table 17 indicate that LED-filaments in accordance with the invention that comprise a combination of two narrow-band red photoluminescence materials show an improvement of about 6% in brightness and luminous efficacy compared with an LED-filament comprising a single broad-band red phosphor. Initial test data indicate that LED-filaments and LED-filament lamps in accordance with the invention show an improvement in performance that is consistent with light emitting devices described above.

Although the present invention has been particularly described with reference to certain embodiments thereof, it should be readily apparent to those of ordinary skill in the art that changes and modifications in the form and details may be made without departing from the spirit and scope of the invention. For example, while in the embodiments the narrow-band red photoluminescence materials are embodied as narrow-band red phosphors, in other embodiments one or both of the narrow-band red photoluminescence materials can comprise a quantum dot (QD) material.

What is claimed is:

1. A light emitting device comprising:
an excitation source; and
a photoluminescence material comprising a green phosphor, a Group IIA/IIB selenide sulfide red phosphor, and a manganese-activated fluoride red phosphor,
wherein the light emitting device generates light with a CRI Ra of at least 90 and a CRI R9 of at least 50.

2. The light emitting device of claim 1, wherein the Group IIA/IIB selenide sulfide red phosphor is of general composition $MSe_{1-x}S_x$: Eu, wherein M is at least one of Mg, Ca, Sr, Ba and Zn and $0<x<1.0$.

3. The light emitting device of claim 1, wherein the Group IIA/IIB selenide sulfide phosphor comprises a plurality of particles, wherein individual ones of the phosphor particles have a coating thereon.

4. The light emitting device of claim 1, wherein the manganese-activated fluoride red phosphor is of a general composition selected from the group consisting of: $K_2SiF_6$:$Mn^{4+}$, $K_2GeF_6$:$Mn^{4+}$, $K_2TiF_6$:$Mn^{4+}$, $K_2SnF_6$:$Mn^{4+}$, $Na_2TiF_6$:$Mn^{4+}$, $Na_2ZrF_6$:$Mn^{4+}$, $Cs_2SiF_6$:$Mn^{4+}$, $Cs_2TiF_6$:$Mn^{4+}$, $Rb_2SiF_6$:$Mn^{4+}$, $Rb_2TiF_6$:$Mn^4$.

5. The light emitting device of claim 1, wherein the green phosphor comprises a cerium-activated garnet phosphor of general composition $Y_3(Al,Ga)_5O_{12}$:Ce.

6. The light emitting device of claim 1, wherein the green phosphor comprises an cerium-activated garnet phosphor of general composition $Lu_3Al_5O_{12}$:Ce.

7. An LED-filament comprising:
an at least partially light-transmissive substrate;
a plurality of LEDs on a face of the substrate; and
a photoluminescence material at least partially covering the plurality of LEDs, the photoluminescence material comprising a green phosphor, a Group IIA/BB selenide sulfide red phosphor, and a manganese-activated fluoride red phosphor, and
wherein the LED-filament generates light with a CRI Ra of at least 90 and a CRI R9 of at least 50.

8. The light emitting device of claim 7, wherein the Group IIA/IIB selenide sulfide red phosphor is of general composition $MSe_{1-x}S_x$: Eu, wherein M is at least one of Mg, Ca, Sr, Ba and Zn and $0<x<1.0$.

9. The light emitting device of claim 7, wherein the Group IIA/IIB selenide sulfide phosphor comprises individual particles, wherein a plurality of the particles have a coating thereon.

10. The light emitting device of claim 7, wherein the manganese-activated fluoride red phosphor is of a general composition selected from the group consisting of: $K_2SiF_6$:$Mn^{4+}$, $K_2GeF_6$:$Mn^{4+}$, $K_2TiF_6$:$Mn^{4+}$, $K_2SnF_6$:$Mn^{4+}$, $Na_2TiF_6$:$Mn^{4+}$, $Na_2ZrF_6$:$Mn^{4+}$, $Cs_2SiF_6$:$Mn^{4+}$, $Cs_2TiF_6$:$Mn^{4+}$, $Rb_2SiF_6$:$Mn^{4+}$, $Rb_2TiF_6$:$Mn^4$.

11. The light emitting device of claim 7, wherein the green phosphor comprises a cerium-activated garnet phosphor of general composition $Y_3(Al,Ga)_5O_{12}$:Ce.

12. The light emitting device of claim 7, wherein the green phosphor comprises a cerium-activated garnet phosphor of general composition $Lu_3Al_5O_{12}$:Ce.

* * * * *